US010566339B2

(12) United States Patent
Fujii et al.

(10) Patent No.: US 10,566,339 B2
(45) Date of Patent: Feb. 18, 2020

(54) SEMICONDUCTOR MEMORY DEVICE AND METHOD FOR MANUFACTURING SAME

(71) Applicant: Toshiba Memory Corporation, Minato-ku (JP)

(72) Inventors: Kotaro Fujii, Yokkaichi (JP); Jun Fujiki, Mie (JP); Shinya Arai, Yokkaichi (JP)

(73) Assignee: Toshiba Memory Coporation, Minato-ku (JP)

( * ) Notice: Subject to any disclaimer, the term of this patent is extended or adjusted under 35 U.S.C. 154(b) by 147 days.

(21) Appl. No.: 15/691,931

(22) Filed: Aug. 31, 2017

(65) Prior Publication Data

US 2018/0247951 A1 Aug. 30, 2018

Related U.S. Application Data

(60) Provisional application No. 62/464,431, filed on Feb. 28, 2017.

(51) Int. Cl.
*H01L 27/11565* (2017.01)
*H01L 27/1157* (2017.01)
*H01L 27/11582* (2017.01)

(52) U.S. Cl.
CPC .... *H01L 27/11565* (2013.01); *H01L 27/1157* (2013.01); *H01L 27/11582* (2013.01)

(58) Field of Classification Search
None
See application file for complete search history.

(56) References Cited

U.S. PATENT DOCUMENTS

| 5,335,138 | A | * | 8/1994 | Sandhu | H01L 27/10808 257/306 |
| 6,144,074 | A | | 11/2000 | Akita | |
| 6,288,426 | B1 | * | 9/2001 | Gauthier, Jr. | H01L 21/76264 257/347 |
| 8,749,012 | B2 | | 6/2014 | Higashi et al. | |
| 2009/0258469 | A1 | | 10/2009 | Ueda | |
| 2012/0098050 | A1 | * | 4/2012 | Shim | H01L 27/11578 257/324 |

FOREIGN PATENT DOCUMENTS

| JP | 11-163287 | 6/1999 |
| JP | 2008-166441 | 7/2008 |
| JP | 2009-259949 | 11/2009 |

* cited by examiner

*Primary Examiner* — Anthony Ho
*Assistant Examiner* — Kevin Quinto
(74) *Attorney, Agent, or Firm* — Oblon, McClelland, Maier & Neustadt, L.L.P.

(57) ABSTRACT

A semiconductor memory device includes a semiconductor substrate, a first insulating film provided above the semiconductor substrate, a first conductive film provided above the first insulating film, a plurality of first electrode films provided above the first conductive film and stacked to be separated from each other, a semiconductor member extending in a stacking direction of the plurality of first electrode films, and a charge storage member provided between the semiconductor member and one of the plurality of first electrode films. The first conductive film includes a main portion disposed at least below the plurality of first electrode films, and a fine line portion extending from the main portion toward an end surface side of the semiconductor substrate. A width of the fine line portion is narrower than a width of the main portion.

20 Claims, 46 Drawing Sheets

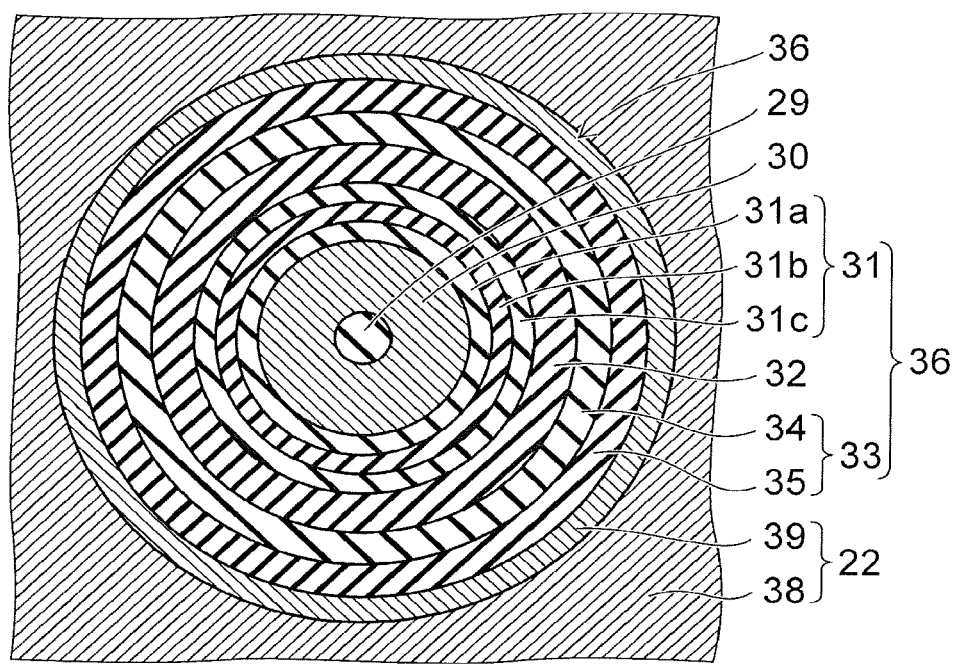
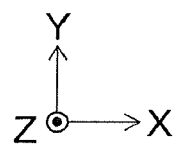
FIG. 5

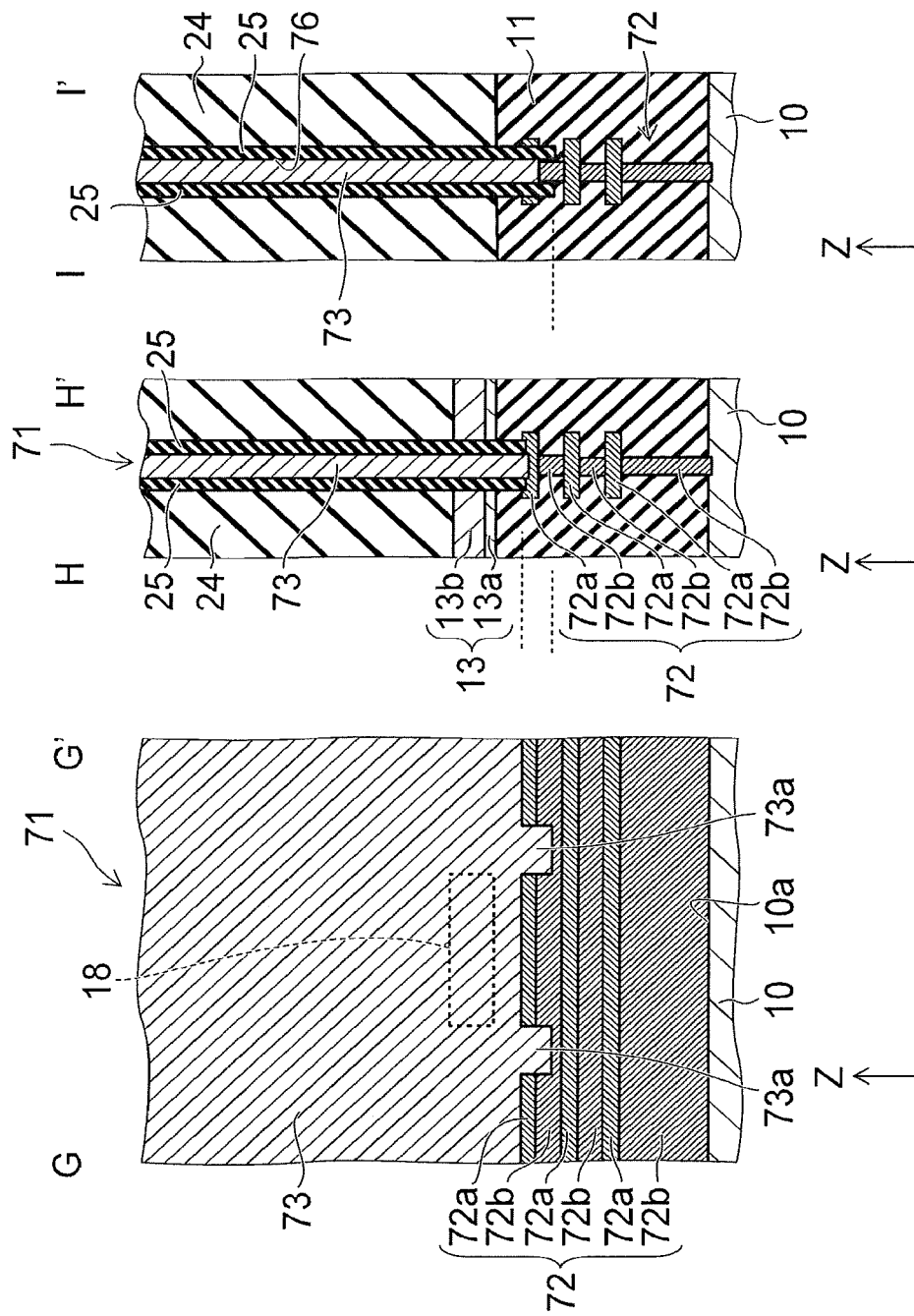

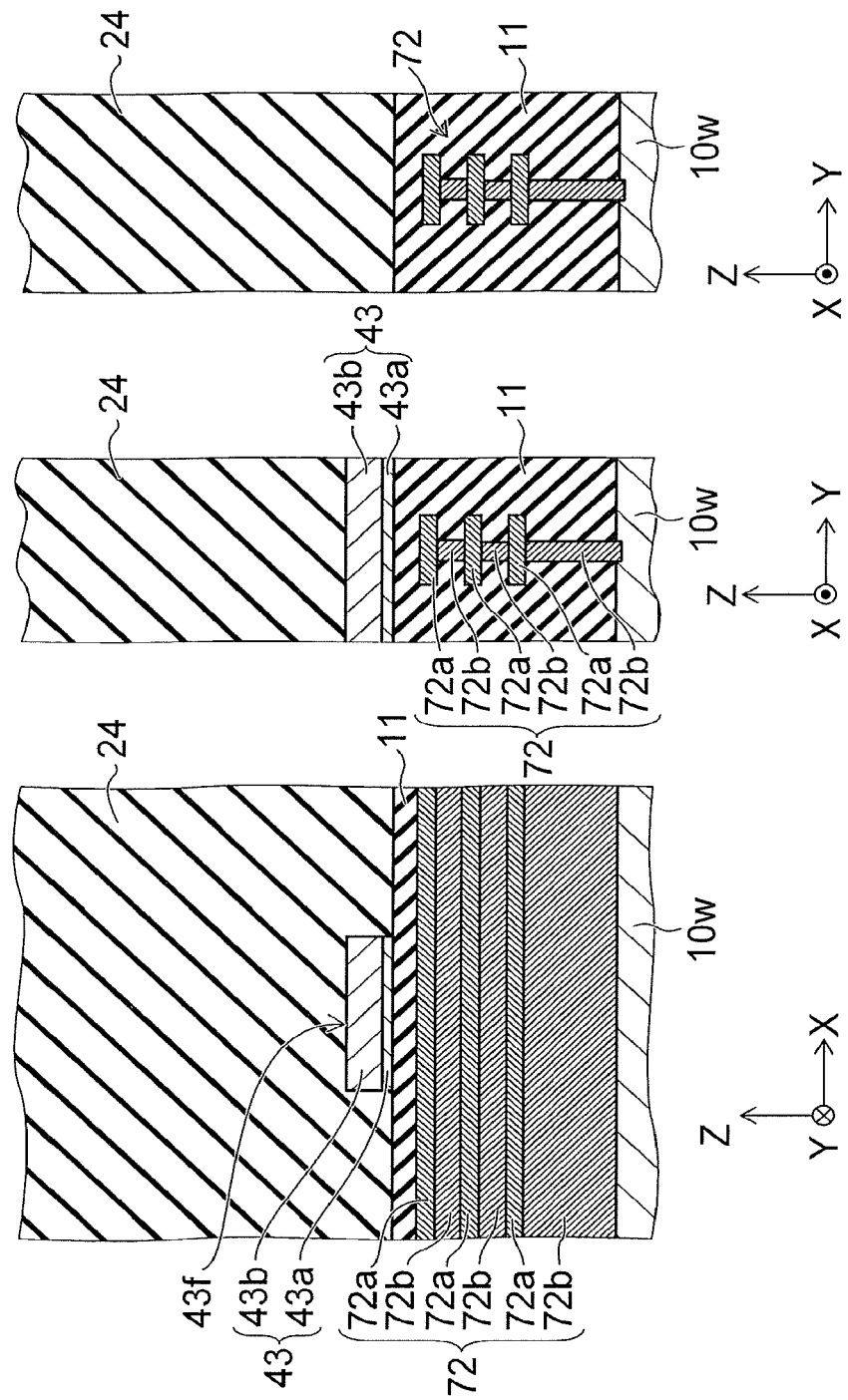

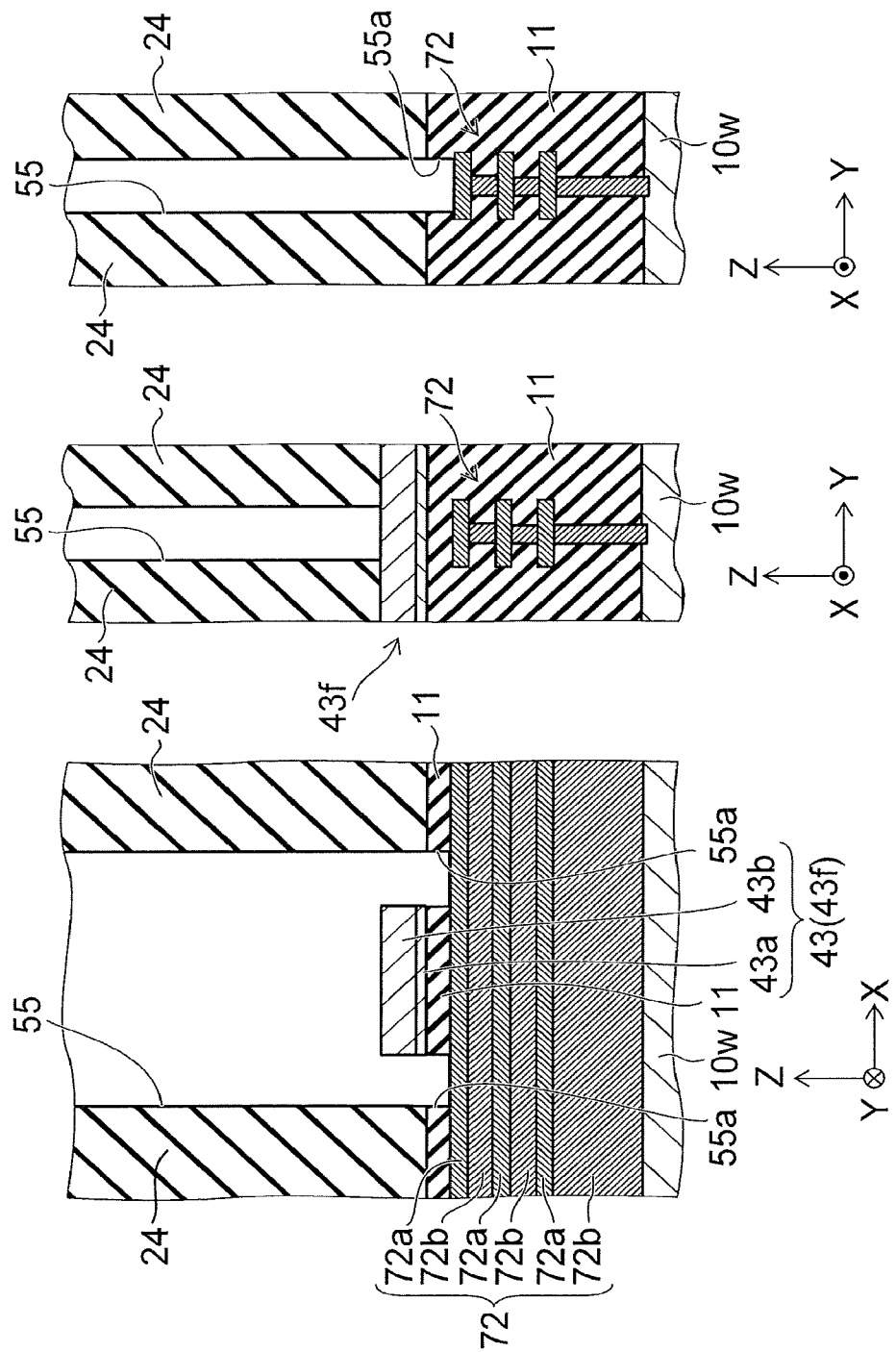

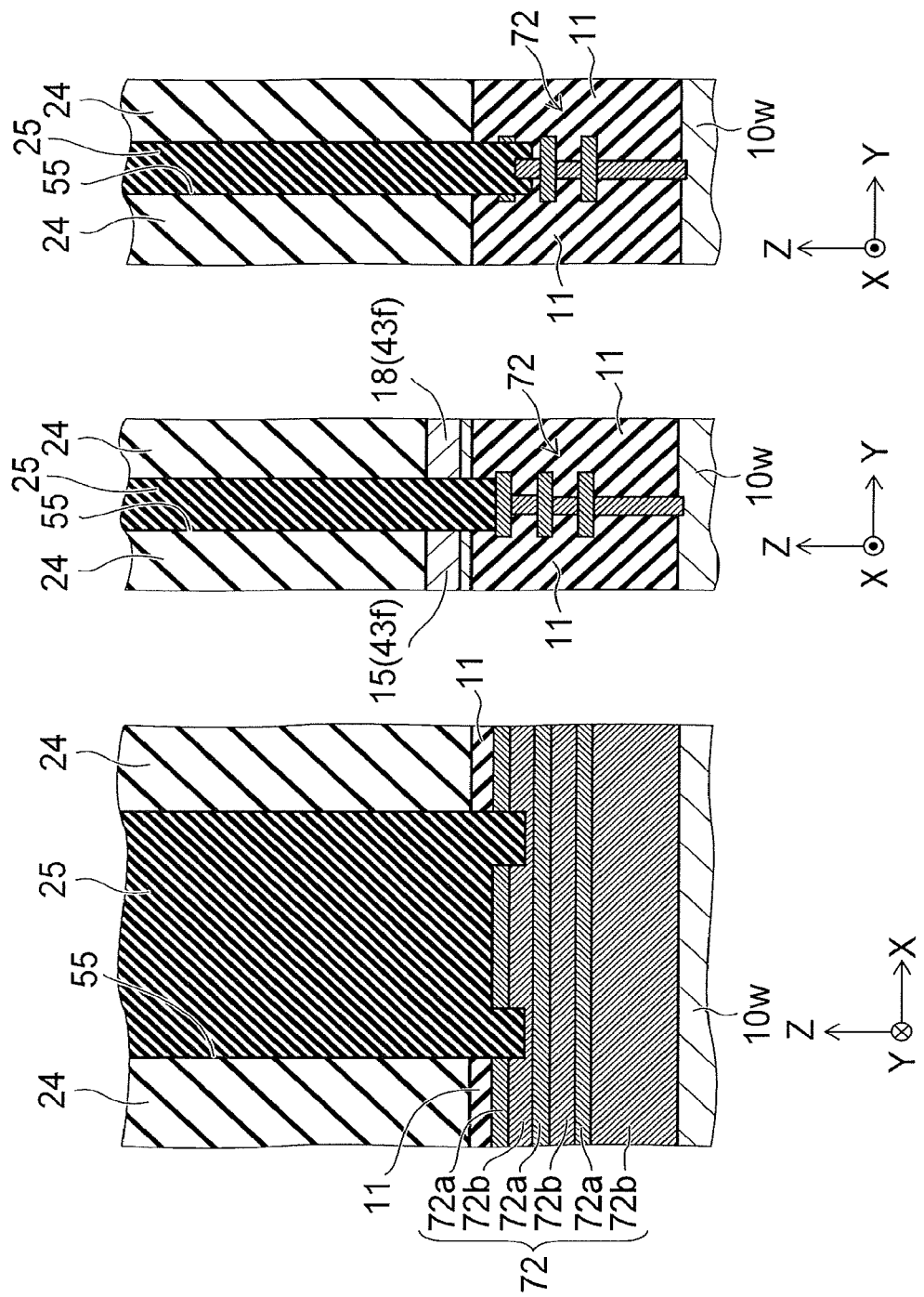

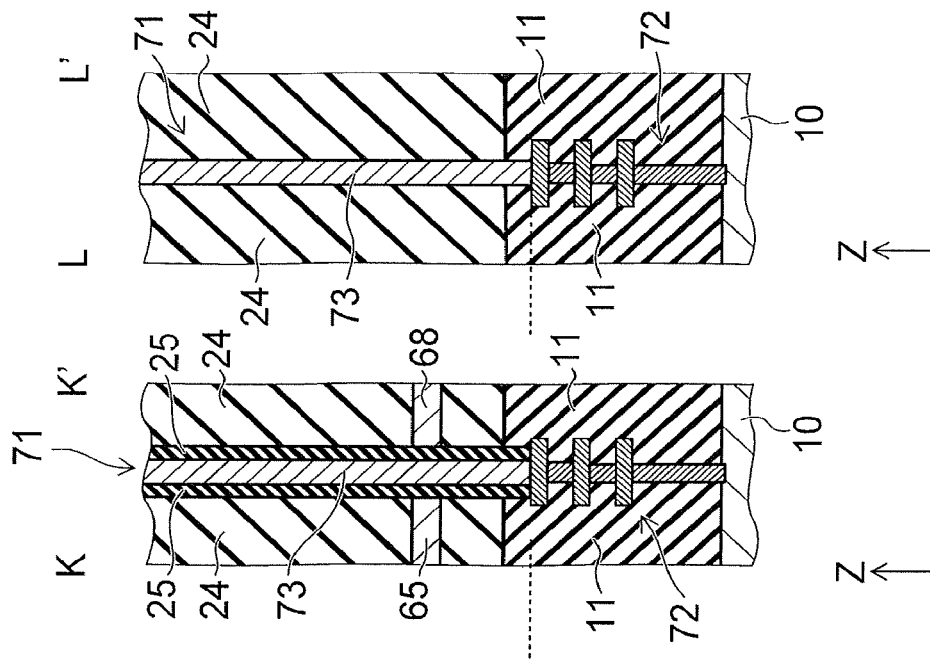
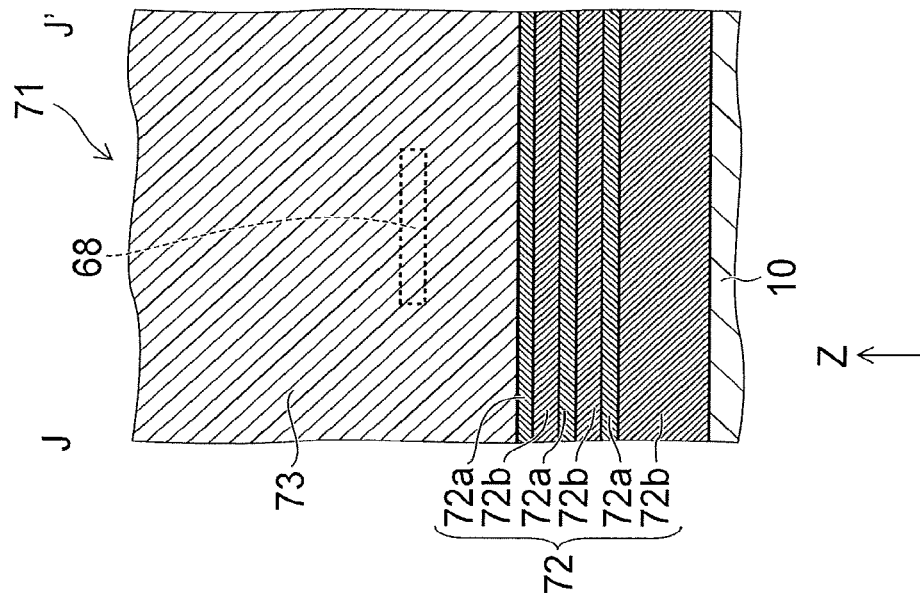
FIG. 35A  FIG. 35B  FIG. 35C

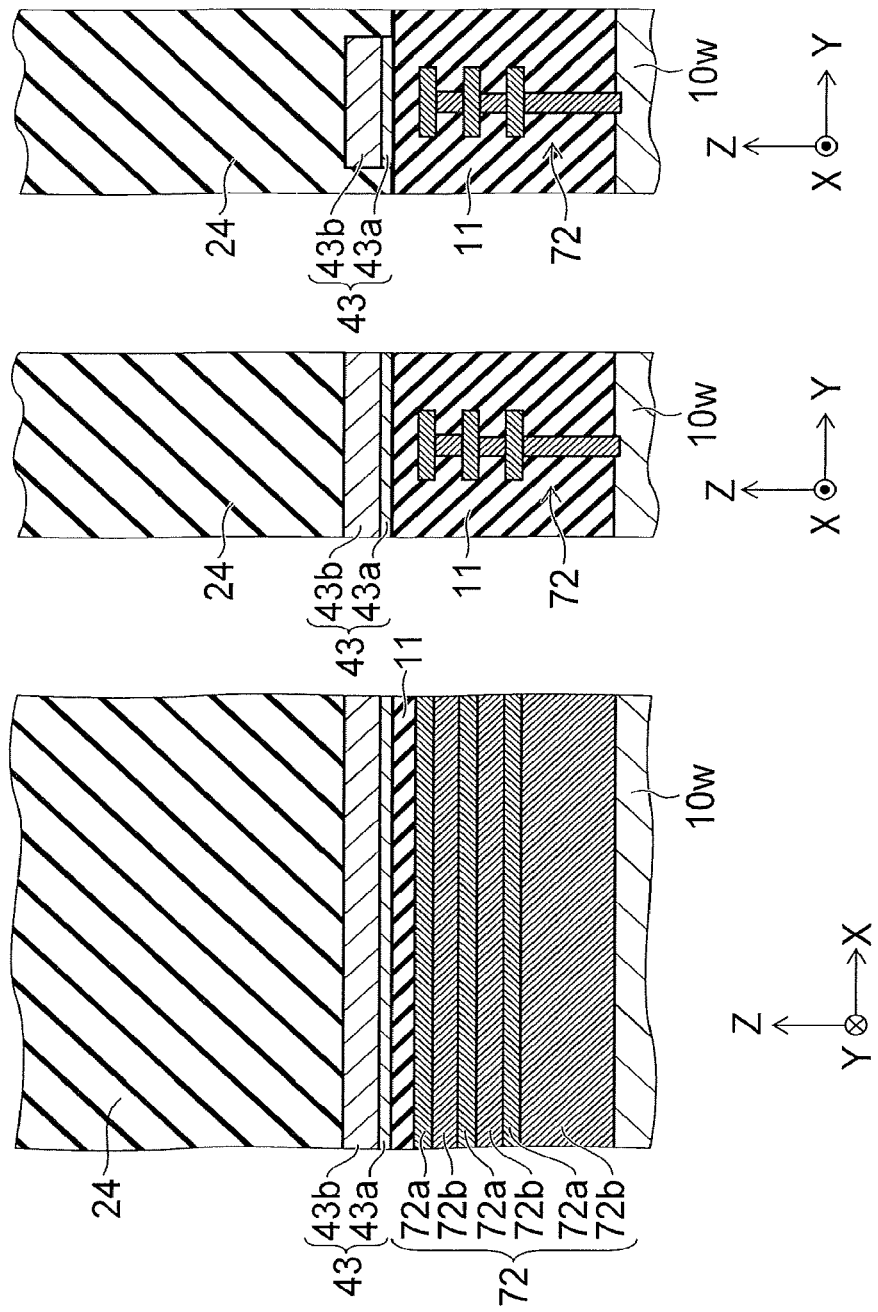

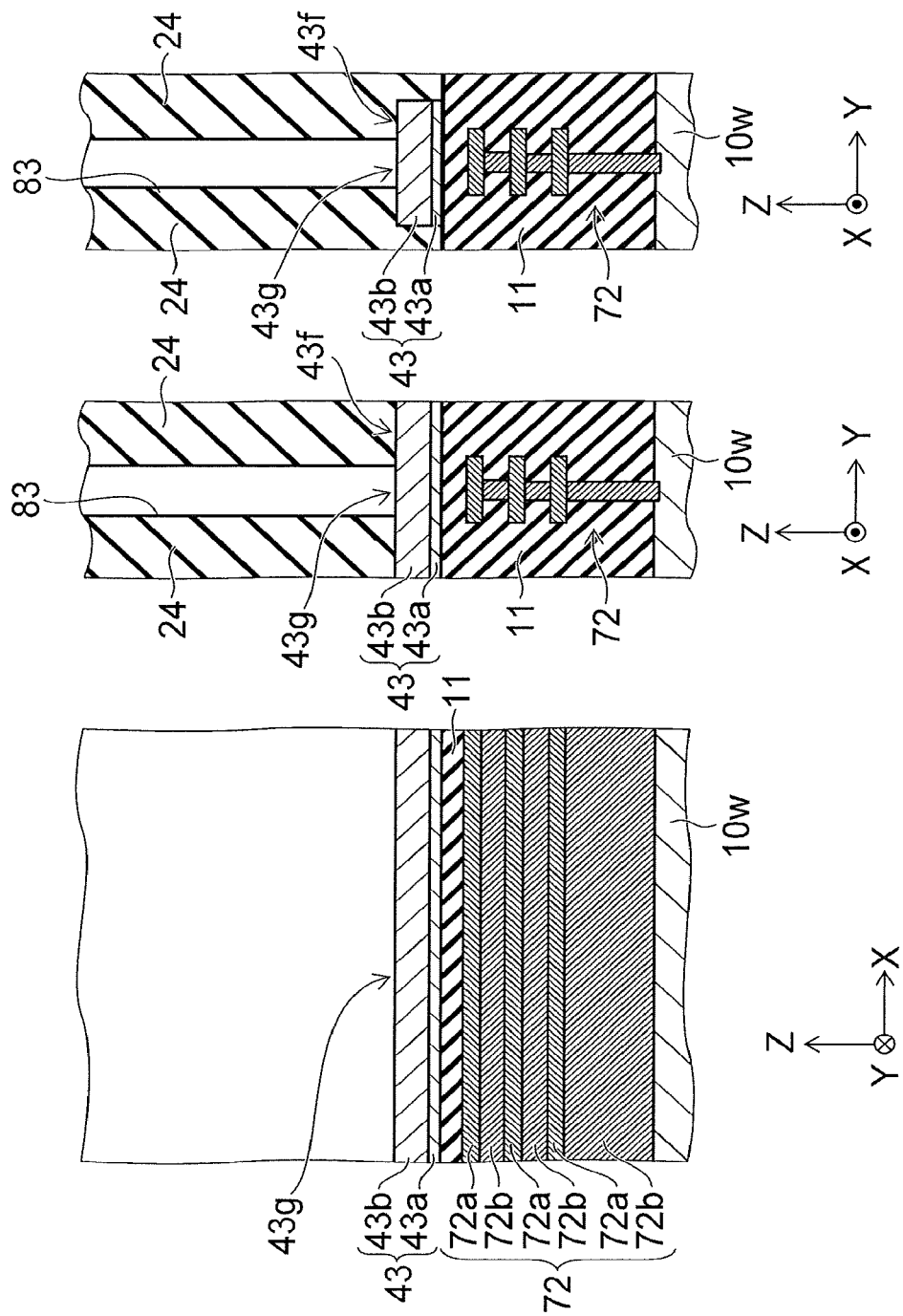

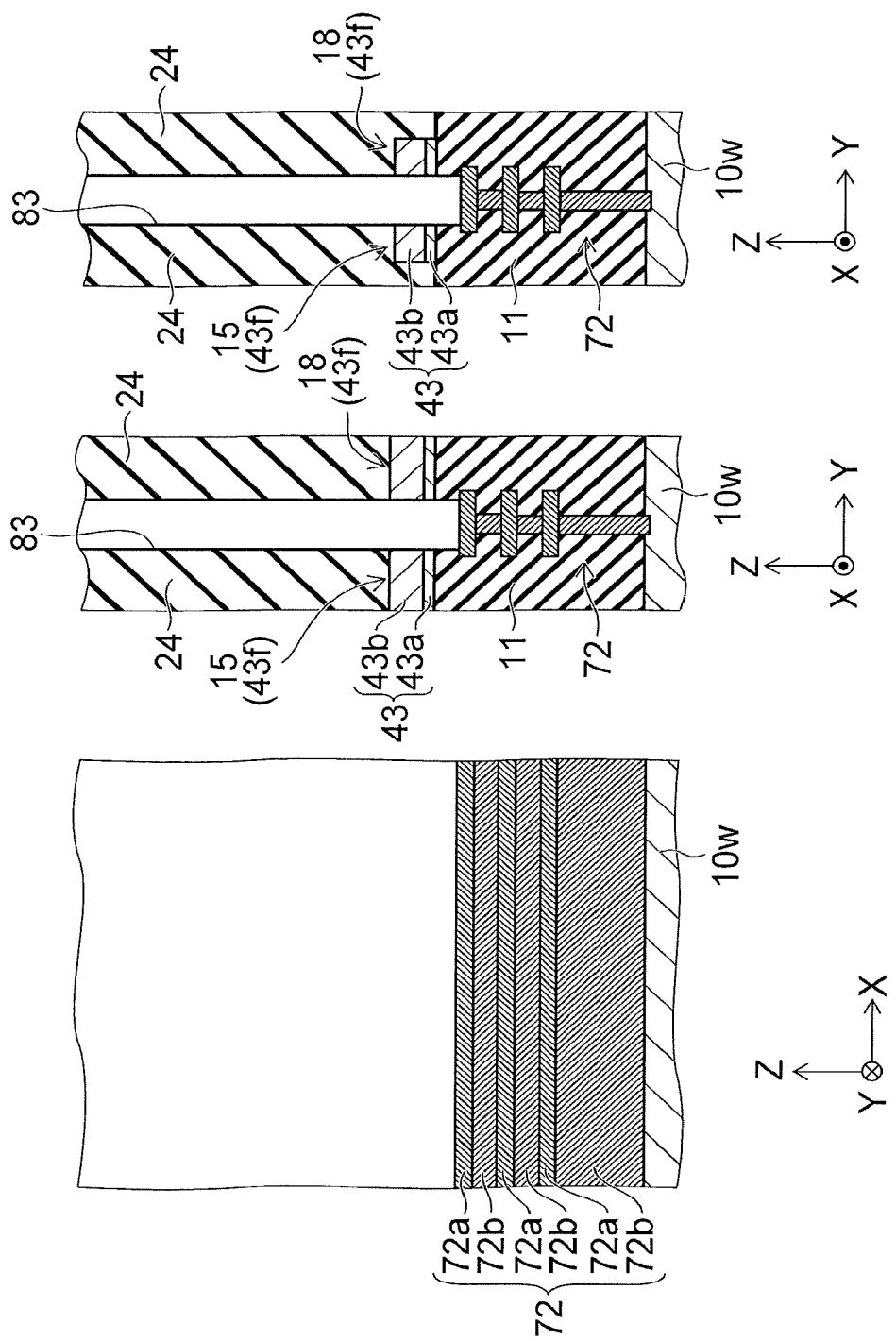

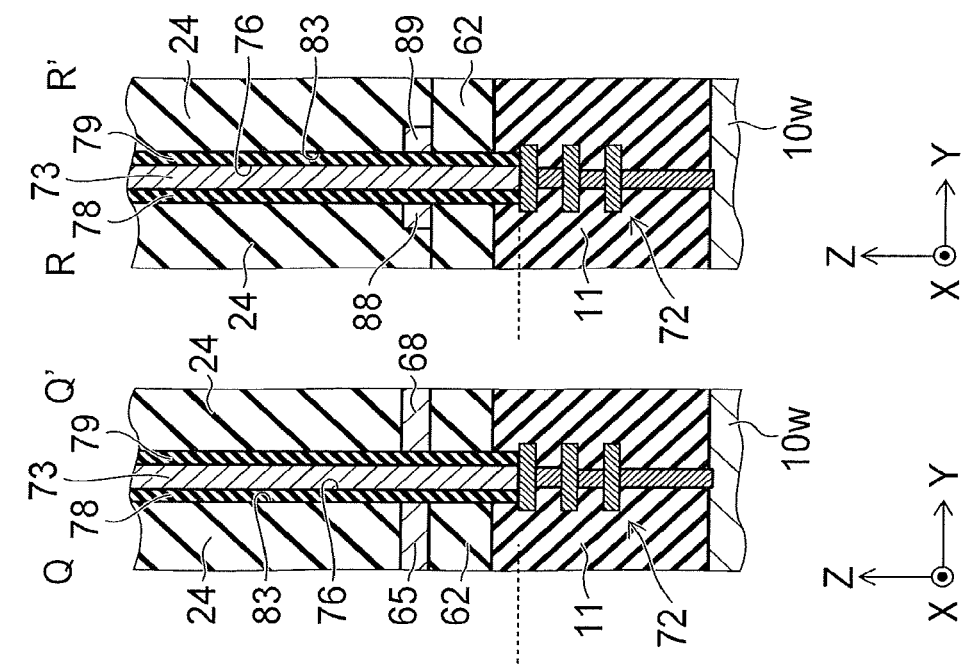
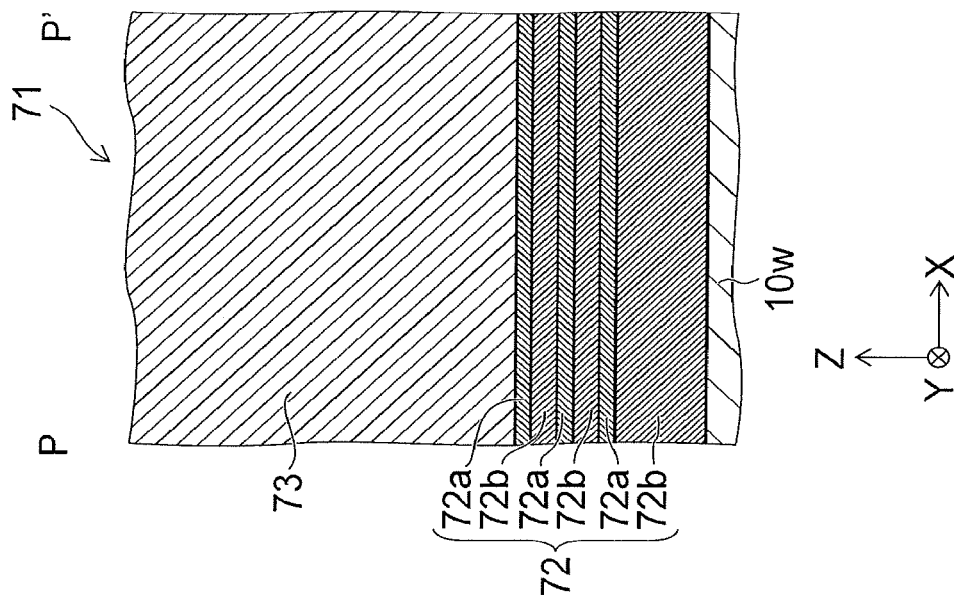
FIG. 46A  FIG. 46B  FIG. 46C

SEMICONDUCTOR MEMORY DEVICE AND METHOD FOR MANUFACTURING SAME

CROSS-REFERENCE TO RELATED APPLICATIONS

This application is based upon and claims the benefit of priority from U.S. Provisional Patent Application 62/464,431, filed on Feb. 28, 2017; the entire contents of which are incorporated herein by reference.

FIELD

Embodiments relate to a semiconductor memory device and a method for manufacturing the same.

BACKGROUND

Conventionally, higher capacity of a semiconductor memory device has been realized by downscaling the circuit. However, because downscaling technology is reaching a limit, a stacked type semiconductor memory device has been proposed to realize even higher capacity. The stacked type semiconductor memory device is manufactured by forming a stacked body by alternately stacking two types of films on a semiconductor substrate, subsequently forming holes in the stacked body by etching, and by forming semiconductor members to be used as channels in the holes. Therefore, to manufacture a stacked type semiconductor memory device having a large capacity, technology is necessary to stably form a hole having a high aspect ratio.

BRIEF DESCRIPTION OF THE DRAWINGS

FIG. 5 and FIG. 6 are cross-sectional views showing a silicon pillar periphery of the semiconductor memory device according to the first embodiment;

FIG. 28A is a cross-sectional view along line G-G' shown in FIG. 27; FIG. 28B is a cross-sectional view along line H-H' shown in FIG. 27; and FIG. 28C is a cross-sectional view along line I-I' shown in FIG. 27;

FIG. 29A to FIG. 32C are cross-sectional views showing a method for manufacturing the semiconductor memory device according to the fourth embodiment;

FIG. 35A is a cross-sectional view along line J-J' shown in FIG. 34; FIG. 35B is a cross-sectional view along line K-K' shown in FIG. 34; and FIG. 35C is a cross-sectional view along line L-L' shown in FIG. 34;

FIG. 40A to FIG. 43C are cross-sectional view showing the method for manufacturing the semiconductor memory device according to the sixth embodiment;

FIG. 46A is a cross-sectional view along line P-P' shown in FIG. 45; FIG. 46B is a cross-sectional view along line Q-Q' shown in FIG. 45; and FIG. 46C is a cross-sectional view along line R-R' shown in FIG. 45.

DETAILED DESCRIPTION

A semiconductor memory device according to an embodiment, includes a semiconductor substrate, a first insulating film provided above the semiconductor substrate, a first conductive film provided above the first insulating film, a plurality of first electrode films provided above the first conductive film and stacked to be separated from each other, a semiconductor member extending in a stacking direction of the plurality of first electrode films, and a charge storage member provided between the semiconductor member and one of the plurality of first electrode films. The first conductive film includes a main portion disposed at least below the plurality of first electrode films, and a fine line portion extending from the main portion toward an end surface side of the semiconductor substrate. A width of the fine line portion is narrower than a width of the main portion.

First Embodiment

First, a first embodiment will be described.

Figure 1:
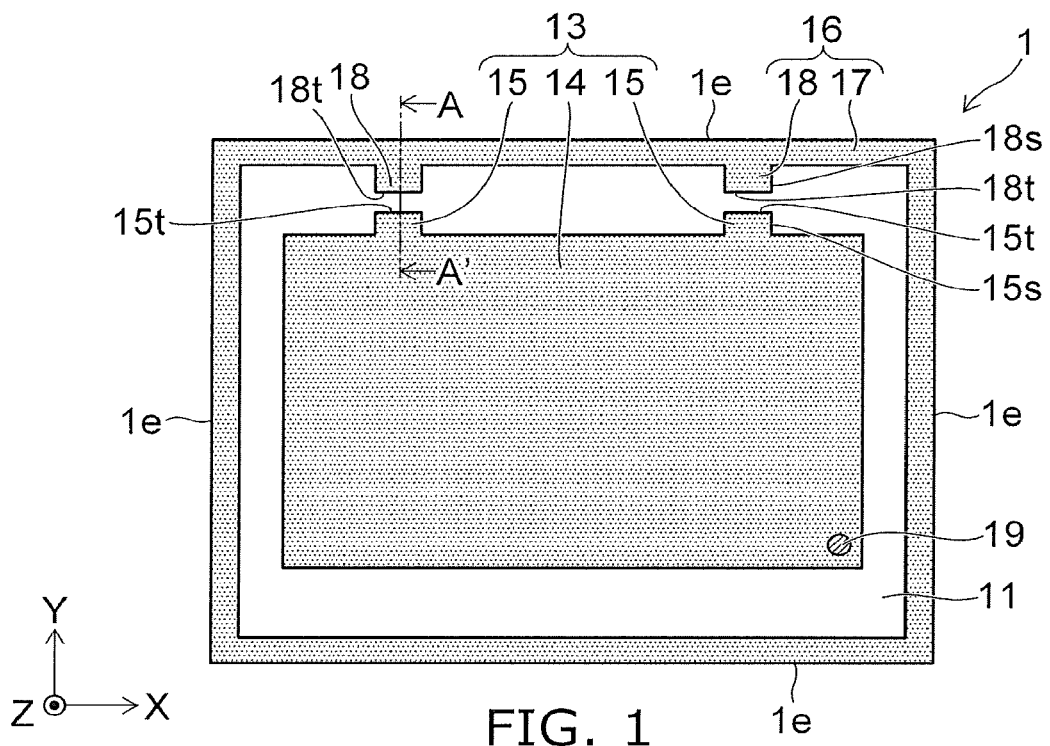
FIG. 1 and FIG. 2 are plan views showing a semiconductor memory device according to a first embodiment.
Figure 2:
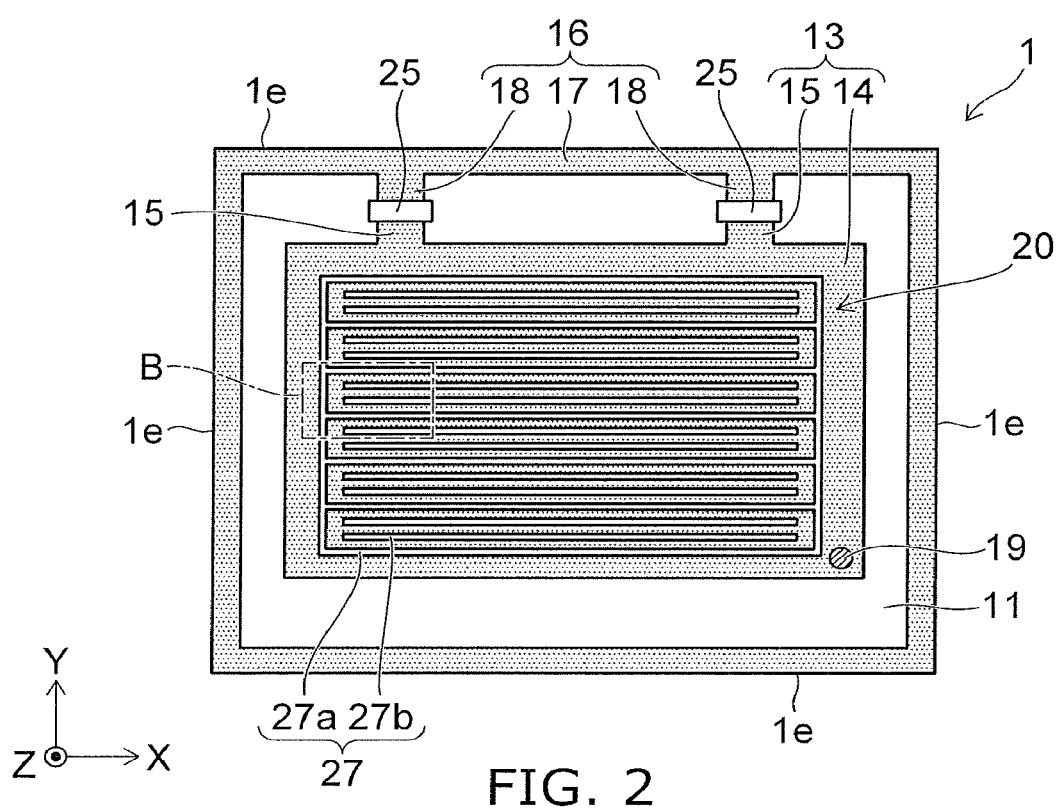

FIG. 1 and FIG. 2 are plan views showing a semiconductor memory device according to the embodiment.

Figure 3:
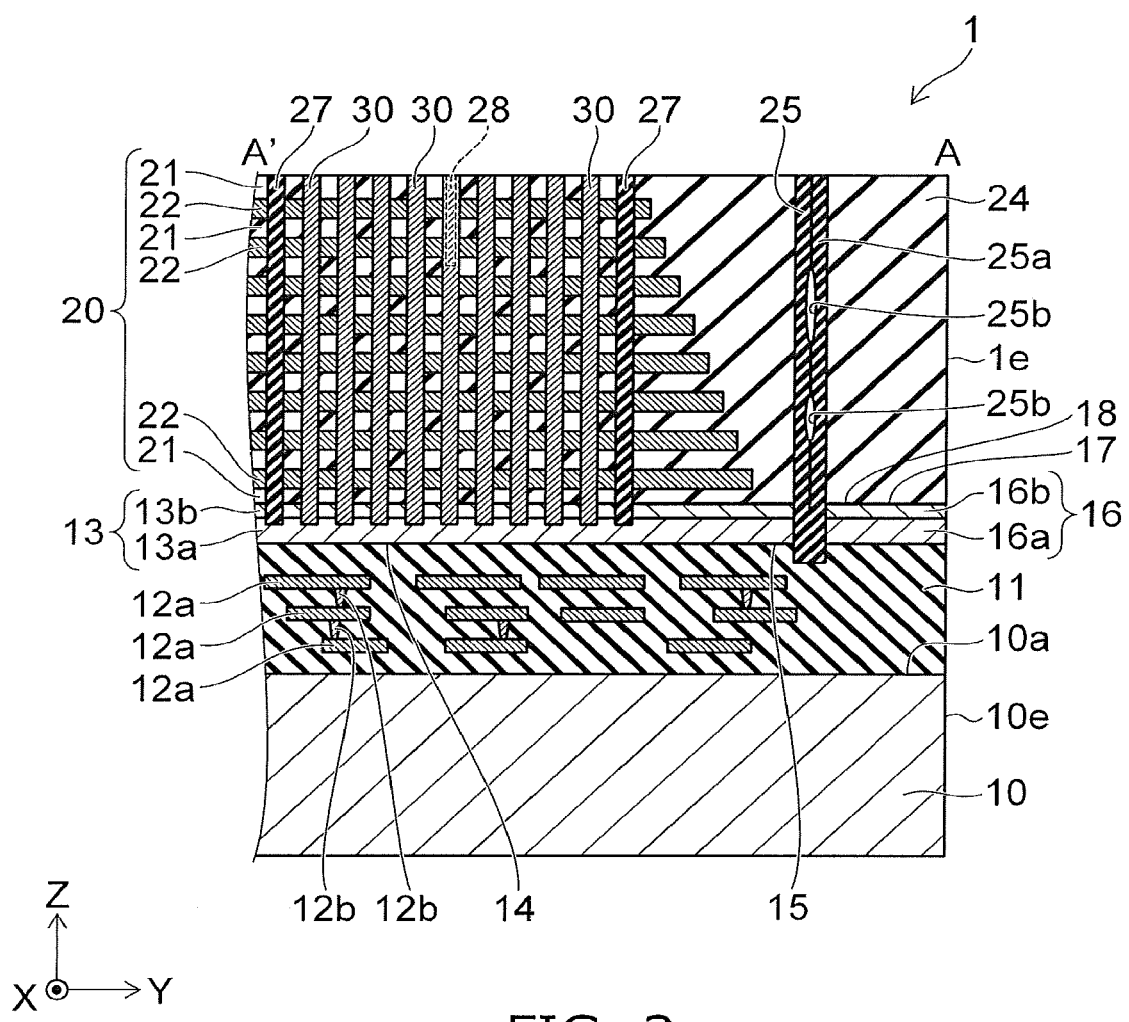
FIG. 3 is a cross-sectional view along line A-A' shown in FIG. 1.

FIG. 3 is a cross-sectional view along line A-A' shown in FIG. 1.

Figure 4:
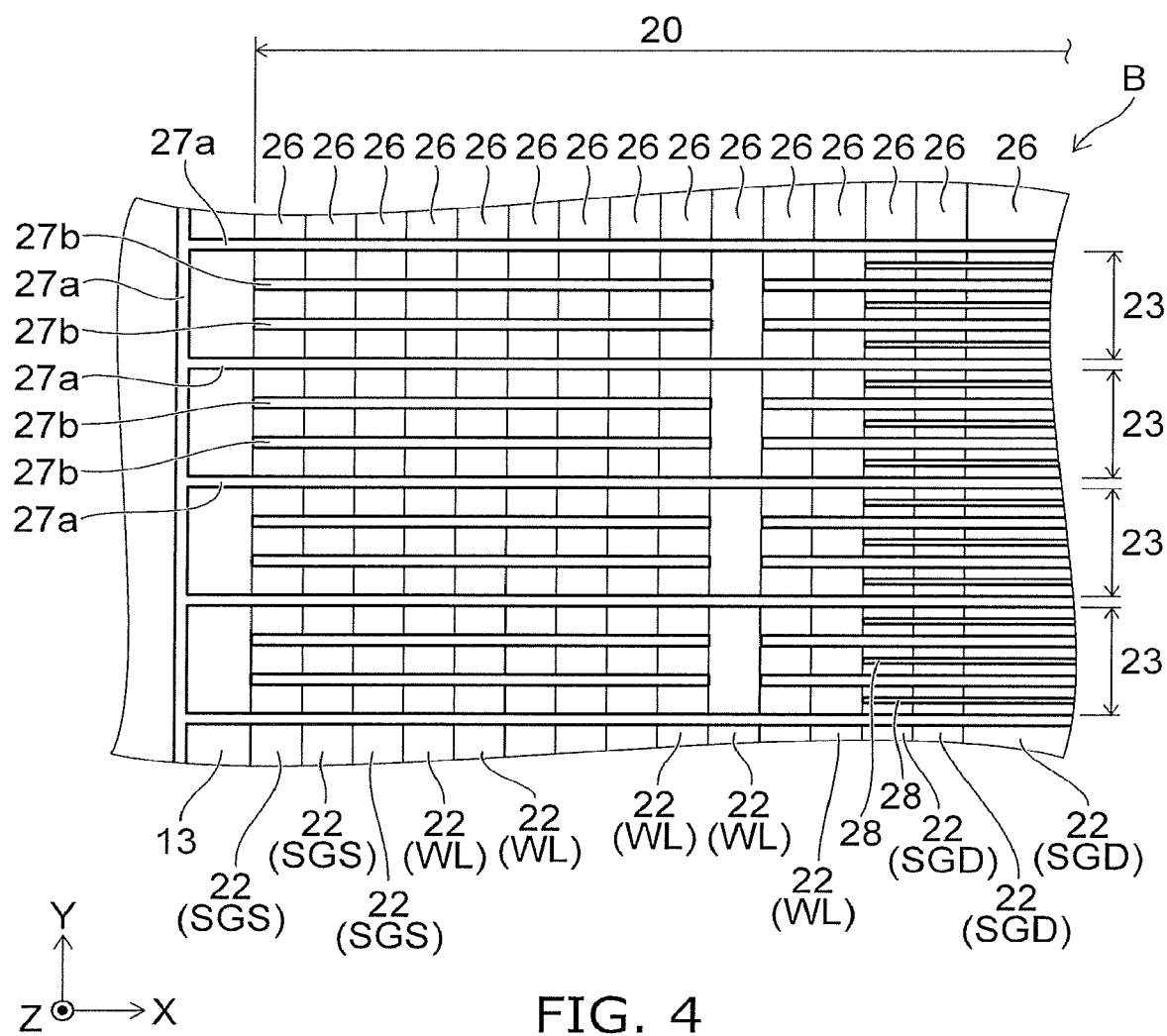
FIG. 4 is a plan view showing region B of FIG. 2.

FIG. 4 is a plan view showing region B of FIG. 2.

Figure 6:
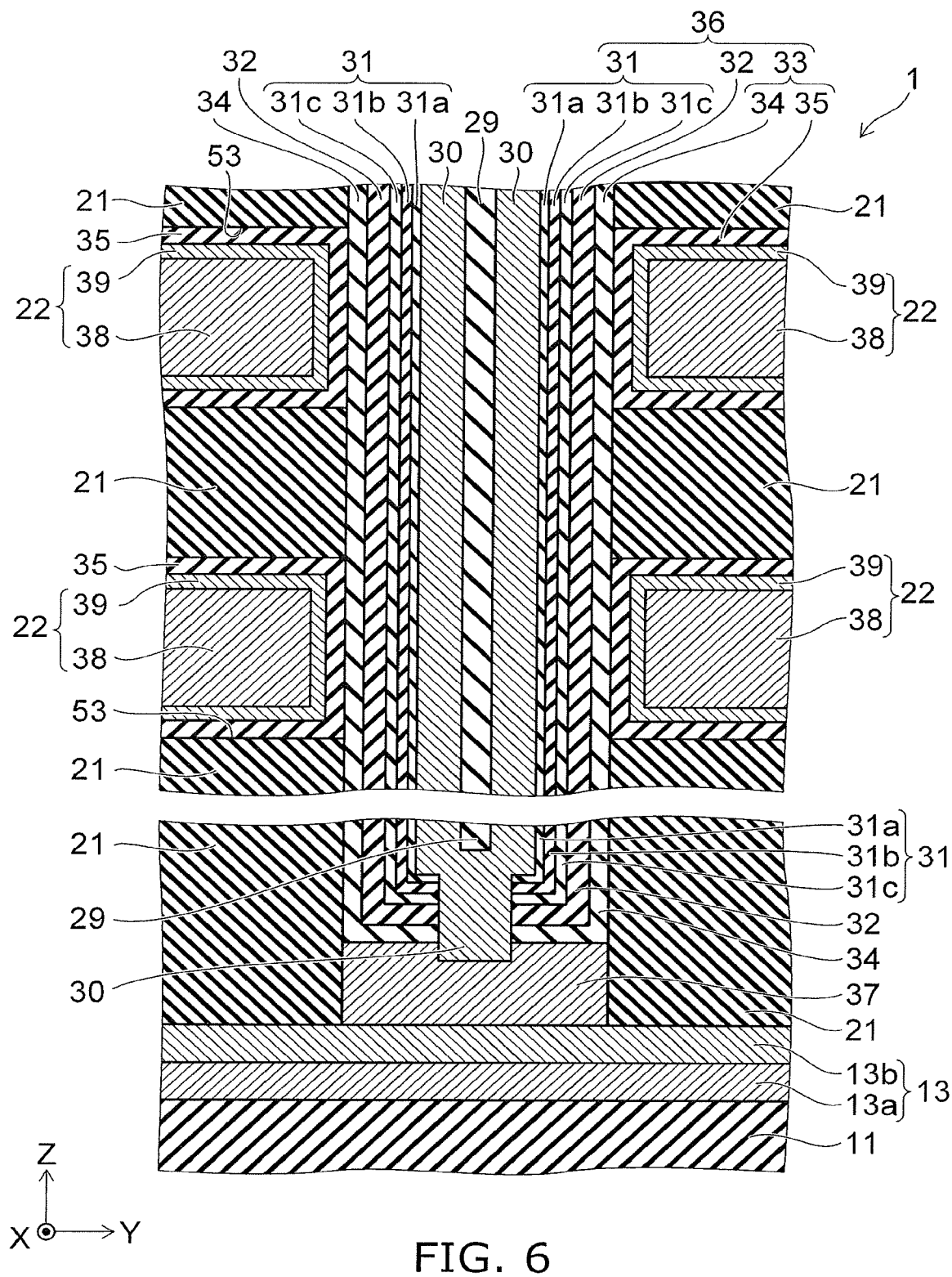

FIG. 5 and FIG. 6 are cross-sectional views showing the silicon pillar periphery of the semiconductor memory device according to the embodiment.

The drawings are schematic; and components are omitted as appropriate for easier viewing of the drawings. Also, the dimensional ratios and vertical:horizontal ratios of the components do not always match between the drawings. Also, in FIG. 1 and FIG. 2, a buried source film 13 and a conductive film 16 are shown using light gray. This is similar for the plan views described below as well. FIG. 1 and FIG. 2 show the same semiconductor memory device. FIG. 1 shows only an inter-layer insulating film 11, the buried source film 13, the conductive film 16, and a contact 19 described below. FIG. 2 shows an insulating member 25 and an insulating member 27 in addition to FIG. 1. The insulating member 27 is provided on the buried source film 13 and does not pierce through the buried source film 13.

As shown in FIG. 1, the configuration of the semiconductor memory device 1 according to the embodiment is a rectangular chip configuration. In the specification hereinbelow, an XYZ orthogonal coordinate system is employed for convenience of description. One direction in which an end surface 1e of the chip included in the semiconductor memory device 1 extends is taken as an "X-direction;" and the other is taken as a "Y-direction." Also, a direction orthogonal to the upper surface of the chip is taken as a "Z-direction."

As shown in FIG. 1 to FIG. 4, a silicon substrate 10 is provided in the semiconductor memory device 1. The configuration of the silicon substrate 10 is a rectangular sheet configuration; and the silicon substrate 10 is disposed in the entire semiconductor memory device 1 when viewed from the Z-direction. For example, the silicon substrate 10 is formed of a monocrystal of silicon. Impurity diffusion regions (not illustrated), element separation regions (not illustrated), etc., are formed in the upper layer portion of the silicon substrate 10.

The inter-layer insulating film 11 is provided on an upper surface 10a of the silicon substrate 10. Multiple layers, e.g., three layers, of interconnects 12a and vias 12b are provided in the inter-layer insulating film 11. A drive circuit that includes circuit elements such as transistors, etc. (not illustrated) is formed in the inter-layer insulating film 11 and the upper layer portion of the silicon substrate 10.

The buried source film 13 is provided on the inter-layer insulating film 11. The buried source film 13 is insulated from the silicon substrate 10 by the inter-layer insulating film 11.

Also, the buried source film 13 is separated from the end surface 1e of the semiconductor memory device 1. In the buried source film 13, for example, a metal layer 13a that includes a metal is provided; and a polysilicon layer 13b that is made of polysilicon is stacked on the metal layer 13a. The metal layer 13a is, for example, a (TiN/Ti/W/WN) layer in which a tungsten nitride (WN) layer, a tungsten (W) layer, a titanium (Ti) layer, and a titanium nitride (TiN) layer are stacked in order from the lower layer side. The metal layer 13a may be a tungsten silicide (WSi) layer, may be a (TiN/W/WN) layer, may be a (TiN/WSi) layer, or may be a (TiN/Ti/WSi) layer.

A main portion 14 that is rectangular when viewed from the Z-direction and a fine line portion 15 that extends from the main portion 14 toward the end surface 1e of the semiconductor memory device 1 are provided in the buried source film 13. The main portion 14 and the fine line portion 15 are formed as one body. The end surface 1e of the semiconductor memory device 1 includes an end surface 10e of the silicon substrate 10 and includes the extension plane of the end surface 10e. For example, two fine line portions 15 are provided; and the fine line portions 15 extend toward the Y-direction from one end edge of the main portion 14 extending in the X-direction. The width, i.e., the length in the X-direction, of the fine line portion 15 is narrower than the width, i.e., the length in the X-direction, of the main portion 14. The configuration of each of the fine line portions 15 is, for example, substantially rectangular when viewed from the Z-direction. In the specification, "substantially rectangular" also includes, other than rectangles, for example, configurations like rectangles such as a quadrilateral having one or more curved sides, etc. A tip surface 15t of the fine line portion 15 extends in the X-direction. The tip surface 15t may be a flat surface parallel to the X-direction or may be a curved surface that is curved to be concave when viewed from the Z-direction.

Also, the conductive film 16 is provided in a portion of the region on the inter-layer insulating film 11 where the buried source film 13 is not provided. The conductive film 16 is insulated from the buried source film 13. A frame-shaped portion 17 that surrounds the buried source film 13 and a fine line portion 18 that extends from the frame-shaped portion 17 toward the inner side when viewed from the Z-direction are provided in the conductive film 16. The frame-shaped portion 17 and the fine line portion 18 are formed as one body. The frame-shaped portion 17 is provided in a frame-like configuration in a region contacting the end surface 1e of the semiconductor memory device 1. For example, two fine line portions 18 are provided to oppose the fine line portions 15 of the buried source film 13. The configuration of each of the fine line portions 18 is, for example, substantially rectangular when viewed from the Z-direction. A tip surface 18t of the fine line portion 18 extends in the X-direction. The tip surface 18t may be a flat surface parallel to the X-direction or may be a curved surface that is curved to be concave when viewed from the Z-direction. In the case where the tip surface 15t of the fine line portion 15 and the tip surface 18t of the fine line portion 18 both are flat surfaces, the tip surface 18t of the fine line portion 18 may be substantially parallel to the tip surface 15t of the fine line portion 15. A side surface 18s of the fine line portion 18 extending in the direction toward the fine line portion 15, i.e., the Y-direction, is positioned on the extension plane of a side surface 15s of the fine line portion 15 extending in the direction toward the fine line portion 18, i.e., the Y-direction.

The contact 19 is connected to the main portion 14 of the buried source film 13 from above. A current flows in the main portion 14 via the contact 19. Although only one contact 19 is drawn in FIG. 1, the contact 19 may be multiply provided. On the other hand, a contact is not connected to the fine line portion 15 of the buried source film 13. The fine line portion 15 is not electrically connected to anything in paths other than via the main portion 14. Therefore, there is no current supply point in the fine line portion 15.

As described below, the conductive film 16 and the buried source film 13 are formed by patterning one film. Accordingly, the film structure of the conductive film 16 is the same as the film structure of the buried source film 13. Specifically, a metal layer 16a and a polysilicon layer 16b are stacked in the conductive film 16. The composition and thickness of the metal layer 16a are substantially the same as the composition and thickness of the metal layer 13a; and the composition and thickness of the polysilicon layer 16b are substantially the same as the composition and thickness of the polysilicon layer 13b.

A stacked body 20 is provided on the main portion 14 of the buried source film 13. Insulating films 21 and electrode films 22 are stacked alternately along the Z-direction in the stacked body 20. Thereby, the multiple electrode films 22 are stacked to be separated from each other. The insulating films 21 are formed of an insulating material such as, for example, silicon oxide, etc.; and the electrode films 22 are formed of a conductive material such as, for example, tungsten, etc. An air gap may be formed instead of the insulating films 21.

Also, an inter-layer insulating film 24 is provided on the inter-layer insulating film 11 to cover the conductive film 16. The inter-layer insulating film 24 surrounds the stacked body 20 when viewed from the Z-direction. The inter-layer insulating film 24 is formed of, for example, silicon oxide. The main portion 14 of the buried source film 13 is disposed between the inter-layer insulating film 11 and the stacked body 20. The conductive film 16 and the fine line portion 15 of the buried source film 13 are disposed between the inter-layer insulating film 11 and the inter-layer insulating film 24.

The insulating member 25 is provided in the inter-layer insulating film 24. The insulating member 25 is formed of, for example, silicon oxide. The configuration of the insulating member 25 is a columnar configuration extending in the Z-direction and is, for example, a quadrilateral column, a substantially quadrilateral column having rounded corners, an elliptical column, etc. The insulating member 25 pierces the inter-layer insulating film 24 in the Z-direction; and the lower end of the insulating member 25 is positioned in the upper part of the inter-layer insulating film 11. The lower part of the insulating member 25 is disposed between the fine line portion 15 of the buried source film 13 and the fine line portion 18 of the conductive film 16. The tip surface 15t of the fine line portion 15 and the tip surface 18t of the fine line portion 18 contact the insulating member 25. There are cases where a seam 25a is formed in the interior of the insulating member 25; and there are also cases where a void 25b is formed along the seam 25a. There are also cases where only the seam 25a is formed in the insulating member 25; and the void 25b is not formed. Further, there are also cases where neither the seam 25a nor the void 25b are formed in the insulating member 25.

The two X-direction end portions of the stacked body 20 are patterned into staircase configurations in which a terrace 26 is formed every electrode film 22. The terrace 26 is one portion of the electrode film 22 and is the upper surface of a portion where the other electrode films 22 are not disposed in the region directly above the portion. The end portions of the staircase configurations of the stacked body 20 are covered with the inter-layer insulating film 24. Contacts (not illustrated) that extend in the Z-direction are provided in the inter-layer insulating film 24 and are connected to the electrode films 22 at the terraces 26.

The insulating member 27 is provided in the stacked body 20 and in the inter-layer insulating film 24. The insulating member 27 is formed of an insulating material such as, for example, silicon oxide, etc. The configuration of the insulating member 27 is a sheet configuration that pierces the stacked body 20 in the Z-direction. However, the insulating member 27 does not pierce through the buried source film 13. A portion 27a that has a ladder-like configuration and partitions the stacked body 20 into multiple block regions 23 arranged along the Y-direction is provided in the insulating member 27; and portions 27b that have line configurations extending in the X-direction in each of the block regions 23 are provided in the insulating member 27. The portion 27a and the portions 27b are separated from each other. When viewed from the Z-direction, the configuration of each of the block regions 23 is a rectangle in which the length in the X-direction is longer than the length in the Y-direction. Each of the electrode films 22 is subdivided every block region 23 by the insulating member 27.

In the upper part of the stacked body 20, an insulating member 28 that extends in the X-direction is provided between the insulating members 27 adjacent to each other in the Y-direction. In the stacked body 20, one or multiple electrode films 22 from the top are subdivided also by the insulating member 28 in addition to the insulating members 27.

In the stacked body 20, one or multiple electrode films 22 from the top, i.e., the electrode films 22 subdivided by the insulating members 27 and the insulating member 28, function as upper selection gate lines SGD. The upper selection gate lines SGD are insulated from each other. In the stacked body 20, the electrode films 22 of one or multiple levels from the bottom function as lower selection gate lines SGS. The electrode films 22 other than the lower selection gate lines SGS and the upper selection gate lines SGD function as word lines WL. The lower selection gate lines SGS and the word lines WL are subdivided every block region 23 by the portion 27a of the insulating member 27 but are not subdivided by the portions 27b and the insulating member 28.

Silicon pillars 30 that extend in the Z-direction are provided in each of the block regions 23 in the stacked body 20. The silicon pillar 30 is made of, for example, polysilicon; and the configuration of the silicon pillar 30 is a circular tube having a plugged lower end. The lower end of the silicon pillar 30 is connected to the main portion 14 of the buried source film 13. The silicon pillars 30 are provided also at positions dividing the insulating member 28. In FIG. 3, the divided insulating member 28 existing behind the silicon pillar 30 is shown by a broken line.

As shown in FIG. 5 and FIG. 6, a core member 29 that is made of silicon oxide is provided in the silicon pillar 30. A tunneling insulating film 31, a charge storage film 32, and a blocking insulating film 33 are provided in this order from the silicon pillar 30 toward the electrode film 22 between the silicon pillar 30 and the electrode film 22. A silicon oxide layer 31a, a silicon nitride layer 31b, and a silicon oxide layer 31c are stacked in this order from the silicon pillar 30 side toward the charge storage film 32 side in the tunneling insulating film 31. The blocking insulating film 33 includes a silicon oxide layer 34 and an aluminum oxide layer 35. A memory film 36 is formed of the tunneling insulating film 31, the charge storage film 32, and the blocking insulating film 33. The memory film 36 is disposed between the silicon pillar 30 and the electrode film 22.

Although the tunneling insulating film 31 normally is insulative, the tunneling insulating film 31 is a film in which a tunneling current flows when a prescribed voltage within the range of the drive voltage of the semiconductor memory device 1 is applied. The charge storage film 32 is a film that can store a charge, is made from, for example, a material having trap sites of electrons, and is made of, for example, silicon nitride. The blocking insulating film 33 is a film in which a current substantially does not flow even when a voltage within the range of the drive voltage of the semiconductor memory device is applied. The tunneling insulating film 31, the charge storage film 32, and the silicon oxide layer 34 are disposed on substantially the entire side surface of the silicon pillar 30; and the configurations of the tunneling insulating film 31, the charge storage film 32, and the silicon oxide layer 34 are circular tubes. The aluminum oxide layer 35 is formed on the upper surface of the electrode film 22, on the lower surface of the electrode film 22, and on the side surface of the electrode film 22 facing the silicon pillar 30.

A main portion 38 that is made of, for example, tungsten and a barrier metal layer 39 that is made of, for example, titanium and titanium nitride are provided in the electrode film 22. The main portion 38 may be formed of molybdenum or cobalt. The barrier metal layer 39 is formed on the upper surface of the main portion 38, on the lower surface of the main portion 38, and on the side surface of the main portion 38 facing the silicon pillar 30.

An epitaxial silicon member 37 is provided between the silicon pillar 30 and the polysilicon layer 13b of the buried source film 13. The silicon pillar 30 is connected to the buried source film 13 via the epitaxial silicon member 37.

Then, as shown in FIG. 3 and FIG. 4, an upper selection gate transistor is configured at each crossing portion between the upper selection gate lines SGD and the silicon pillars 30. A lower selection gate transistor is configured at each crossing portion between the lower selection gate lines SGS and the silicon pillars 30. A memory cell transistor is configured at each crossing portion between the word lines WL and the silicon pillars 30. Thereby, in the stacked body 20, multiple memory cell transistors are connected in series along each of the silicon pillars 30; and a NAND string is formed by connecting the lower selection gate transistors and the upper selection gate transistors at the two ends of the multiple memory cell transistors. The silicon pillars 30 that divide the insulating member 28 do not form NAND strings and are dummy pillars that do not function electrically.

A method for manufacturing the semiconductor memory device according to the embodiment will now be described.

Figure 7:
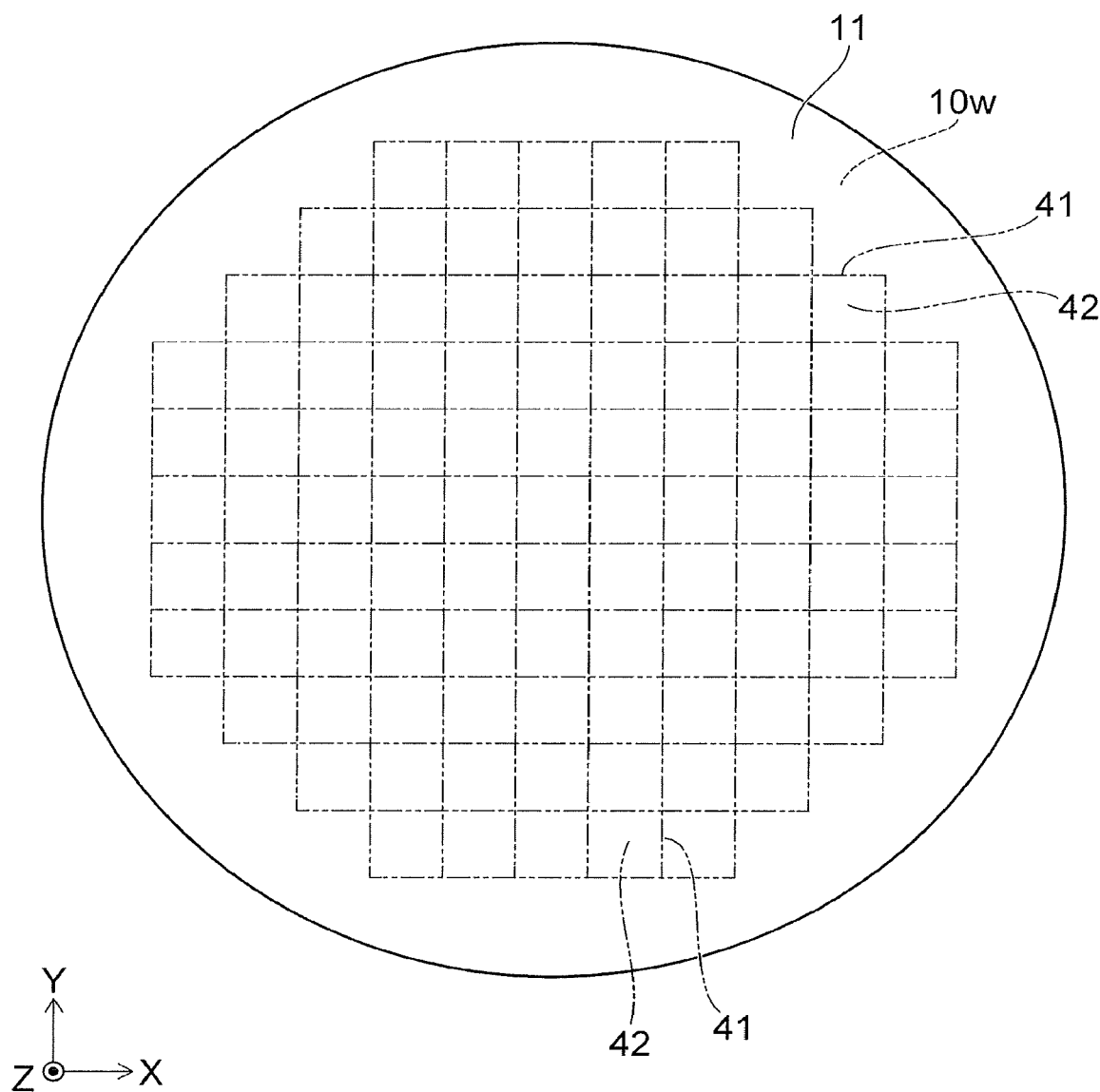
FIG. 7 and FIG. 8 are plan views showing a method for manufacturing the semiconductor memory device according to the first embodiment.
Figure 8:
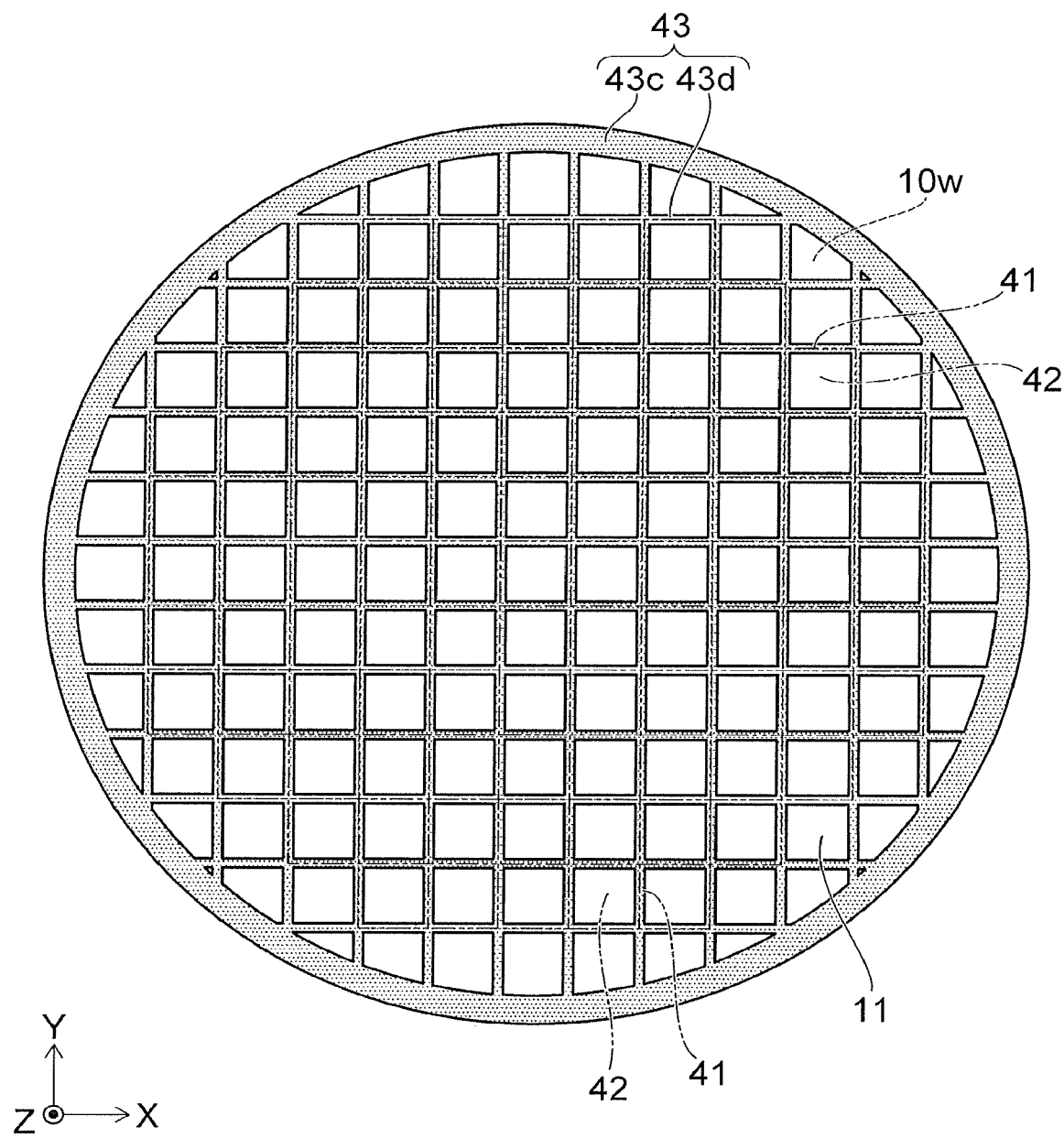

FIG. 7 and FIG. 8 are plan views showing the method for manufacturing the semiconductor memory device according to the embodiment.

Figure 9:
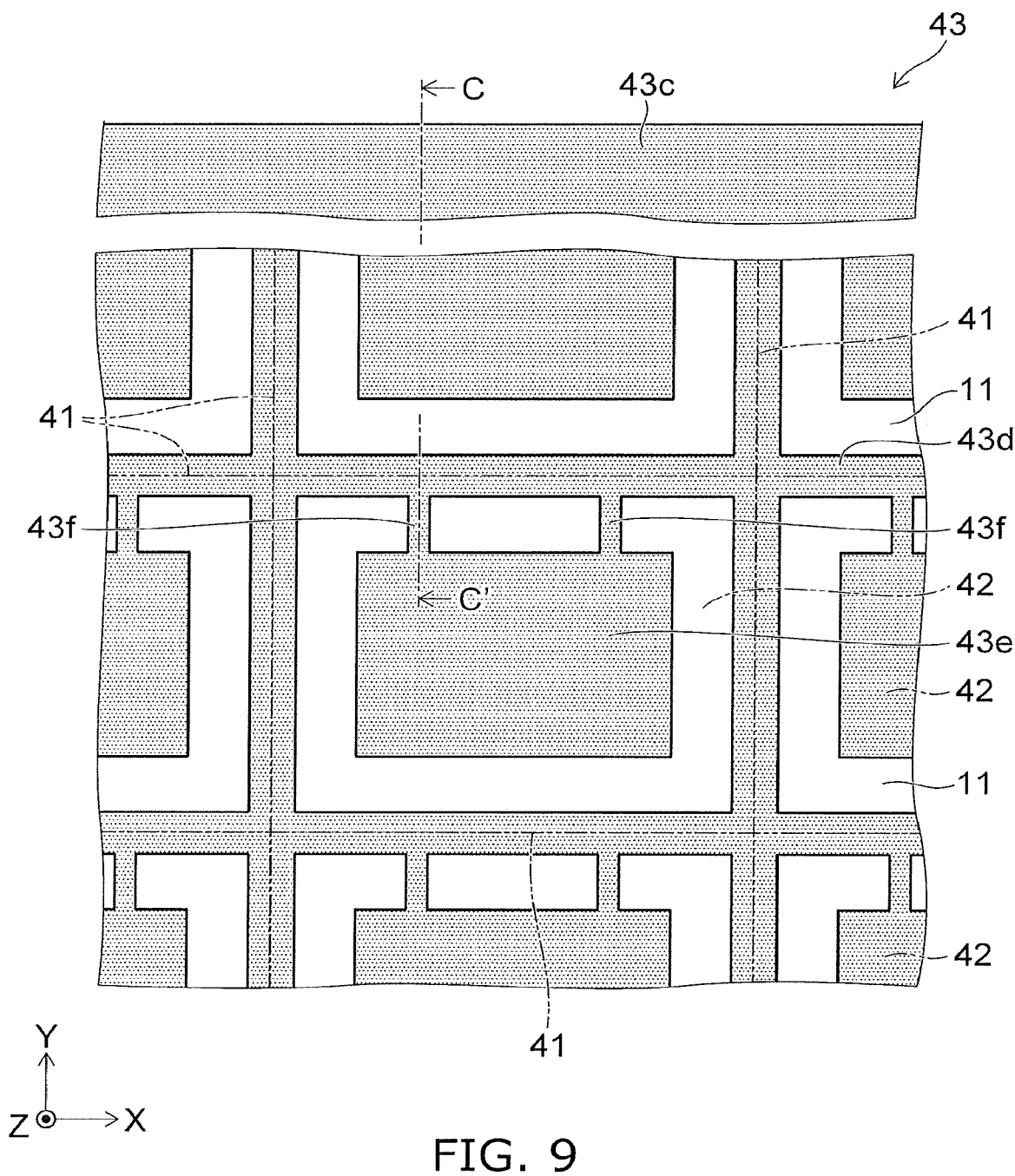
FIG. 9 is a partially enlarged view of FIG. 8.

FIG. 9 is a partially enlarged view of FIG. 8.

Figure 10:
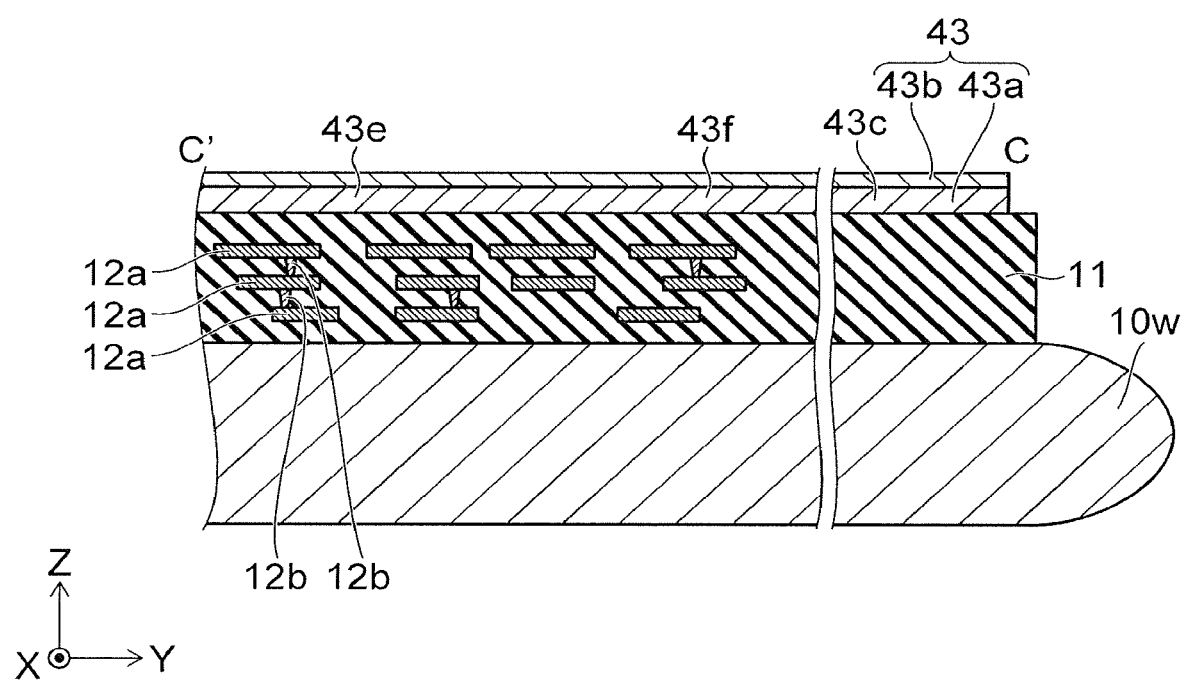
FIG. 10 is a cross-sectional view along line C-C' shown in FIG. 9.

FIG. 10 is a cross-sectional view along line C-C' shown in FIG. 9.

FIG. 11 to FIG. 17 are cross-sectional views showing the method for manufacturing the semiconductor memory device according to the embodiment.

First, a silicon wafer 10w is prepared as shown in FIG. 7 and FIG. 10. In the silicon wafer 10w, a dicing line 41 is set in a lattice configuration extending in the X-direction and the Y-direction; and the rectangular regions that are surrounded with the dicing line 41 become chip regions 42. Then, impurity diffusion regions (not illustrated), element separation regions (not illustrated), CMOS regions (not illustrated), etc., are formed in the upper layer portion of the silicon wafer 10w. Then, the inter-layer insulating film 11 that includes the interconnects 12a and the vias 12b is formed on the silicon wafer 10w. Thereby, a drive circuit is formed in each chip region 42 in the inter-layer insulating film 11 and the upper layer portion of the silicon wafer 10w.

Then, as shown in FIG. 8 to FIG. 10, a conductive film 43 is formed on the inter-layer insulating film 11 by forming a metal layer 43a and a polysilicon layer 43b. The conductive film 43 is insulated from the silicon wafer 10w by the inter-layer insulating film 11.

Then, an outer perimeter portion 43c, a lattice portion 43d, a rectangular portion 43e, and a bridge portion 43f are formed as one body by patterning the conductive film 43. The outer perimeter portion 43c is formed in, for example, an annular configuration on the outer perimeter portion of the silicon wafer 10w. The lattice portion 43d is formed in a lattice configuration in the region including the dicing line 41. The rectangular portion 43e is formed in the chip region 42. When viewed from the Z-direction, the configuration of the rectangular portion 43e is a rectangle having sides extending in the X-direction and the Y-direction. The bridge portion 43f is formed to link between the lattice portion 43d and the rectangular portion 43e. For example, two bridge portions 43f are formed for one rectangular portion 43e. The two bridge portions 43f extend in the Y-direction and are arranged in the X-direction. The width, i.e., the length in the X-direction, of each of the bridge portions 43f is shorter than the length in the X-direction of the rectangular portion 43e. Thereby, the rectangular portion 43e that is disposed in each of the chip regions 42 is electrically connected to the outer perimeter portion 43c via the bridge portions 43f and the lattice portion 43d. In other words, the rectangular portion 43e is electrically connected to the end surface of an intermediate structure body including the silicon wafer 10w, the inter-layer insulating film 11, the interconnects 12a, the vias 12b, and the conductive film 43. The bridge portion 43f may be disposed to extend in the X-direction.

Figure 11:
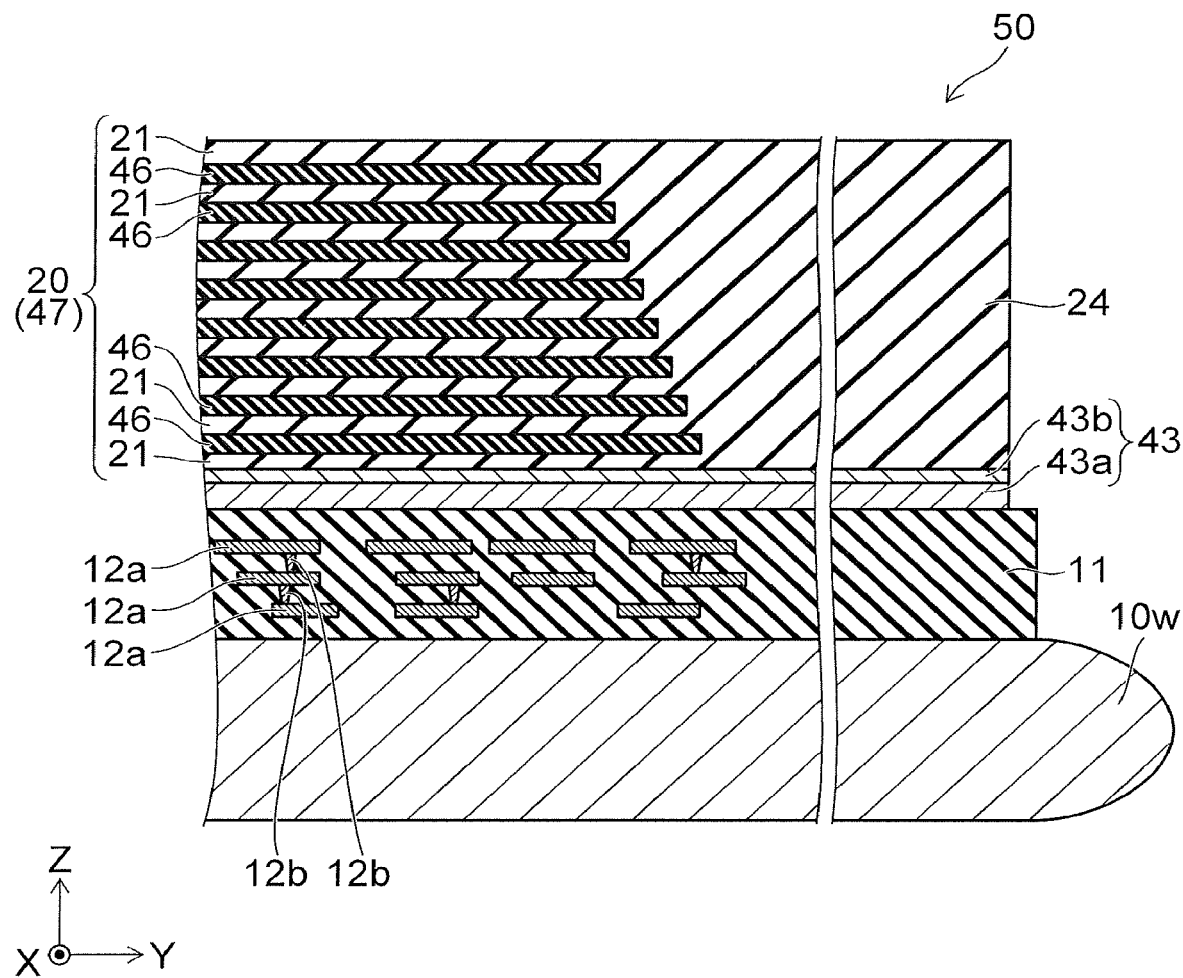
FIG. 11 to FIG. 17 are cross-sectional views showing the method for manufacturing the semiconductor memory device according to the first embodiment.

Then, as shown in FIG. 11, the space between the patterned conductive film 43 is filled with, for example, silicon oxide. Then, the insulating films 21 that are made of an insulating material such as, for example, silicon oxide (SiO), etc., and sacrificial films 46 that are made of an insulating material such as, for example, silicon nitride (SiN), etc., are stacked alternately. Thereby, a stacked film 47 is formed on the conductive film 43. The material of the sacrificial films 46 is not limited to silicon nitride; and it is sufficient to use a material that can realize etching selectivity with the insulating films 21.

Then, a resist pattern (not illustrated) is formed on the stacked film 47; and anisotropic etching using the resist pattern as a mask and slimming of the resist pattern are repeated. Thereby, the stacked film 47 is divided into each of the chip regions 42 (referring to FIG. 7); and the end portion of each divided portion is patterned into a staircase configuration in which the terrace 26 (referring to FIG. 4) is formed every sacrificial film 46. Thereby, the stacked body 20 is formed in each chip region 42. Two or more stacked bodies 20 may be formed in each of the chip regions 42. Then, the inter-layer insulating film 24 is formed between the stacked bodies 20. At this time, the end portion of the stacked body 20 is buried in the inter-layer insulating film 24. Then, CMP (Chemical Mechanical Polishing) of the upper surfaces of the stacked body 20 and the inter-layer insulating film 24 is performed. Thereby, an intermediate structure body 50 is made.

Figure 12:
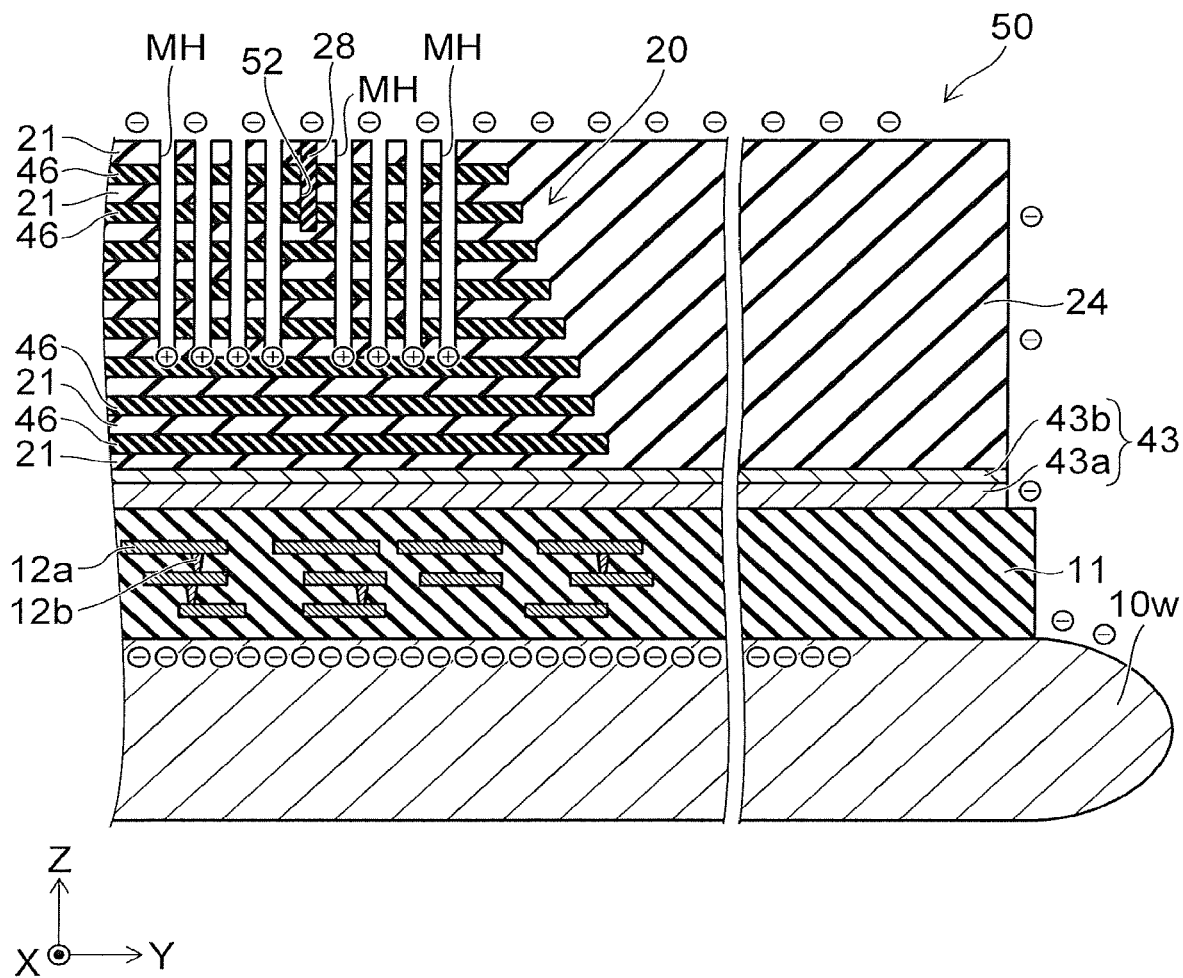

Then, as shown in FIG. 12, a trench 52 that extends in the X-direction is formed in the upper part of the stacked body 20. The trench 52 pierces one or multiple sacrificial films 46 and insulating films 21 from the top. Then, the insulating member 28 is formed by filling silicon oxide into the trench 52.

Then, a mask (not illustrated) is formed on the stacked body 20 and on the inter-layer insulating film 24; and plasma etching, e.g., RIE (Reactive Ion Etching), is performed. Thereby, memory holes MH are formed in the stacked body 20. Specifically, the intermediate structure body 50 is placed on a negative electrode in a chamber; argon gas and an etching gas including, for example, carbon and fluorine are introduced to the chamber; and these gases are plasmatized by applying a high frequency power. Thereby, the positive ions of the etching species collide with the intermediate structure body 50 and form the memory holes MH in the stacked body 20. The memory holes MH are formed also at positions dividing the insulating member 28. However, in FIG. 12 to FIG. 14, the portion where the insulating member 28 is not divided by the memory hole MH is shown.

At this time, a positive charge that is caused by the positive ions of the etching species accumulates at the bottom portions of the memory holes MH. The positive charge accumulates more easily as the aspect ratio of the memory holes MH increases. On the other hand, the surface of the intermediate structure body 50 in contact with the plasma in the chamber is negatively charged due to a self-bias. Thereby, the negative charge accumulates also in the silicon wafer 10w. In FIG. 12, the positive charge is illustrated schematically by the symbol of a "+" surrounded with a circle; and the negative charge is illustrated schematically by the symbol of a "−" surrounded with a circle.

Figure 13:
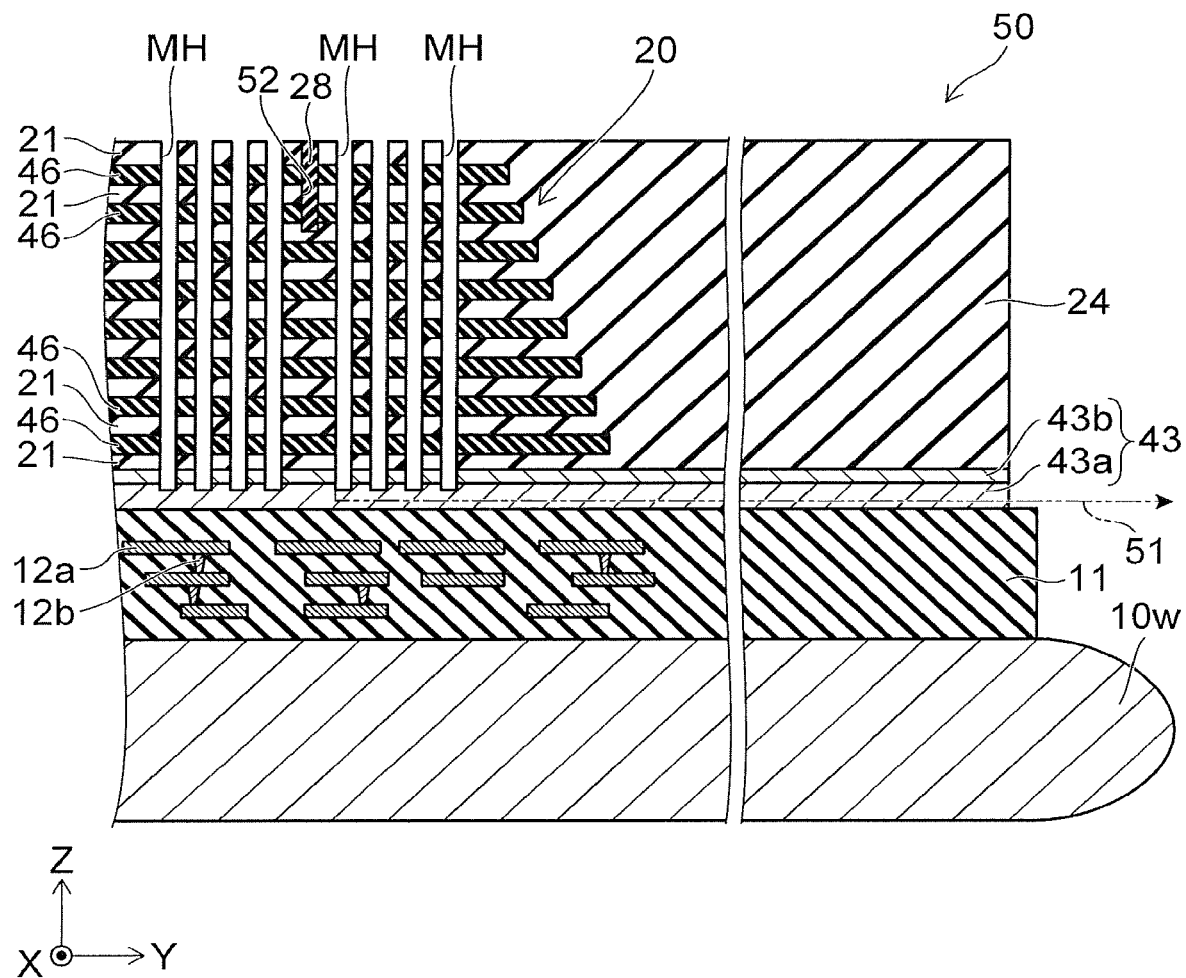

Then, as shown in FIG. 13, when the etching progresses and the memory holes MH reach the conductive film 43, the positive charge that accumulates in the memory holes MH flows to the surface of the intermediate structure body 50 via the rectangular portion 43e, the bridge portion 43f, the lattice portion 43d, and the outer perimeter portion 43c of the conductive film 43, combines with the negative charge accumulated at the surface of the intermediate structure body 50, and is annihilated. In FIG. 13, the path in which the positive charge flows is shown schematically as a current path 51.

Figure 14:
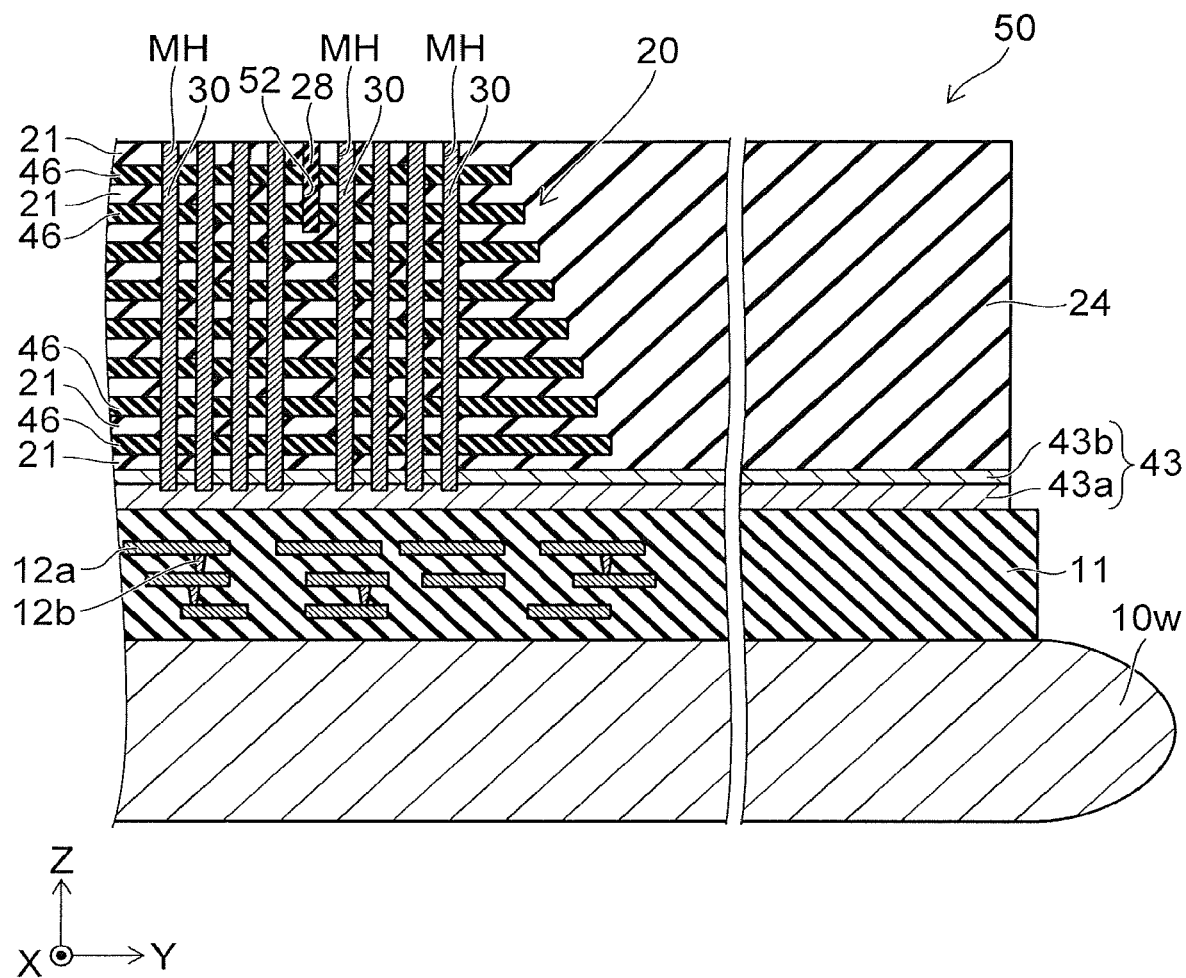

Then, as shown in FIG. 14, FIG. 5, and FIG. 6, the epitaxial silicon member 37 is formed by epitaxial growth of silicon by using the polysilicon layer 43b at the bottom portions of the memory holes MH as a starting point. Then, the silicon oxide layer 34, the charge storage film 32, the silicon oxide layer 31c, the silicon nitride layer 31b, and the silicon oxide layer 31a are formed in this order on the inner surfaces of the memory holes MH. The tunneling insulating film 31 is formed of the silicon oxide layer 31c, the silicon nitride layer 31b, and the silicon oxide layer 31a.

Then, a cover silicon layer (not illustrated) is formed on the side surface of the silicon oxide layer 31a by depositing silicon. Then, the portions of the cover silicon layer, the silicon oxide layer 31a, the silicon nitride layer 31b, the silicon oxide layer 31c, the charge storage film 32, and the silicon oxide layer 34 that are deposited on the bottom surfaces of the memory holes MH are removed by performing RIE; and the epitaxial silicon member 37 is exposed. Then, body silicon (not illustrated) is formed on the upper surface of the epitaxial silicon member 37 and on the side surface of the cover silicon layer by depositing silicon. The body silicon is connected to the epitaxial silicon member 37. The silicon pillars 30 are formed of the cover silicon layer and the body silicon. Then, the core member 29 is filled into the memory holes MH by depositing silicon oxide.

Figure 15:
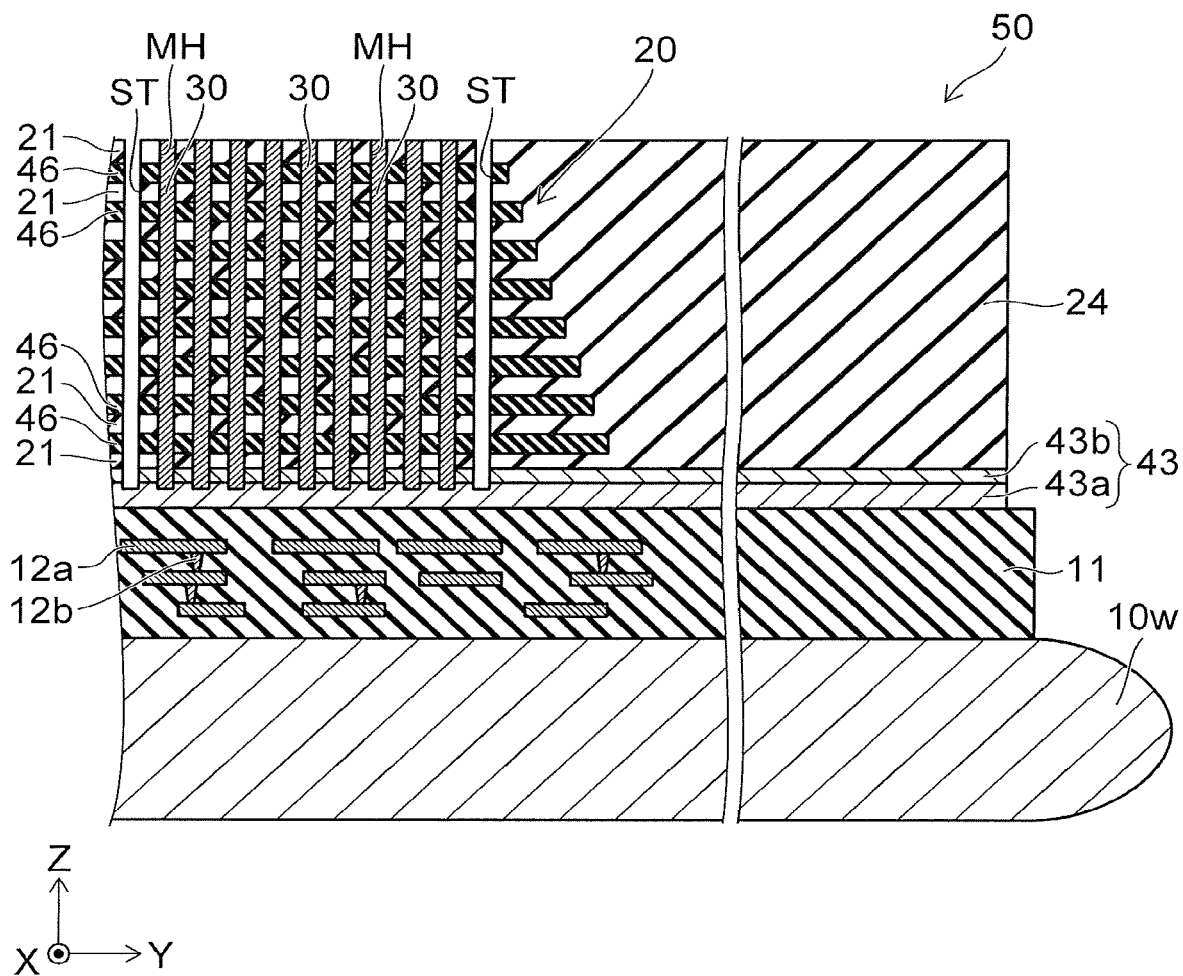

Then, as shown in FIG. 15, slits ST that extend in the X-direction are multiply formed in the stacked body 20. The slits ST are formed so that multiple columns, e.g., nine columns, of the silicon pillars 30 and one insulating member 28 (referring to FIG. 14) are interposed between the slits ST. The slits ST pierce the stacked body 20 in the Z-direction and reach the conductive film 43 but do not pierce through the conductive film 43. Although the insulating member 28 is not illustrated in FIG. 15, the insulating member 28 exists on the two X-direction sides of the silicon pillar 30 at the center. This is similar for subsequent drawings as well.

Figure 16:
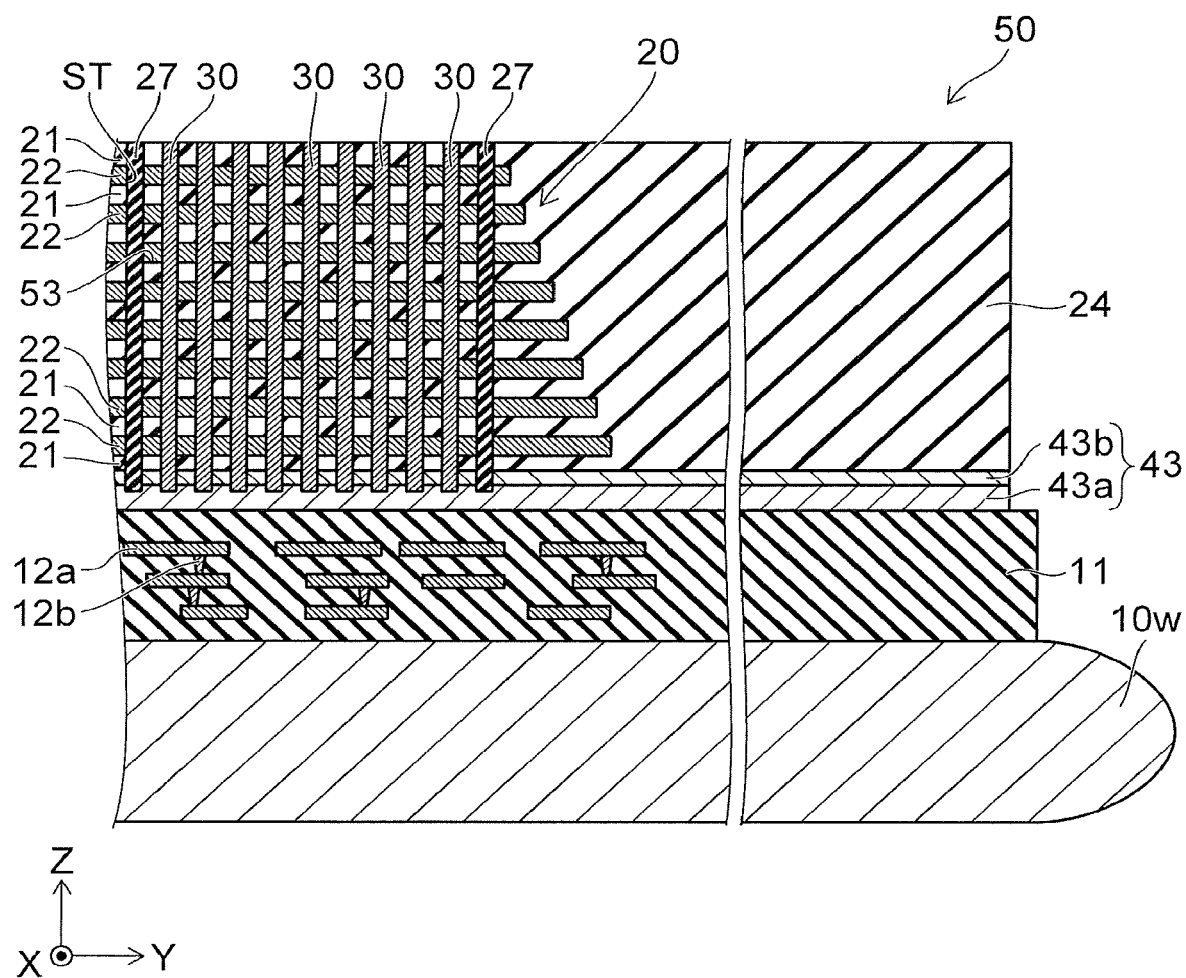

Then, as shown in FIG. 16, the sacrificial films 46 (referring to FIG. 15) are removed via the slits ST by performing isotropic etching. For example, in the case where the sacrificial films 46 are formed of silicon nitride, wet etching using hot phosphoric acid may be performed as the isotropic etching. Thereby, a space 53 is formed between the insulating films 21. The silicon oxide layer 34 (referring to FIG. 6) is exposed in the space 53.

Then, for example, by depositing aluminum oxide as shown in FIG. 5 and FIG. 6, the aluminum oxide layer 35 is formed via the slits ST on the inner surface of the space 53, that is, on the upper surface of the insulating film 21, on the lower surface of the insulating film 21, and on the side surface of the silicon oxide layer 34. The blocking insulating film 33 is formed of the silicon oxide layer 34 and the aluminum oxide layer 35.

Then, by depositing a conductive material such as, for example, titanium nitride, titanium, etc., the barrier metal layer 39 is formed via the slits ST on the inner surface of the space 53, that is, on the surface of the aluminum oxide layer 35. Then, by depositing a conductive material such as, for example, tungsten, etc., the main portion 38 is formed via the slits ST in the space 53, that is, on the surface of the barrier metal layer 39. The electrode film 22 is formed of the barrier metal layer 39 and the main portion 38. Thus, the sacrificial films 46 are replaced with the electrode films 22.

Then, the main portion 38, the barrier metal layer 39, and the aluminum oxide layer 35 that are in the slits ST are removed using, for example, RIE. Thereby, the electrode films 22 that are formed in the space 53 are insulated from each other.

Then, the insulating members 27 are formed in the slits ST by depositing an insulating material such as, for example, silicon oxide, etc.

Figure 17:
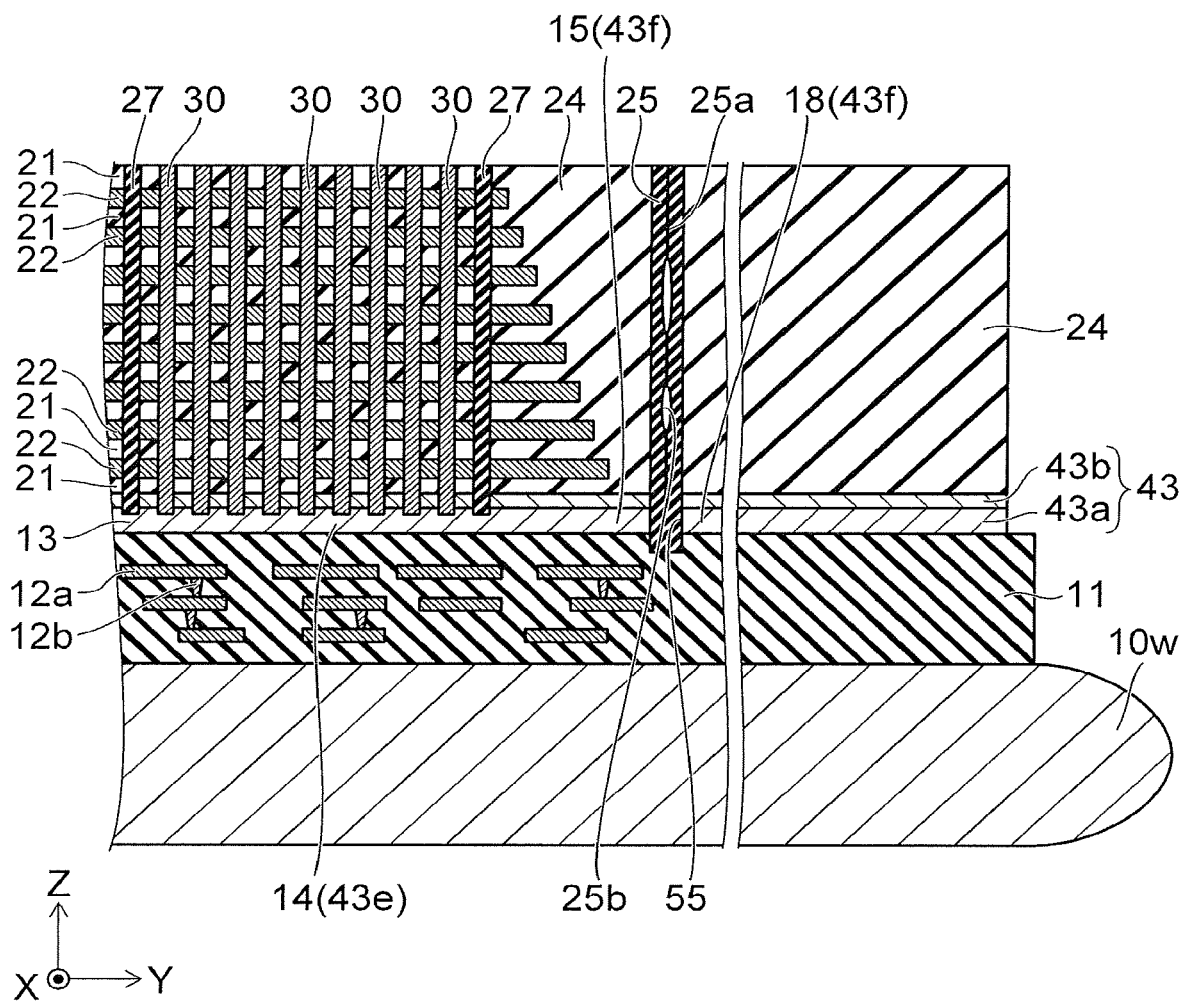

Then, as shown in FIG. 17, FIG. 3, and FIG. 1, a hole 55 is formed in the inter-layer insulating film 24. The configuration of the hole 55 is set to be, for example, a quadrilateral column, a substantially quadrilateral column having rounded corners, an ellipse column, etc. The hole 55 pierces the inter-layer insulating film 24 and the conductive film 43 in the Z-direction; and the lower end of the hole 55 is positioned in the upper part of the inter-layer insulating film 11. The bridge portion 43f of the conductive film 43 is divided into two by the hole 55. Thereby, the conductive film 43 is divided into the buried source film 13 and the conductive film 16. Of the two divided portions of the bridge portion 43f, the portion that is proximal to the stacked body 20 becomes the fine line portion 15 of the buried source film 13; and the portion that is distal to the stacked body 20 becomes the fine line portion 18 of the conductive film 16. The cross-sections of the bridge portion 43f due to the hole 55 become the tip surface 15t of the fine line portion 15 and the tip surface 18t of the fine line portion 18. In the case where the configuration of the hole 55 is a quadrilateral column, the tip surfaces 15t and 18t are flat surfaces. On the other hand, in the case where the configuration of the hole 55 is an elliptical column, the tip surfaces 15t and 18t are concave curved surfaces. Also, the rectangular portion 43e of the conductive film 43 becomes the main portion 14 of the buried source film 13.

Then, the insulating member 25 is formed in the hole 55 by depositing an insulating material such as, for example, silicon oxide, etc. At this time, there are cases where the seam 25a is formed in the insulating member 25; and there are also cases where the void 25b is formed along the seam 25a. Then, upper layer interconnect layers (not illustrated), passivation films (not illustrated), etc., are formed on the stacked body 20 and on the inter-layer insulating film 24.

Then, as shown in FIG. 1 and FIG. 8, the intermediate structure body 50 is diced along the dicing line 41. Thereby, the chip regions 42 are singulated; and the semiconductor memory devices 1 are manufactured. At this time, the silicon wafer 10w is divided to become the silicon substrates 10. Further, the lattice portion 43d of the conductive film 43 also is divided to become the frame-shaped portions 17 of the conductive films 16.

Effects of the embodiment will now be described.

In the embodiment, in the processes shown in FIG. 8 to FIG. 10, the conductive film 43 is formed so that the rectangular portion 43e disposed in each of the chip regions 42 is electrically connected to the surface of the intermediate structure body via the bridge portion 43f, the lattice portion 43d, and the outer perimeter portion 43c. Thereby, when the memory holes MH reach the rectangular portion 43e of the conductive film 43 in the process shown in FIG. 13, the positive charge that accumulates in the memory holes MH is discharged to the surface of the intermediate structure body 50 via the bridge portion 43f, the lattice portion 43d, and the outer perimeter portion 43c of the conductive film 43. As a result, the accumulation in the conductive film 43 of the positive charge that was accumulated in the memory holes MH is suppressed; and the application of a voltage between the conductive film 43 and the silicon wafer 10w via the inter-layer insulating film 11 can be suppressed. Thereby, the occurrence of arcing between the conductive film 43 and the silicon wafer 10w can be suppressed. As a result, the memory holes MH that have a high aspect ratio can be formed stably while suppressing the arcing.

Conversely, if the conductive film 43 is not electrically connected to the surface of the intermediate structure body 50 from the portion reached by the memory holes MH, when the memory holes MH reach the conductive film 43 in the process shown in FIG. 13, the positive charge that accumulates in the memory holes MH flows into the conductive film 43 and positively charges the conductive film 43. On the other hand, because the silicon wafer 10w is negatively charged by the plasma, there is a risk that arcing may occur between the conductive film 43 and the silicon wafer 10w. Because Joule heat is generated when the arcing occurs, the peripheral portions of the current path of the intermediate structure body 50 are melted, etc., and the intermediate structure body 50 is greatly damaged.

Also, in the embodiment, the bridge portion 43f of the conductive film 43 is divided by the hole 55 in the process shown in FIG. 17. Accordingly, in the semiconductor memory device 1 after the dicing, the buried source film 13 is insulated from the conductive film 16. Therefore, the potential of the buried source film 13 can be controlled with high precision; and the semiconductor memory device 1 can be operated with high precision. In other words, the charge that accumulates due to the plasma etching partway through the manufacturing of the semiconductor memory device 1 is discharged to the outside by using the bridge portion 43f as a current path. Subsequently, by cutting the bridge portion 43f with the hole 55, the buried source film 13 and the conductive film 16 are divided. Thereby, in the semiconductor memory device 1 after completion, the buried source film 13 functions as a source terminal of the NAND string; and the conductive film 16 is separated from the buried source film 13 and is disposed at a position not interfering with the buried source film 13. Thus, according to the embodiment, partway through the manufacturing, the arcing is suppressed by the buried source film 13 being electrically connected to the end surface of the wafer; and after the manufacturing, the buried source film 13 is insulated from the chip end surface, and stable operations can be realized.

Second Embodiment

A second embodiment will now be described.

Figure 18:
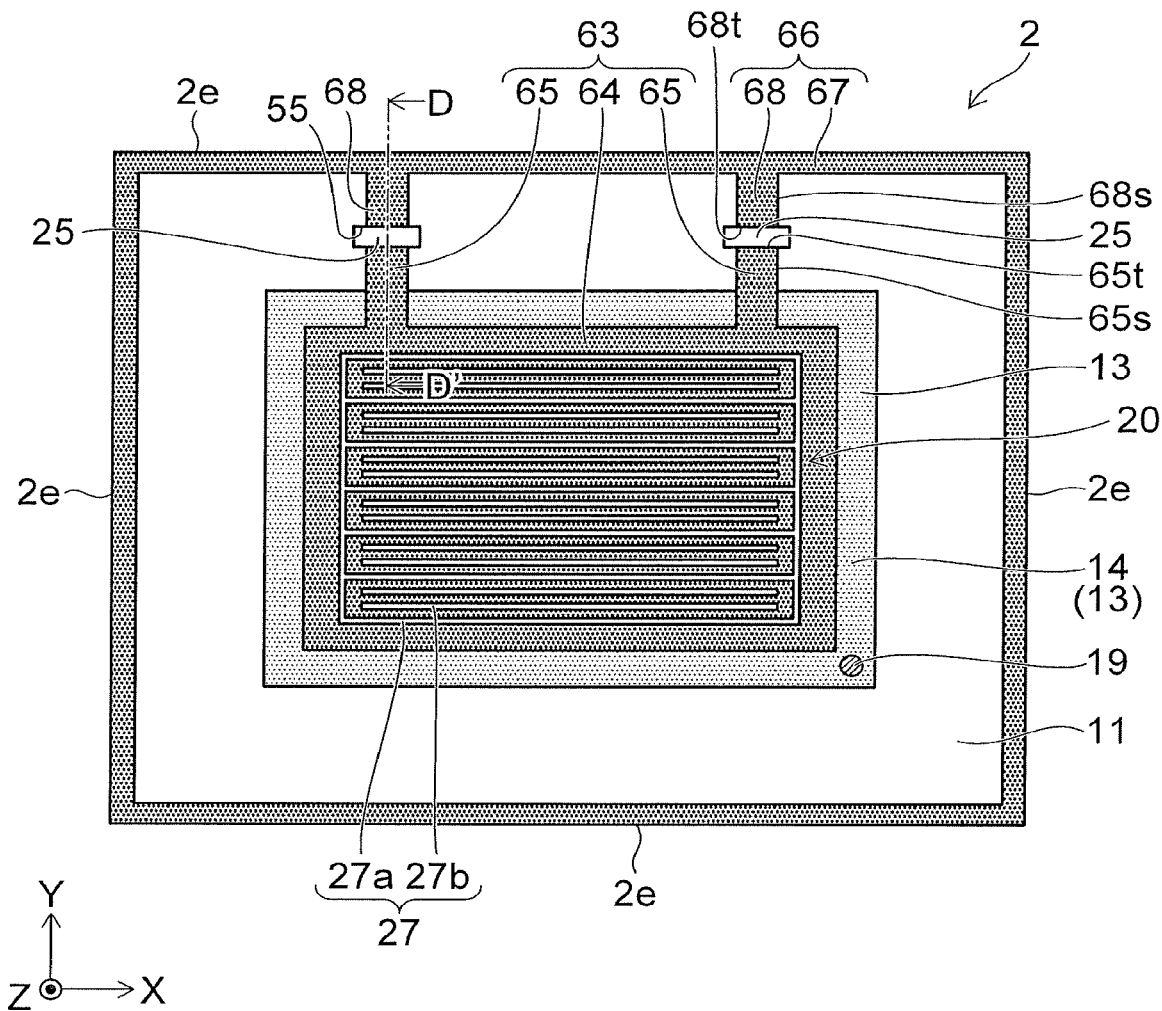
FIG. 18 is a plan view showing a semiconductor memory device according to a second embodiment.

FIG. 18 is a plan view showing a semiconductor memory device according to the embodiment.

Figure 19:
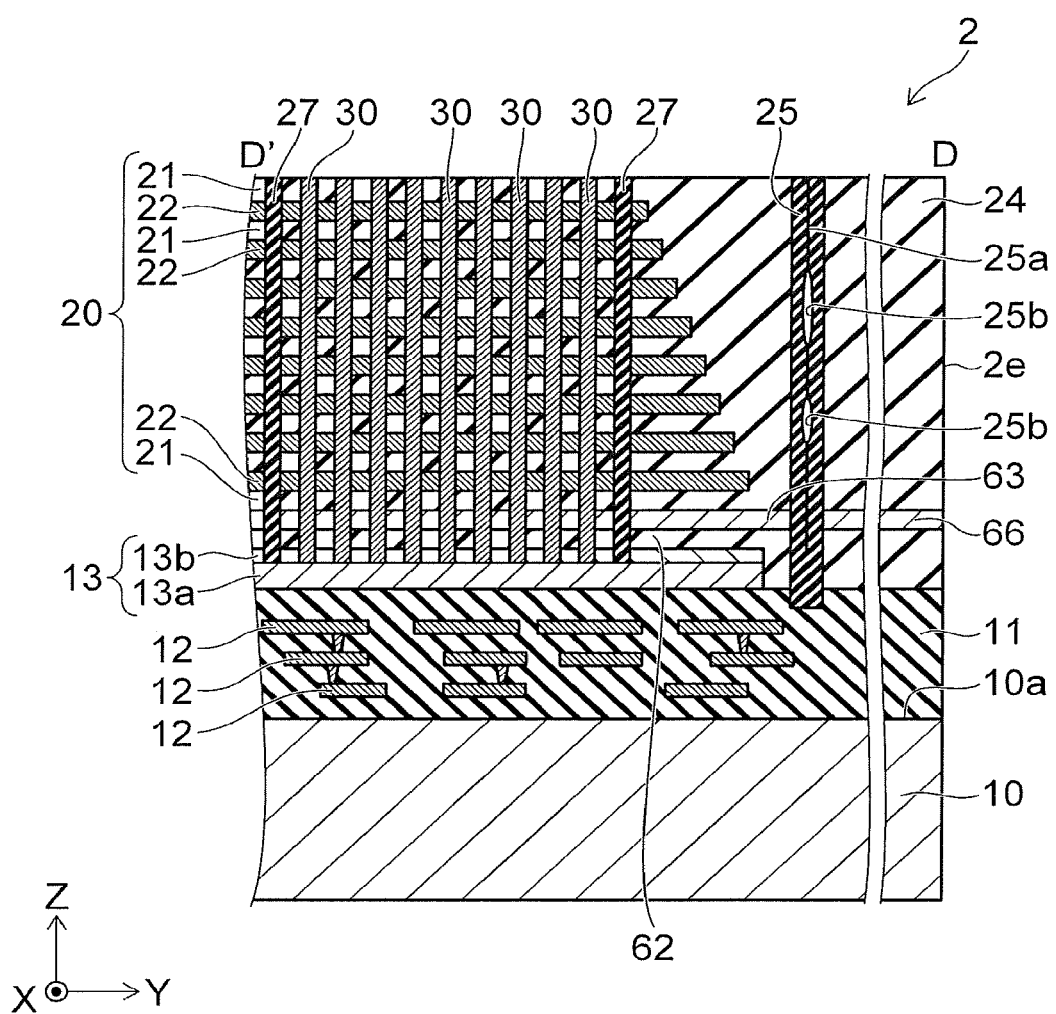
FIG. 19 is a cross-sectional view along line D-D' shown in FIG. 18.

FIG. 19 is a cross-sectional view along line D-D' shown in FIG. 18.

Figure 20:
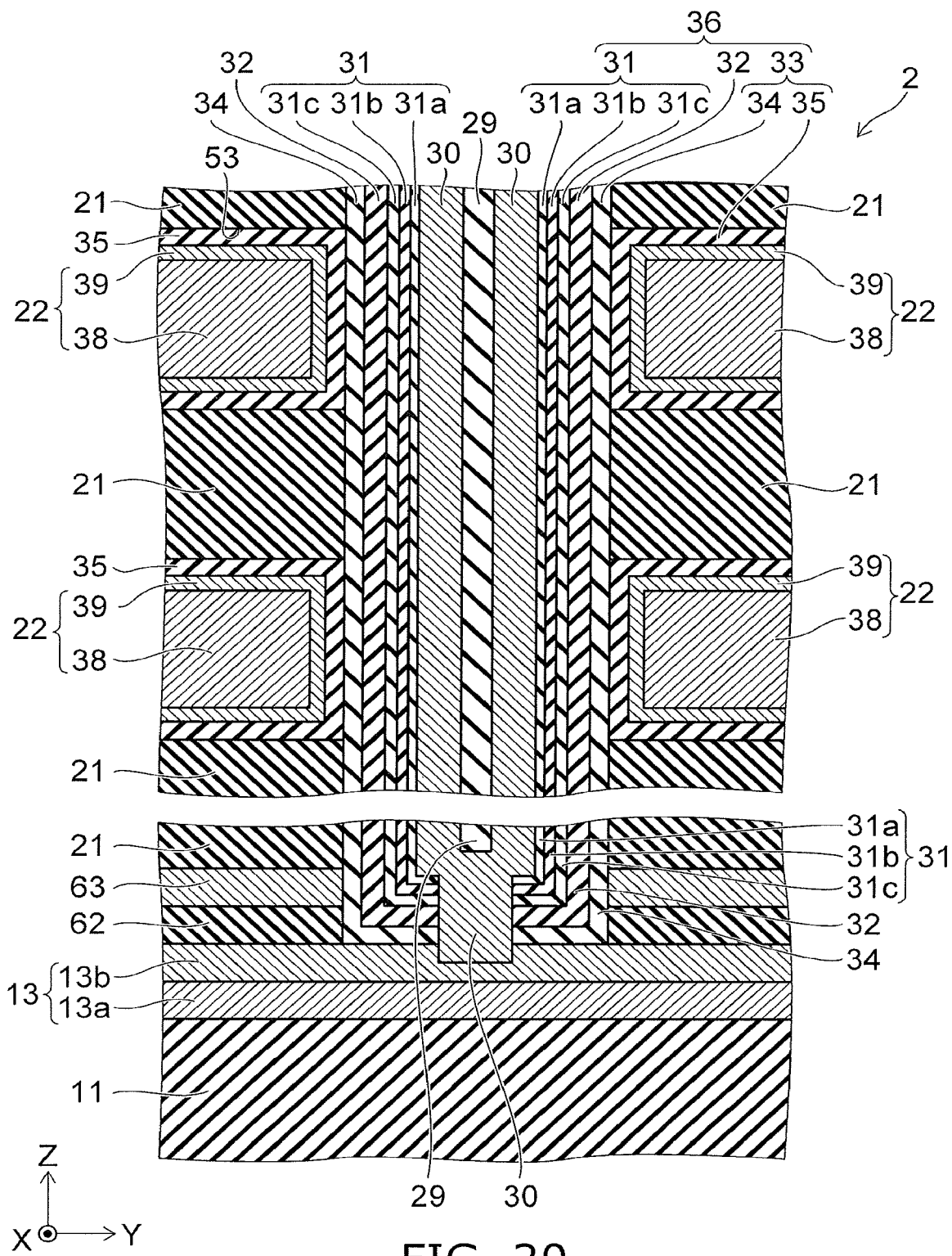
FIG. 20 is a cross-sectional view showing a silicon pillar periphery of the semiconductor memory device according to the second embodiment.

FIG. 20 is a cross-sectional view showing the silicon pillar periphery of the semiconductor memory device according to the embodiment.

As shown in FIG. 18 to FIG. 20, the semiconductor memory device 2 according to the embodiment differs from the semiconductor memory device 1 according to the first embodiment described above (referring to FIG. 1 to FIG. 6) in that the conductive film 16 and the fine line portion 15 of the buried source film 13 are not provided; an insulating film 62 and a polysilicon film 63 are provided between the buried source film 13 and the stacked body 20; a polysilicon film 66 is provided between the inter-layer insulating film 11 and the inter-layer insulating film 24; and the epitaxial silicon member is not provided. The polysilicon films 63 and 66 are conductive. The lower ends of the silicon pillars 30 contact the polysilicon layer 13b of the buried source film 13. The lower ends of the insulating members 27 pierce the polysilicon film 63 and reach the main portion 14 of the buried source film 13 but do not pierce through the buried source film 13. In the embodiment, the positive charge that accumulates as the memory holes MH are formed is discharged via the polysilicon films.

A main portion 64 and a fine line portion 65 are provided in the polysilicon film 63. The main portion 64 and the fine line portion 65 are formed as one body. When viewed from the Z-direction, the configuration of the main portion 64 is a rectangle that is one size smaller than the main portion 14 of the buried source film 13. The insulating members 27 pierce the main portion 64. The fine line portion 65 extends toward an end surface 2e of the semiconductor memory device 2 from the end edge of the main portion 64 extending in the X-direction. When viewed from the Z-direction, the configuration of the fine line portion 65 is substantially rectangular. For example, two fine line portions 65 are provided. A tip surface 65t of the fine line portion 65 extends in the X-direction. The width, i.e., the length in the X-direction, of the fine line portion 65 is narrower than the width, i.e., the length in the X-direction, of the main portion 64. The width of the main portion 64 is the length in the X-direction of the entire main portion 64 and is not the length of each portion divided by the insulating members 27. The tip surface 65t may be a flat surface parallel to the X-direction or may be a curved surface that is curved to be concave when viewed from the Z-direction. A contact is not connected to the fine line portion 65 of the polysilicon film 63; and a current supply point is not provided in the fine line portion 65. Also, a contact is not connected to the portion of the main portion 64 of the polysilicon film 63 having the frame-like configuration disposed on the outer side of the portion 27a of the insulating member 27. On the other hand, a contact (not illustrated) is connected to the portion of the main portion 64 disposed on the inner side of the portion 27a of the insulating member 27; and a prescribed driving potential is applied via the contact. Thereby, the main portion 64 of the polysilicon film 63 controls the ON/OFF of the portions of the silicon pillars 30 surrounded with the main portion 64.

A frame-shaped portion 67 and a fine line portion 68 are provided in the polysilicon film 66. The frame-shaped portion 67 and the fine line portion 68 are formed as one body. The configuration of the frame-shaped portion 67 is a frame-like configuration surrounding the main portion 64 and is disposed in a region contacting the end surface 2e of the semiconductor memory device 2. The fine line portion 68 extends from the frame-shaped portion 67 toward the inner side and opposes the fine line portion 65. The configuration of the fine line portion 68 is, for example, substantially rectangular when viewed from the Z-direction. A tip surface 68t of the fine line portion 68 may be a flat surface parallel to the X-direction or may be a concave curved surface when viewed from the Z-direction. In the case where both the tip surface 65t of the fine line portion 65 and the tip surface 68t of the fine line portion 68 are flat surfaces, the tip surface 68t may be substantially parallel to the tip surface 65t of the fine line portion 65. A side surface 68s of the fine line portion 68 extending in the direction toward the fine line portion 65, i.e., the Y-direction, is positioned on an extension plane of a side surface 65s of the fine line portion 65 extending in a direction toward the fine line portion 68, i.e., the Y-direction.

The lower part of the insulating member 25 is disposed between the fine line portion 65 of the polysilicon film 63 and the fine line portion 68 of the polysilicon film 66; and the lower end of the insulating member 25 is positioned in the inter-layer insulating film 11. The tip surface 65t of the fine line portion 65 and the tip surface 68t of the fine line portion 68 contact the insulating member 25. On the other hand, the buried source film 13 is separated from the insulating member 25.

A method for manufacturing the semiconductor memory device according to the embodiment will now be described.

Figure 21:
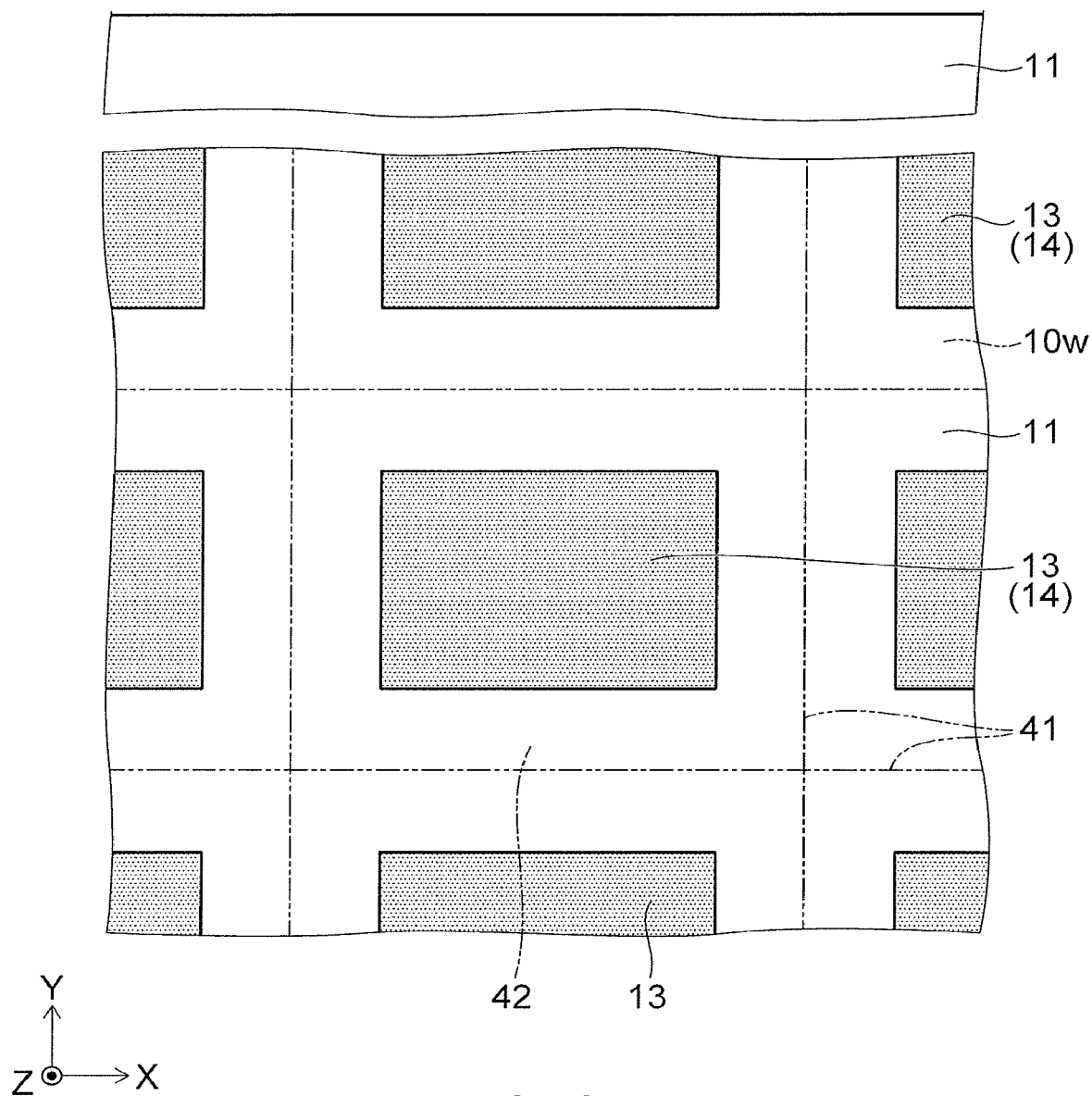
FIG. 21 and FIG. 22 are plan views showing a method for manufacturing the semiconductor memory device according to the second embodiment.
Figure 22:
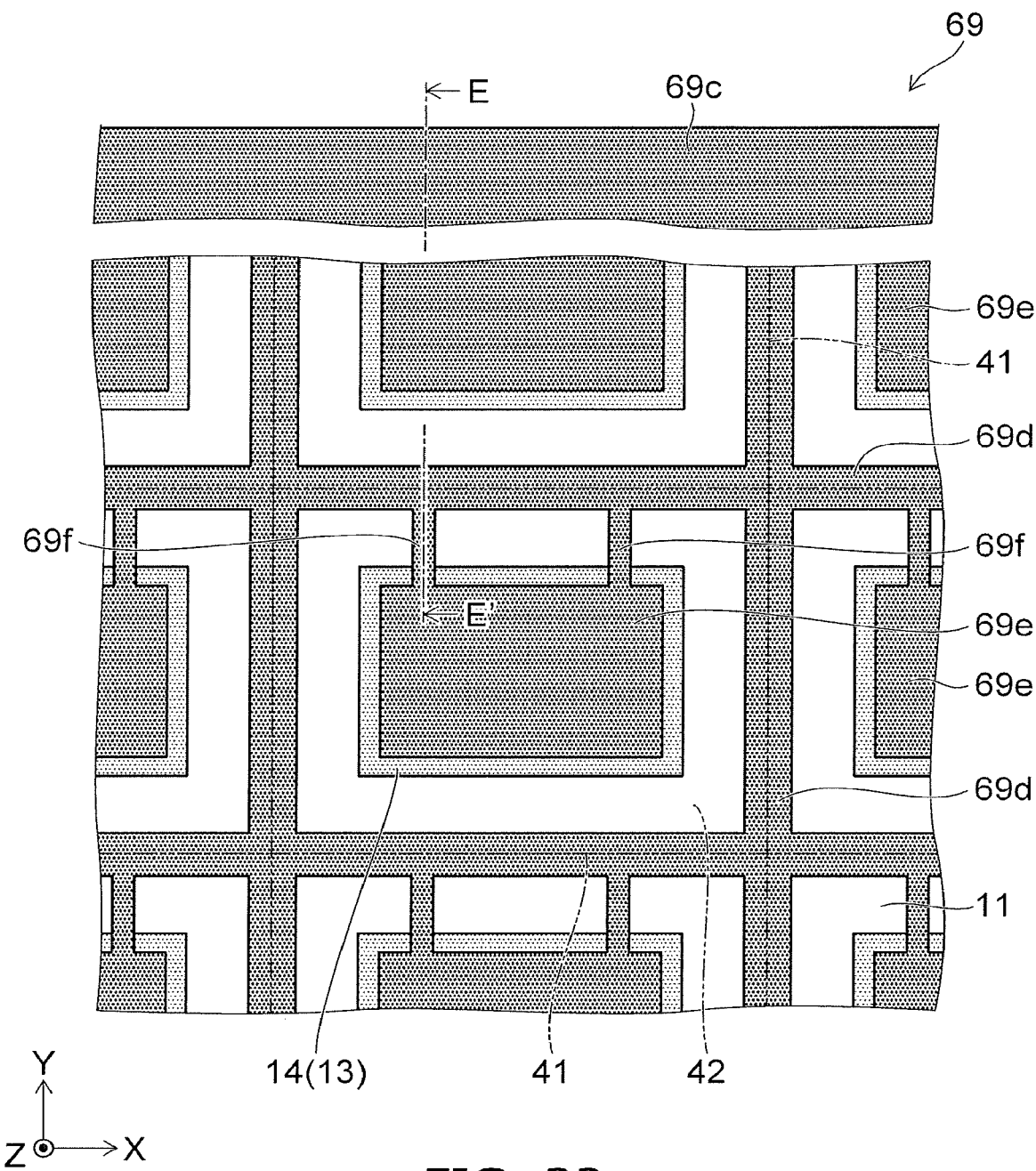

FIG. 21 and FIG. 22 are plan views showing the method for manufacturing the semiconductor memory device according to the embodiment.

Figure 23:
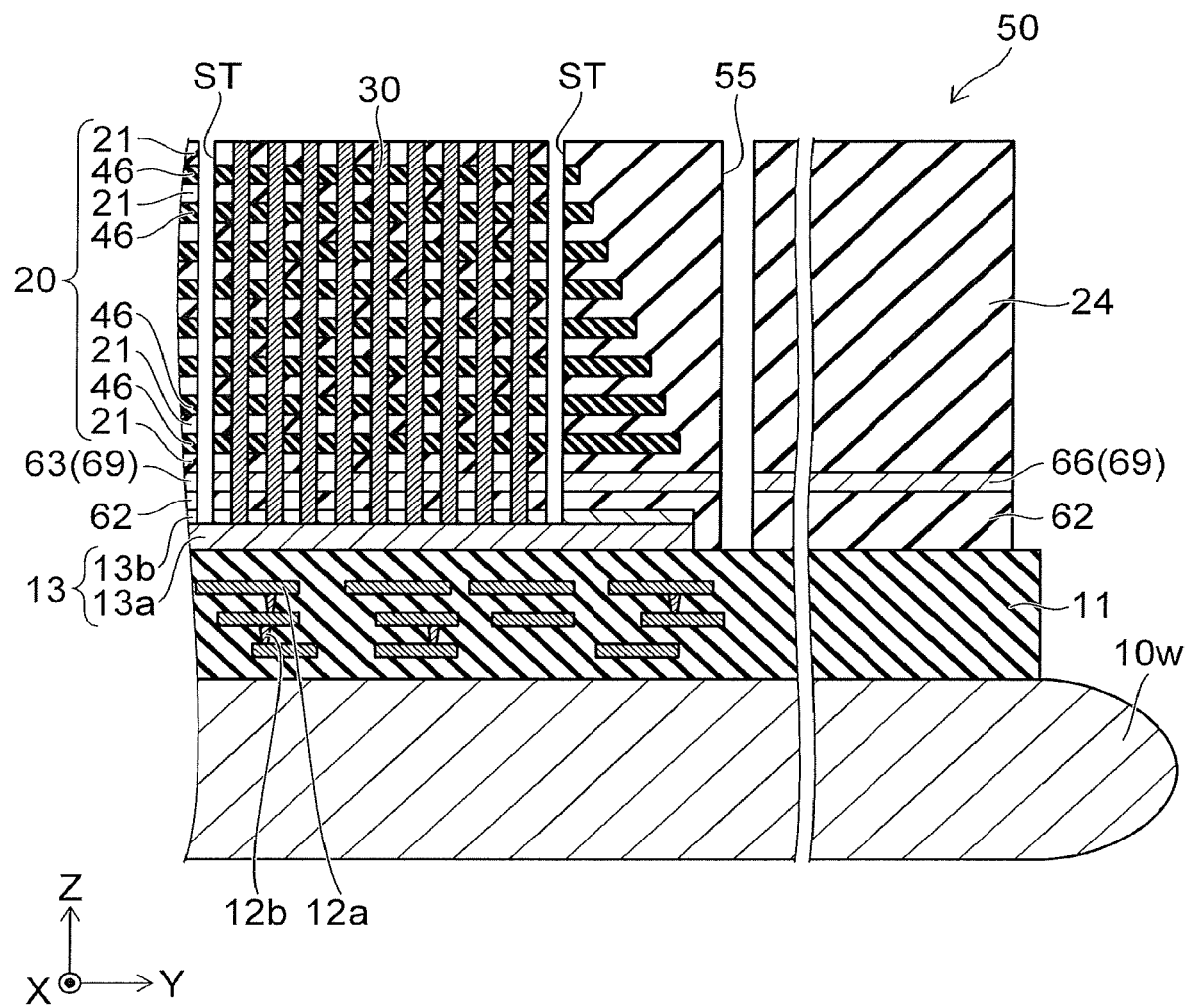
FIG. 23 is a cross-sectional view showing the method for manufacturing the semiconductor memory device according to the second embodiment.

FIG. 23 is a cross-sectional view showing the method for manufacturing the semiconductor memory device according to the embodiment.

The cross section shown in FIG. 23 corresponds to a cross section along line E-E' shown in FIG. 22.

First, as shown in FIG. 23, similarly to the first embodiment described above, the inter-layer insulating film 11 that includes the interconnects 12a and the vias 12b is formed on the silicon wafer 10w.

Then, as shown in FIG. 23 and FIG. 21, the buried source film 13 is formed in each of the chip regions 42 on the inter-layer insulating film 11. Only the main portion 14 is formed in the buried source film 13; and the fine line portion 15 (referring to FIG. 1) is not formed. Also, the conductive film 16 (referring to FIG. 1) is not formed.

Then, as shown in FIG. 23, the insulating film 62 is formed on the buried source film 13 by depositing an insulating material such as, for example, silicon oxide, etc.

Then, as shown in FIG. 23 and FIG. 22, a polysilicon film 69 is formed on the insulating film 62 by depositing silicon. Then, an outer perimeter portion 69c, a lattice portion 69d, a rectangular portion 69e, and a bridge portion 69f are formed as one body by patterning the polysilicon film 69. For example, the outer perimeter portion 69c is formed in an annular configuration on the outer perimeter portion of the silicon wafer 10w. The lattice portion 69d is formed in a lattice configuration in the region including the dicing line 41. The rectangular portion 69e is formed in the chip region 42 in the interior of the region directly above the buried source film 13. When viewed from the Z-direction, the configuration of the rectangular portion 69e is a rectangle that is one size smaller than the buried source film 13. The bridge portion 69f is formed to link between the lattice portion 69d and the rectangular portion 69e. For example, two bridge portions 69f are formed for one rectangular portion 69e. The two bridge portions 69f extend in the Y-direction and are arranged in the X-direction. The width, i.e., the length in the X-direction, of each of the bridge portions 69f is shorter than the length in the X-direction of the rectangular portion 69e. Thereby, the rectangular portion 69e that is disposed in each of the chip regions 42 is electrically connected to the outer perimeter portion 69c via the bridge portions 69f and the lattice portion 69d. The bridge portion 69f may be disposed to extend in the X-direction.

Then, the stacked body 20 and the inter-layer insulating film 24 are formed on the polysilicon film 69 by implementing a process similar to the process shown in FIG. 11. The insulating member 28 is formed in the upper part of the stacked body 20.

Then, the memory holes MH are formed in the stacked body 20 by RIE using plasma by implementing processes similar to the processes shown in FIG. 12 and FIG. 13. At this time, as shown in FIG. 23, the polysilicon film 69 is used as a stopper film. In other words, the conditions of the etching for forming the memory holes MH are set to be conditions such that the etching rate of silicon oxide and the etching rate of silicon nitride are higher than the etching rate of silicon. Thereby, the etching rate is markedly slower when the memory holes MH reach the polysilicon film 69.

The positive charge that accumulates at the bottom portions of the memory holes MH due to the etching is discharged to the surface of the intermediate structure body 50 via the rectangular portion 69e, the bridge portion 69f, the lattice portion 69d, and the outer perimeter portion 69c of the polysilicon film 69 when the memory holes MH reach the polysilicon film 69.

Then, after all of the memory holes MH reach the polysilicon film 69, the memory holes MH are caused to pierce the polysilicon film 69 by performing etching of the polysilicon film 69. Subsequently, the memory holes MH reach the buried source film 13 by etching the insulating film 62. Thus, by using the polysilicon film 69 as a stopper film, the positions of the lower ends of the memory holes MH can be uniform; and the memory holes MH that penetrate too deeply into the buried source film 13 can be prevented.

Then, the silicon pillars 30, etc., are formed in the memory holes MH by implementing a process similar to the process shown in FIG. 14. At this time, as shown in FIG. 20, the epitaxial silicon member 37 (referring to FIG. 6) is not formed; and the silicon pillars 30 contact the polysilicon layer 13b of the buried source film 13.

Then, as shown in FIG. 23 and FIG. 18, the slits ST and the hole 55 are formed simultaneously by performing anisotropic etching such as RIE, etc. The slits ST are formed in the stacked body 20; and the hole 55 is formed in the inter-layer insulating film 24. In this etching as well, the polysilicon film 69 is used as a stopper film.

At this time, the hole 55 pierces the inter-layer insulating film 24 and the insulating film 62 in the Z-direction and reaches the upper part of the inter-layer insulating film 11. Thereby, the lower part of the hole 55 divides the bridge portion 69f of the polysilicon film 69. Of the two portions of the bridge portion 69f divided by the hole 55, the portion that is proximal to the stacked body 20 becomes the fine line portion 65 of the polysilicon film 63; and the portion that is distal to the stacked body 20 becomes the fine line portion 68 of the polysilicon film 66. The cross-sections of the bridge portion 69f due to the hole 55 become the tip surface 65t of the fine line portion 65 and the tip surface 68t of the fine line portion 68. Also, the rectangular portion 69e of the polysilicon film 69 becomes the main portion 64 of the polysilicon film 63.

Then, the sacrificial films 46 are replaced with the electrode films 22 via the slits ST by implementing a process similar to the process shown in FIG. 16.

Then, as shown in FIG. 19, the insulating members 27 are formed in the slits ST and the insulating member 25 is formed in the hole 55 by depositing an insulating material such as, for example, silicon oxide, etc. At this time, there are cases where the seam 25a is formed in the insulating member 25; and there are also cases where the void 25b is formed along the seam 25a. Then, upper layer interconnect layers (not illustrated), passivation films (not illustrated), etc., are formed on the stacked body 20 and on the inter-layer insulating film 24.

Then, as shown in FIG. 18, the intermediate structure body 50 (referring to FIG. 23) is diced along the dicing line 41 (referring to FIG. 22). Thereby, the chip regions 42 are singulated; and the semiconductor memory devices 2 are manufactured. At this time, the silicon wafer 10w is divided to become the silicon substrates 10. Further, the lattice portion 69d of the polysilicon film 69 also is divided to become the frame-shaped portions 67.

Effects of the embodiment will now be described.

In the embodiment, the positive charge that accumulates as the memory holes MH are formed is discharged via the polysilicon film 69 used as the stopper film. Thereby, similarly to the first embodiment described above, the arcing between the silicon wafer 10w and the conductive film for the buried source film 13 can be suppressed.

In the embodiment, the charge is discharged to the outside via the bridge portion 69f of the polysilicon film 69 partway through the manufacturing of the semiconductor memory device 2. Subsequently, because the bridge portion 69f is cut, the polysilicon film 66 is separated from the polysilicon film 63 contributing to the memory operation and is disposed at a position not interfering with the polysilicon film 63 in the semiconductor memory device 2 after completion.

Also, according to the embodiment, it is sufficient for the hole 55 to divide the polysilicon film 69; and it is unnecessary to divide the conductive film 43 including the metal layer 43a (referring to FIG. 17). Therefore, the hole 55 can be formed in the same process as the slits ST in the process shown in FIG. 23. Accordingly, in the embodiment, it is unnecessary to provide a dedicated process for forming the hole 55. As a result, in the embodiment, compared to the first embodiment described above, the number of processes is low; and the manufacturing cost is low.

Otherwise, the configuration, the manufacturing method, and the effects of the embodiment are similar to those of the first embodiment described above.

Third Embodiment

A third embodiment will now be described.

Figure 24:
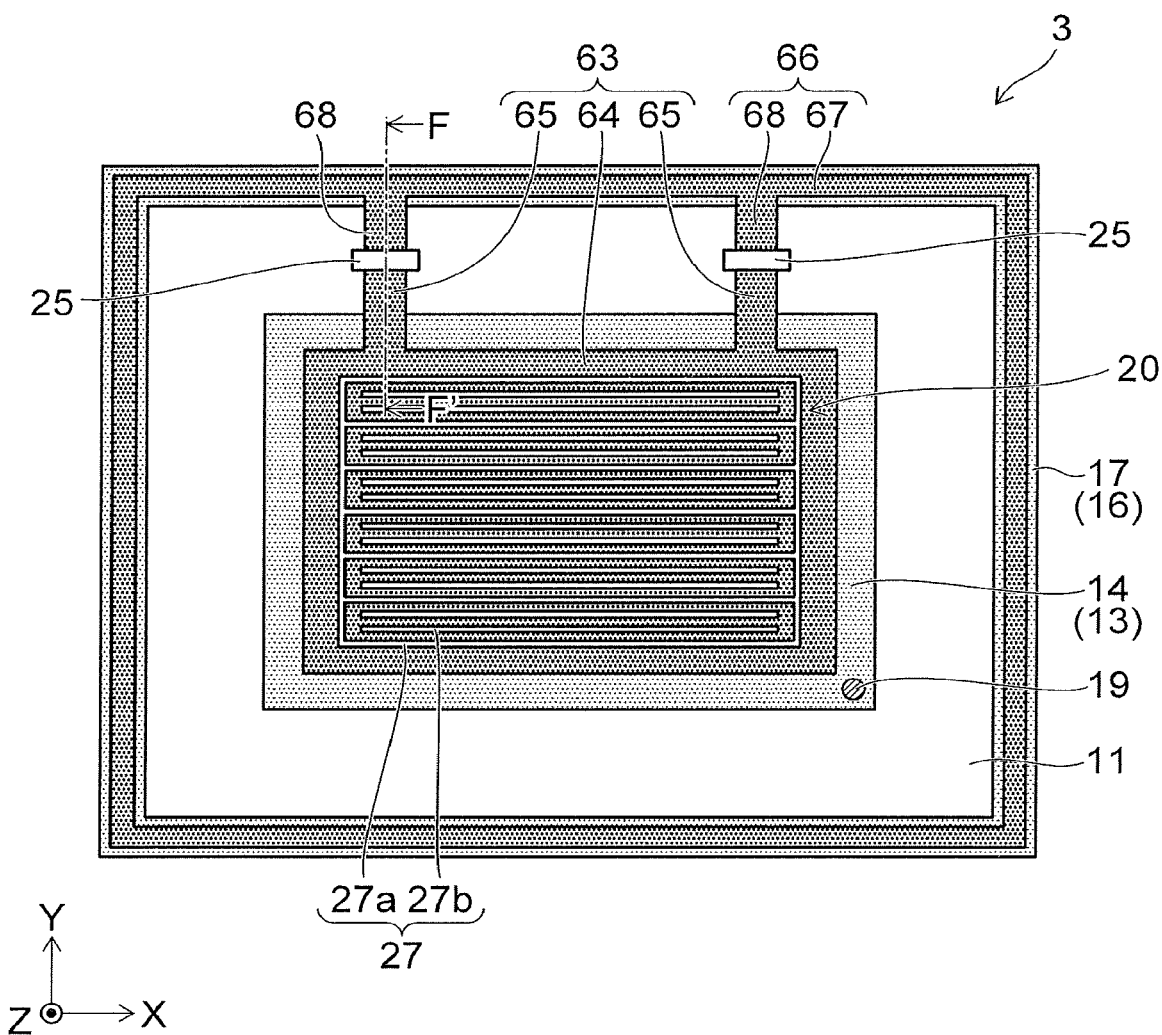
FIG. 24 is a plan view showing a semiconductor memory device according to a third embodiment.

FIG. 24 is a plan view showing a semiconductor memory device according to the embodiment.

Figure 25:
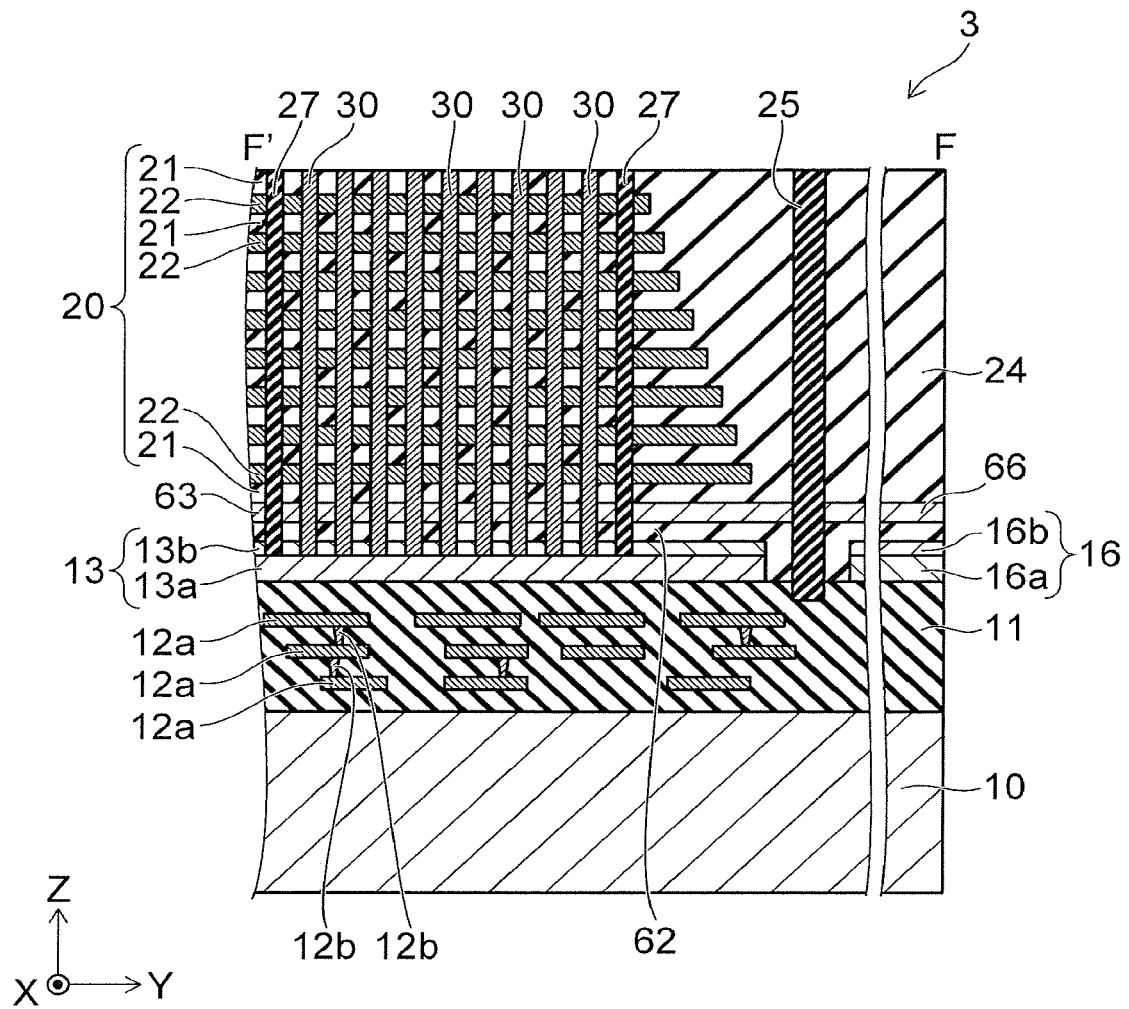
FIG. 25 is a cross-sectional view along line F-F' shown in FIG. 24.

FIG. 25 is a cross-sectional view along line F-F' shown in FIG. 24.

As shown in FIG. 24 and FIG. 25, the semiconductor memory device 3 according to the embodiment differs from the semiconductor memory device 2 according to the second embodiment described above (referring to FIG. 18 and FIG. 19) in that the frame-shaped portion 17 of the conductive film 16 is provided. The fine line portion 18 of the conductive film 16 (referring to FIG. 1) is not provided. Therefore, the conductive film 16 is separated from the insulating member 25.

In the method for manufacturing the semiconductor memory device according to the embodiment as shown in FIG. 8 and FIG. 9, the outer perimeter portion 43c, the lattice portion 43d, and the rectangular portion 43e are formed when forming the conductive film 43. However, the bridge portion 43f is not formed.

Otherwise, the configuration, the manufacturing method, and the effects of the embodiment are similar to those of the second embodiment described above.

Fourth Embodiment

A fourth embodiment will now be described.

Figure 26:
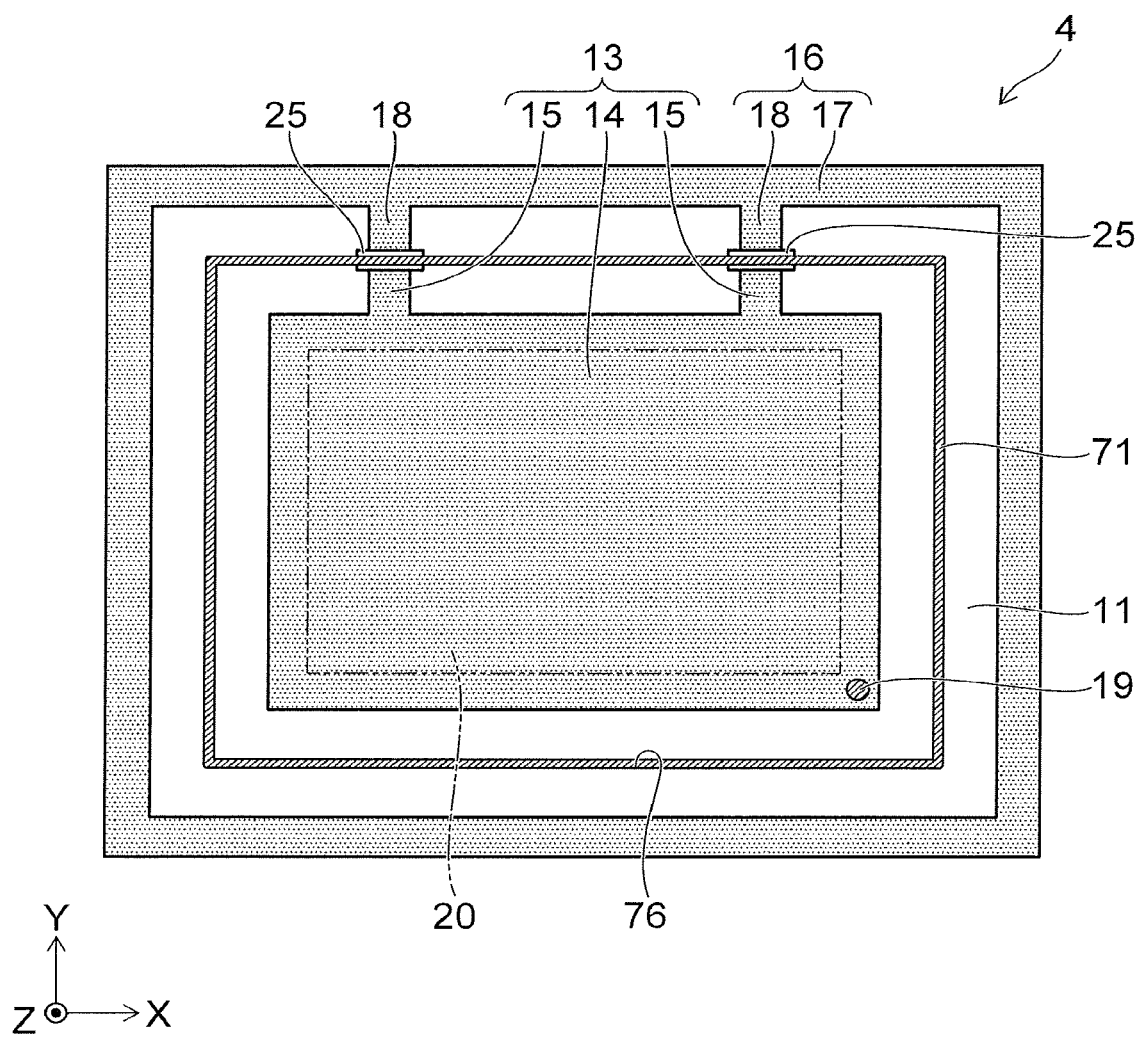
FIG. 26 is a plan view showing a semiconductor memory device according to a fourth embodiment.

FIG. 26 is a plan view showing a semiconductor memory device according to the embodiment.

Figure 27:
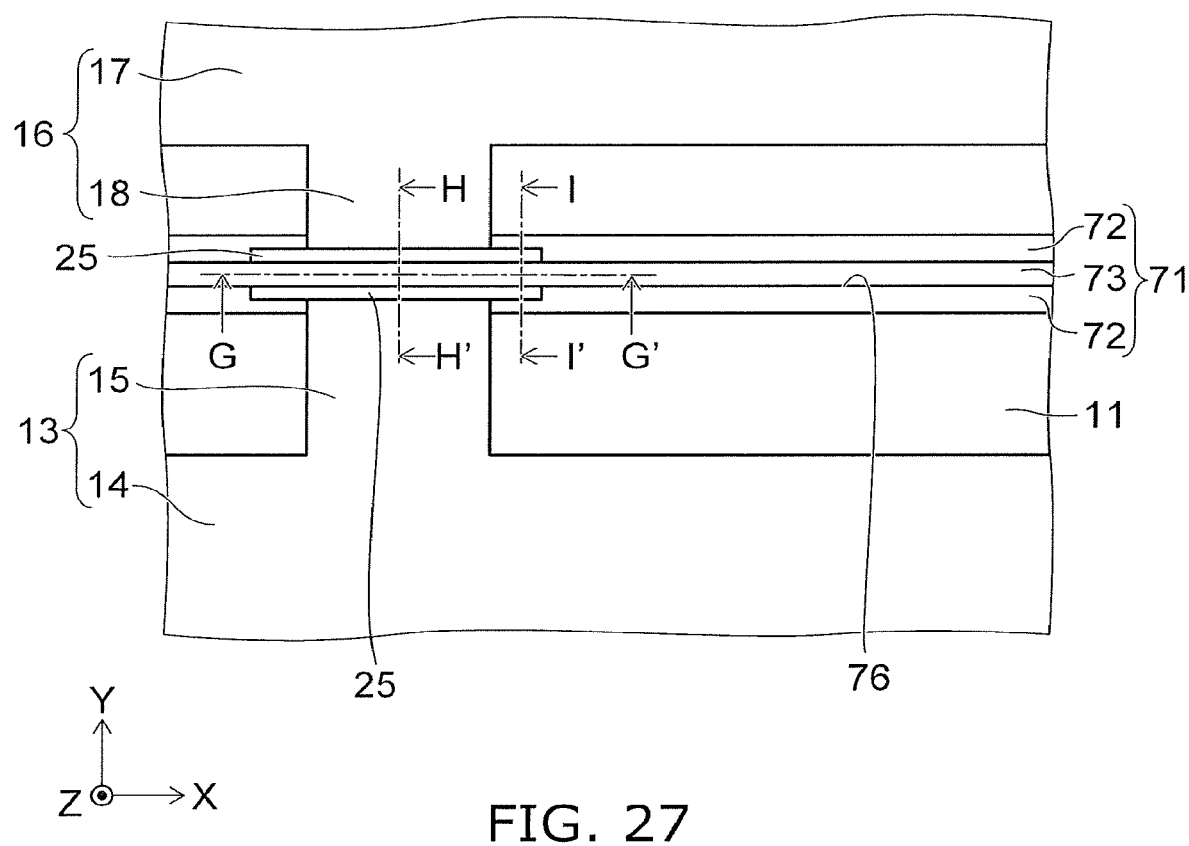
FIG. 27 is a partially enlarged view of FIG. 26.

FIG. 27 is a partially enlarged view of FIG. 26.

FIG. 28A is a cross-sectional view along line G-G' shown in FIG. 27; FIG. 28B is a cross-sectional view along line H-H' shown in FIG. 27; and FIG. 28C is a cross-sectional view along line I-I' shown in FIG. 27.

As shown in FIG. 26, the semiconductor memory device 4 according to the embodiment differs from the semiconductor memory device 1 according to the first embodiment described above (referring to FIG. 1) in that an edge seal 71 is provided. The edge seal 71 is provided from the upper surface of the silicon substrate 10 to the uppermost layer of the semiconductor memory device 4 and is a frame body made of a metal material surrounding the buried source film 13 and the stacked body 20 when viewed from the Z-direction. The edge seal 71 is insulated from the buried source film 13 and the electrode films 22 of the stacked body 20. For example, the edge seal 71 pierces the insulating member 25 along the X-direction.

As shown in FIG. 27 and FIG. 28A to FIG. 28C, a lower part 72 and an upper part 73 are provided in the edge seal 71. The lower end of the lower part 72 contacts the upper surface 10a of the silicon substrate 10; and the upper end of the lower part 72 contacts the lower end of the upper part 73.

The lower part 72 is made utilizing the formation processes of the interconnects 12a and the vias 12b and includes portions 72a corresponding to the interconnects 12a and portions 72b corresponding to the vias 12b; and the portions 72a and the portions 72b are connected in the Z-direction. Main portions (not illustrated) made of, for example, tungsten and barrier metal layers (not illustrated) made of (TiN/Ti) layers are provided in the portions 72a and the portions 72b. The barrier metal layer is provided on the lower surface of the main portion and on the side surface of the main portion. The configuration of the portion 72a and the configuration of the portion 72b are different from each other; for example, the length in the X-direction or the Y-direction of the portion 72a is longer than the length in the X-direction or the Y-direction of the portion 72b; and the length in the Z-direction of the portion 72a is shorter than the length in the Z-direction of the portion 72b. Therefore, an unevenness is formed in the side surface of the lower part 72. The upper part 73 does not have a configuration in which multiple types of portions are connected in the Z-direction as in the lower part 72, and includes a single portion. Therefore, the side surface of the upper part 73 extending in the Z-direction is substantially flat. The upper part 73 is formed of a main portion made of, for example, tungsten and a barrier metal layer made of a (TiN/Ti) layer. The barrier metal layer is provided on the lower surface of the main portion and on the side surface of the main portion.

Protruding portions 73a of the lower surface of the upper part 73 of the edge seal 71 are provided to protrude downward in the region of the two X-direction sides of the region directly under the region between the fine line portion 15 and the fine line portion 18. The protruding portions 73a encroach the lower part 72.

A method for manufacturing the semiconductor memory device according to the embodiment will now be described.

FIG. 29A to FIG. 32C are cross-sectional views showing the method for manufacturing the semiconductor memory device according to the embodiment.

FIG. 29A, FIG. 30A, FIG. 31A, and FIG. 32A show cross sections corresponding to FIG. 28A; FIG. 29B, FIG. 30B, FIG. 31B, and FIG. 32B show cross sections corresponding to FIG. 28B; and FIG. 29C, FIG. 30C, FIG. 31C, and FIG. 32C show cross sections corresponding to FIG. 28C.

First, the inter-layer insulating film 11 that includes the interconnects 12a and the vias 12b is formed on the silicon wafer 10w by implementing processes similar to the processes shown in FIG. 7 to FIG. 10. At this time, in the processes of forming the interconnects 12a, the portions 72a are formed along the dicing line 41 in the interior of the chip region 42; and in the processes of forming the vias 12b, the portions 72b are formed along the dicing line 41 in the interior of the chip region 42. Thereby, the lower part 72 of the edge seal 71 is formed in the inter-layer insulating film 11.

Then, the conductive film 43 is formed on the inter-layer insulating film 11.

As shown in FIG. 29A to FIG. 29C, the conductive film 43 is disposed on the lower part 72 of the edge seal 71 to be separated from the lower part 72.

Then, processes similar to the processes shown in FIG. 11 to FIG. 16 are implemented. Thereby, the stacked body 20 and the inter-layer insulating film 24 are formed on the conductive film 43; and the silicon pillars 30, the electrode films 22, the insulating members 27, etc., are formed in the stacked body 20. The positive charge that accumulates as the memory holes MH are formed is discharged outside the intermediate structure body 50 via the conductive film 43.

Then, as shown in FIG. 30A to FIG. 30C, the hole 55 is formed in the inter-layer insulating film 24 to straddle the bridge portion 43f of the conductive film 43 in the X-direction. At this time, the bridge portion 43f is exposed at the bottom surface of the hole 55. The upper part of the inter-layer insulating film 11 is etched and recesses 55a are formed on the two X-direction sides of the bridge portion 43f at the bottom surface of the hole 55 where the etching is not stopped by the bridge portion 43f. The lower part 72 is exposed at the bottom surfaces of the recesses 55a.

Figures 31A, 31B, 31C:
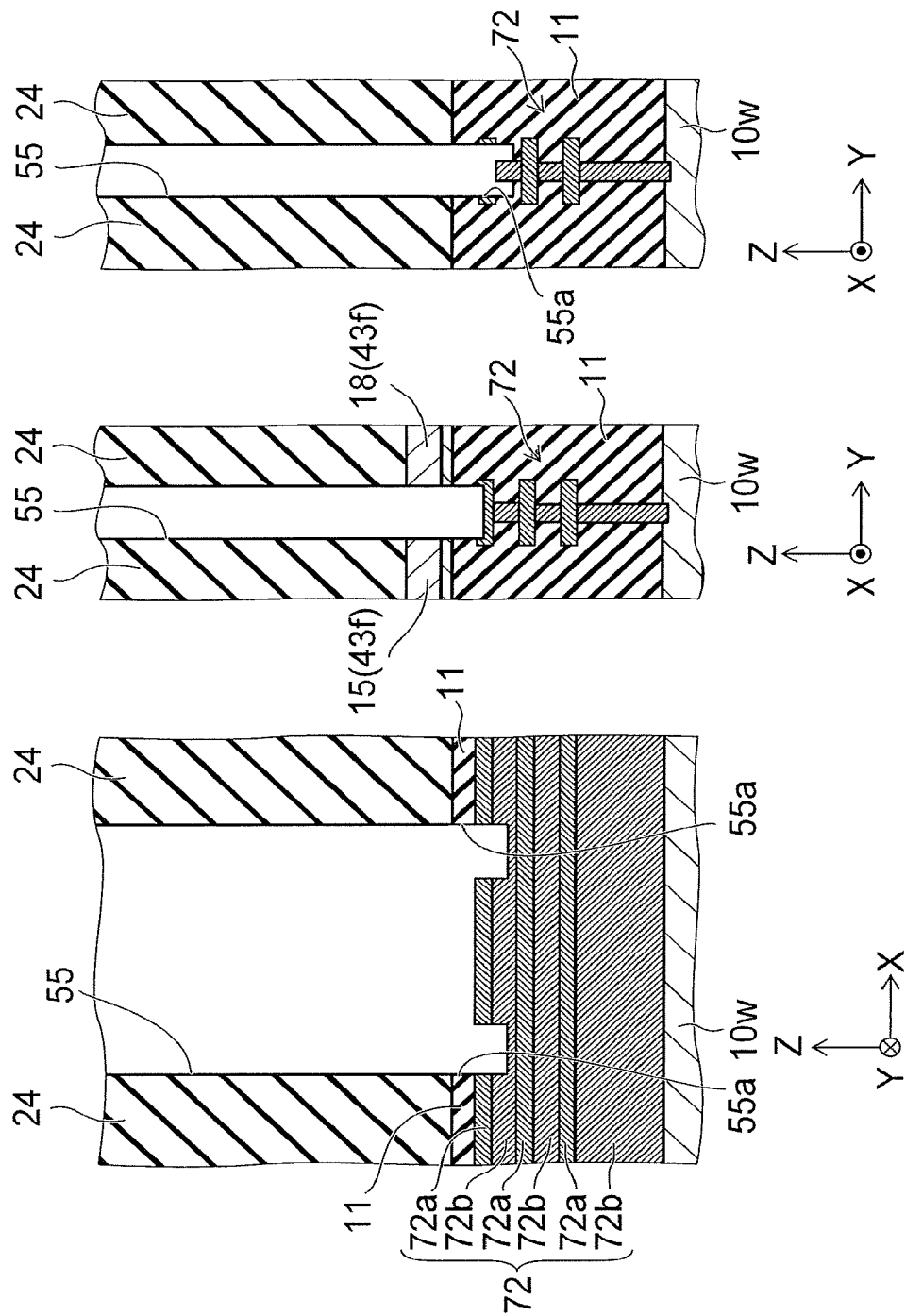

Then, as shown in FIG. 31A to FIG. 31C, the bottom surface of the hole 55 is etched further. Thereby, the bridge portion 43f is divided by the hole 55. As a result, the bridge portion 43f of the conductive film 43 is divided into the fine line portion 15 of the buried source film 13 and the fine line portion 18 of the conductive film 16. Also, the recesses 55a penetrate into the lower part 72. A portion of the inter-layer insulating film 11 may remain at the bottom surface of the hole 55.

Then, as shown in FIG. 32A to FIG. 32C, the insulating member 25 is filled into the hole 55 by depositing, for example, silicon oxide. At this time, similarly to the first embodiment described above, there are also cases where the seam and the void are formed in the insulating member 25.

Then, as shown in FIG. 26, FIG. 27, and FIG. 28A to FIG. 28C, a trench 76 that has a frame-like configuration is formed in the inter-layer insulating film 24 to surround the buried source film 13. The trench 76 divides the insulating member 25; and in the case where a portion of the inter-layer insulating film 11 remains at the bottom surface of the hole 55, the trench 76 also divides the portion of the inter-layer insulating film 11. Then, a barrier metal layer (not illustrated) that is made of, for example, titanium and titanium nitride is formed on the inner surface of the trench 76; then, a metal material such as, for example, tungsten or the like is filled into the trench 76 with the barrier metal layer interposed. Thereby, the upper part 73 is formed. The upper part 73 contacts the lower part 72. The edge seal 71 includes the lower part 72 and the upper part 73. Thus, the semiconductor memory device 4 according to the embodiment is manufactured.

Effects of the embodiment will now be described.

According to the embodiment, by providing the edge seal 71 between the end surface of the semiconductor memory device 4 and the stacked body 20, the penetration of moisture into the interior of the semiconductor memory device 4 when dicing can be suppressed.

Also, according to the embodiment, the conductive film 43 is divided in the process of forming the edge seal 71 as shown in FIG. 31A to FIG. 31C; therefore, the dedicated processes for dividing the conductive film 43 do not increase much; and the manufacturing cost is low.

Otherwise, the configuration, the manufacturing method, and the effects of the embodiment are similar to those of the first embodiment described above.

Fifth Embodiment

A fifth embodiment will now be described.

Figure 33:
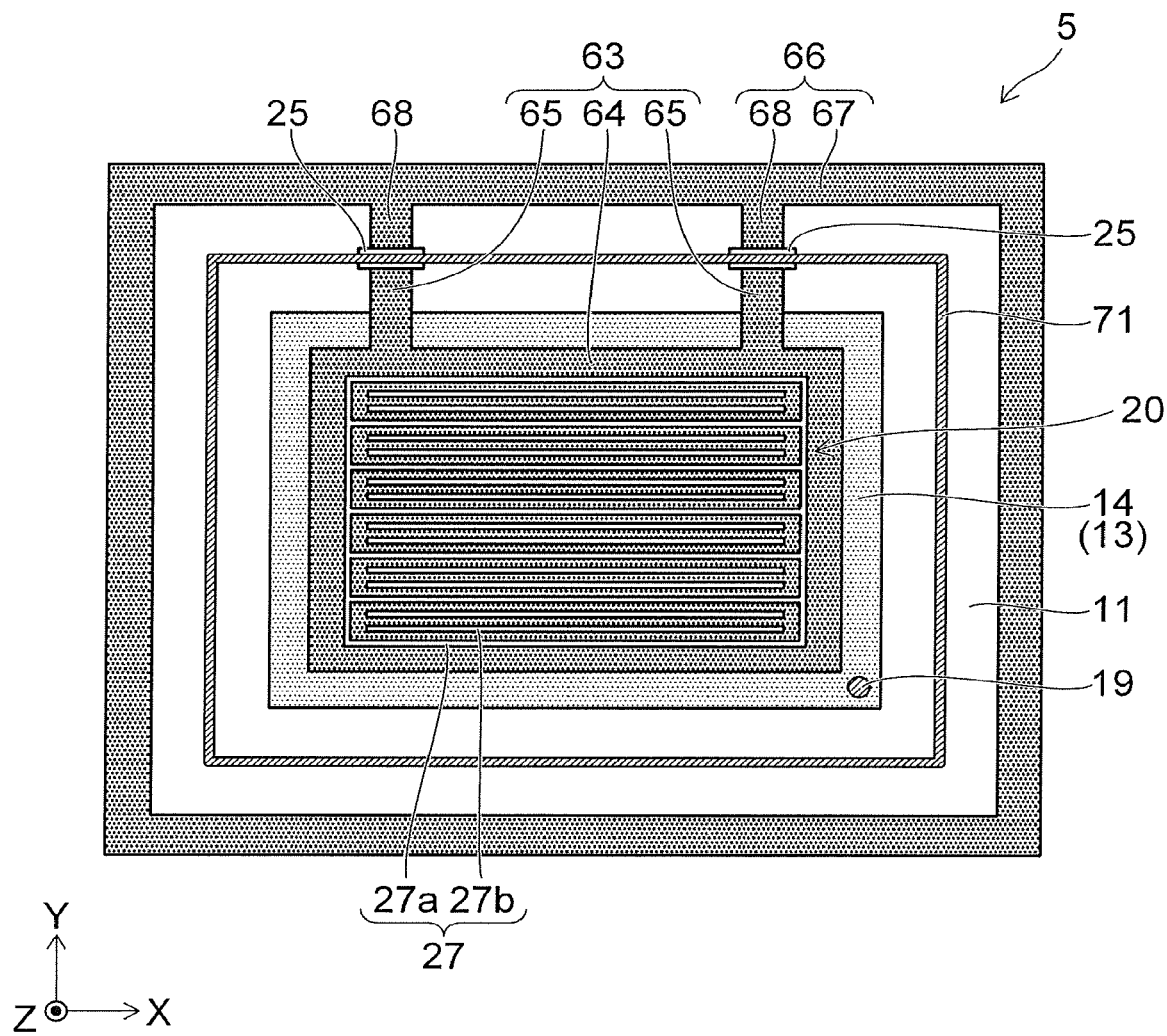
FIG. 33 is a plan view showing a semiconductor memory device according to a fifth embodiment.

FIG. 33 is a plan view showing a semiconductor memory device according to the embodiment.

Figure 34:
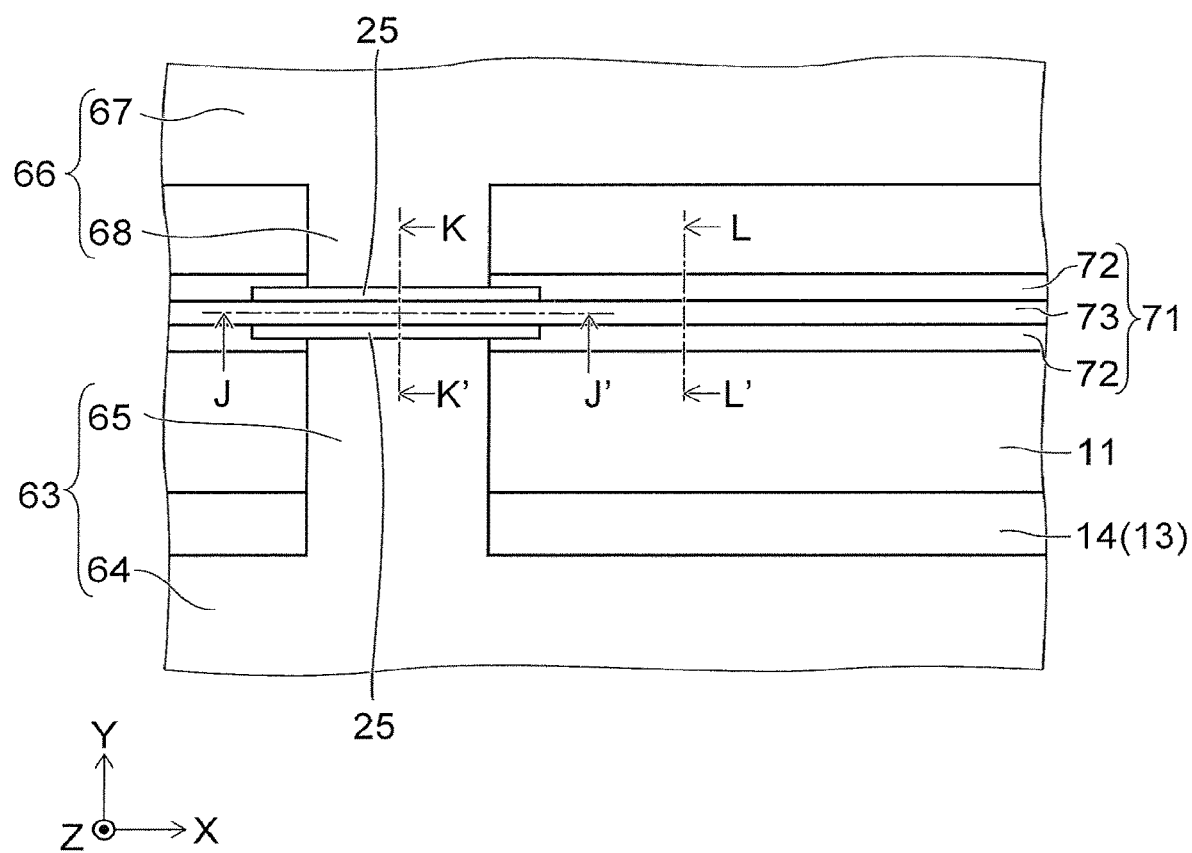
FIG. 34 is a partially enlarged view of FIG. 33.

FIG. 34 is a partially enlarged view of FIG. 33.

FIG. 35A is a cross-sectional view along line J-J' shown in FIG. 34; FIG. 35B is a cross-sectional view along line K-K' shown in FIG. 34; and FIG. 35C is a cross-sectional view along line L-L' shown in FIG. 34.

The embodiment is an example in which the second embodiment and the fourth embodiment described above are combined. In other words, the positive charge that accumulates as the memory holes MH are formed is discharged via the polysilicon film 69 in the semiconductor memory device in which the edge seal 71 is provided.

As shown in FIG. 33, FIG. 34, and FIG. 35A to FIG. 35C, the semiconductor memory device 5 according to the embodiment differs from the semiconductor memory device 2 according to the second embodiment described above (referring to FIG. 18) in that the edge seal 71 is provided. The configuration of the edge seal 71 is as described in the fourth embodiment.

Effects of the embodiment will now be described.

According to the embodiment, by providing the edge seal 71, the penetration of moisture when dicing can be suppressed.

Also, the bridge portion 69f of the polysilicon film 69 (referring to FIG. 22) is divided in the process of forming the edge seal 71; therefore, the dedicated processes for dividing the polysilicon film 69 do not increase much; and the manufacturing cost is low.

Otherwise, the configuration, the manufacturing method, and the effects of the embodiment are similar to those of the second embodiment described above.

Sixth Embodiment

A sixth embodiment will now be described.

Figure 36:
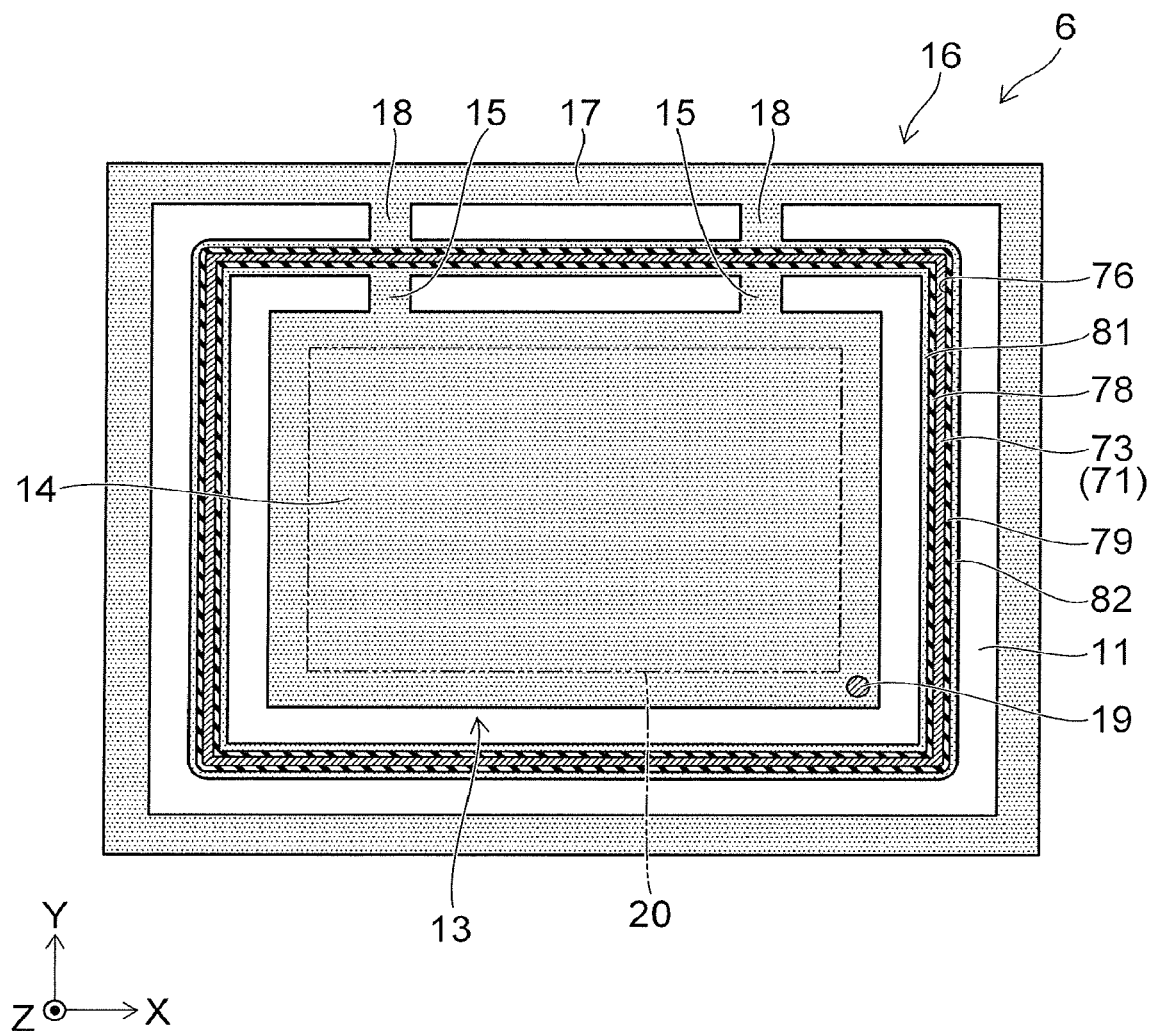
FIG. 36 is a plan view showing a semiconductor memory device according to a sixth embodiment.

FIG. 36 is a plan view showing a semiconductor memory device according to the embodiment.

Figure 37:
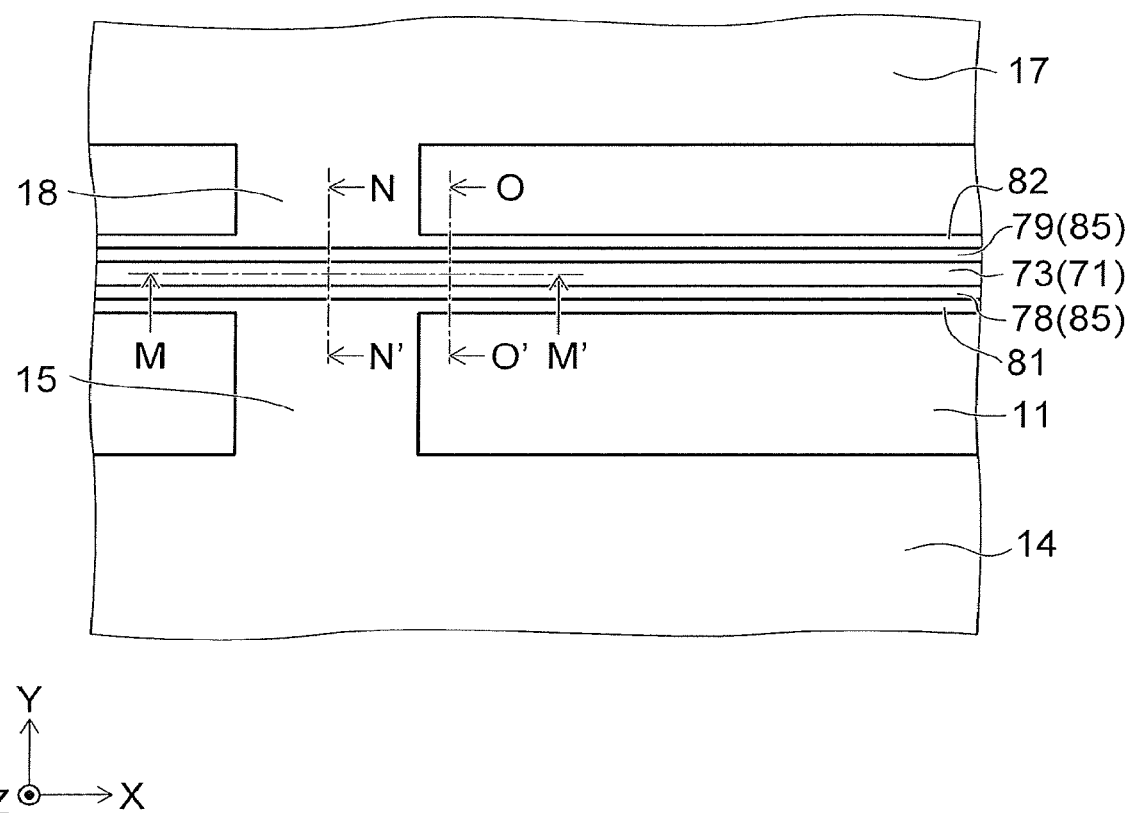
FIG. 37 is a partially enlarged view of FIG. 36.

FIG. 37 is a partially enlarged view of FIG. 36.

Figure 38:
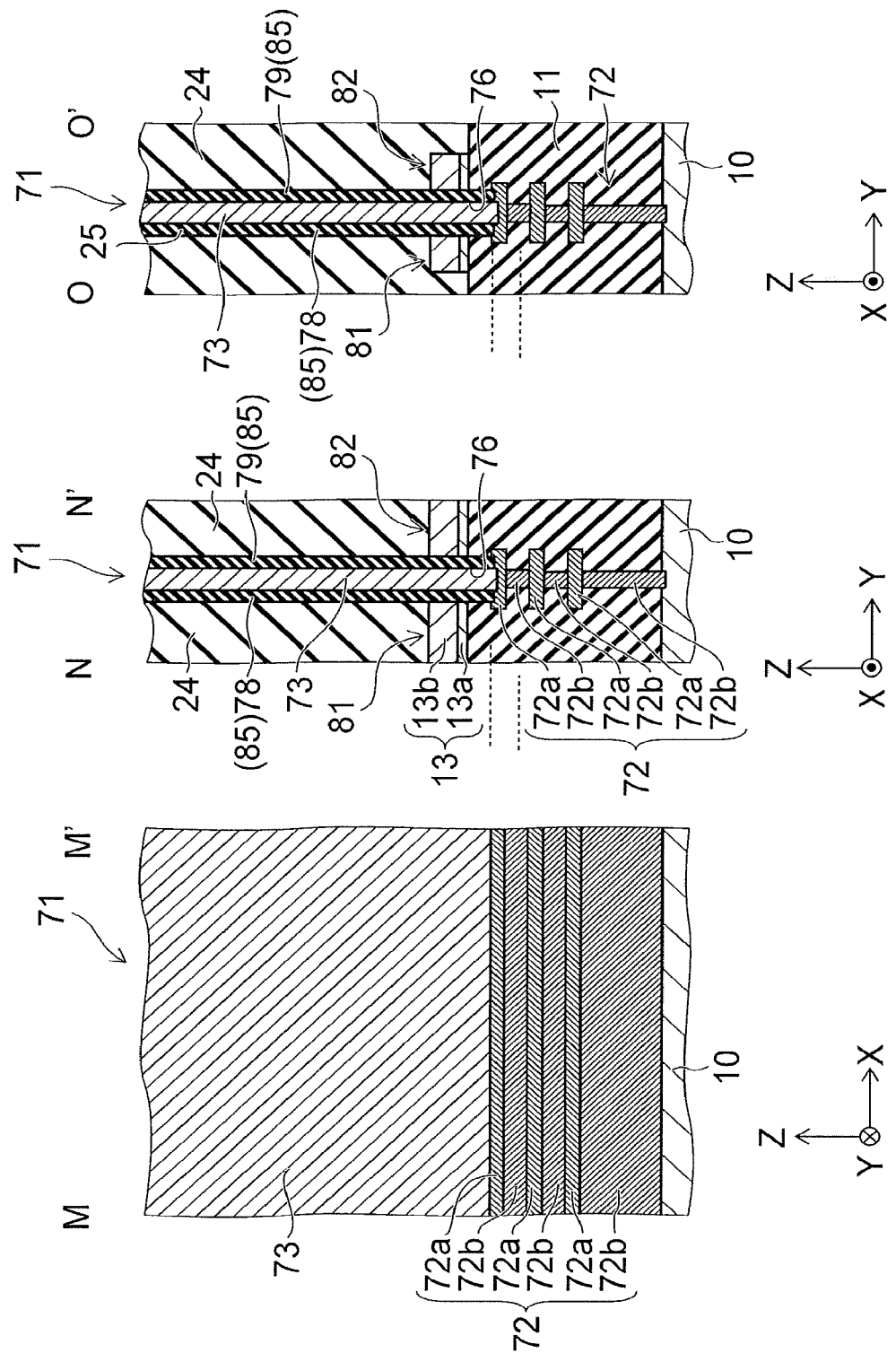
FIG. 38A is a cross-sectional view along line M-M' shown in FIG. 37.
FIG. 38B is a cross-sectional view along line N-N' shown in FIG. 37.
FIG. 38C is a cross-sectional view along line O-O' shown in FIG. 37.

FIG. 38A is a cross-sectional view along line M-M' shown in FIG. 37; FIG. 38B is a cross-sectional view along line N-N' shown in FIG. 37; and FIG. 38C is a cross-sectional view along line O-O' shown in FIG. 37.

As shown in FIG. 36, FIG. 37, and FIG. 38A to FIG. 38C, the semiconductor memory device 6 according to the embodiment differs from the semiconductor memory device 4 according to the fourth embodiment described above (referring to FIG. 26, FIG. 27, and FIG. 28A to FIG. 28C) in that an insulating film 78 and an insulating film 79 are provided instead of the insulating member 25; a frame-shaped portion 81 is provided in the buried source film 13; a frame-shaped portion 82 is provided in the conductive film 16; and the protruding portions 73a are not provided in the lower surface of the upper part 73 of the edge seal 71.

The insulating film 78 is provided on the inner surface of the edge seal 71 and contacts the edge seal 71. The insulating film 79 is provided on the outer surface of the edge seal 71 and contacts the edge seal 71. In other words, the edge seal 71 is interposed between the insulating film 78 and the insulating film 79.

The frame-shaped portion 81 is provided on the inner surface side of the edge seal 71 and contacts the insulating film 78. The frame-shaped portion 82 is provided on the outer surface side of the edge seal 71 and contacts the insulating film 79. In other words, the structure body that is made of the edge seal 71, the insulating film 78, and the insulating film 79 is interposed between the frame-shaped portion 81 and the frame-shaped portion 82.

A method for manufacturing the semiconductor memory device according to the embodiment will now be described.

Figure 39:
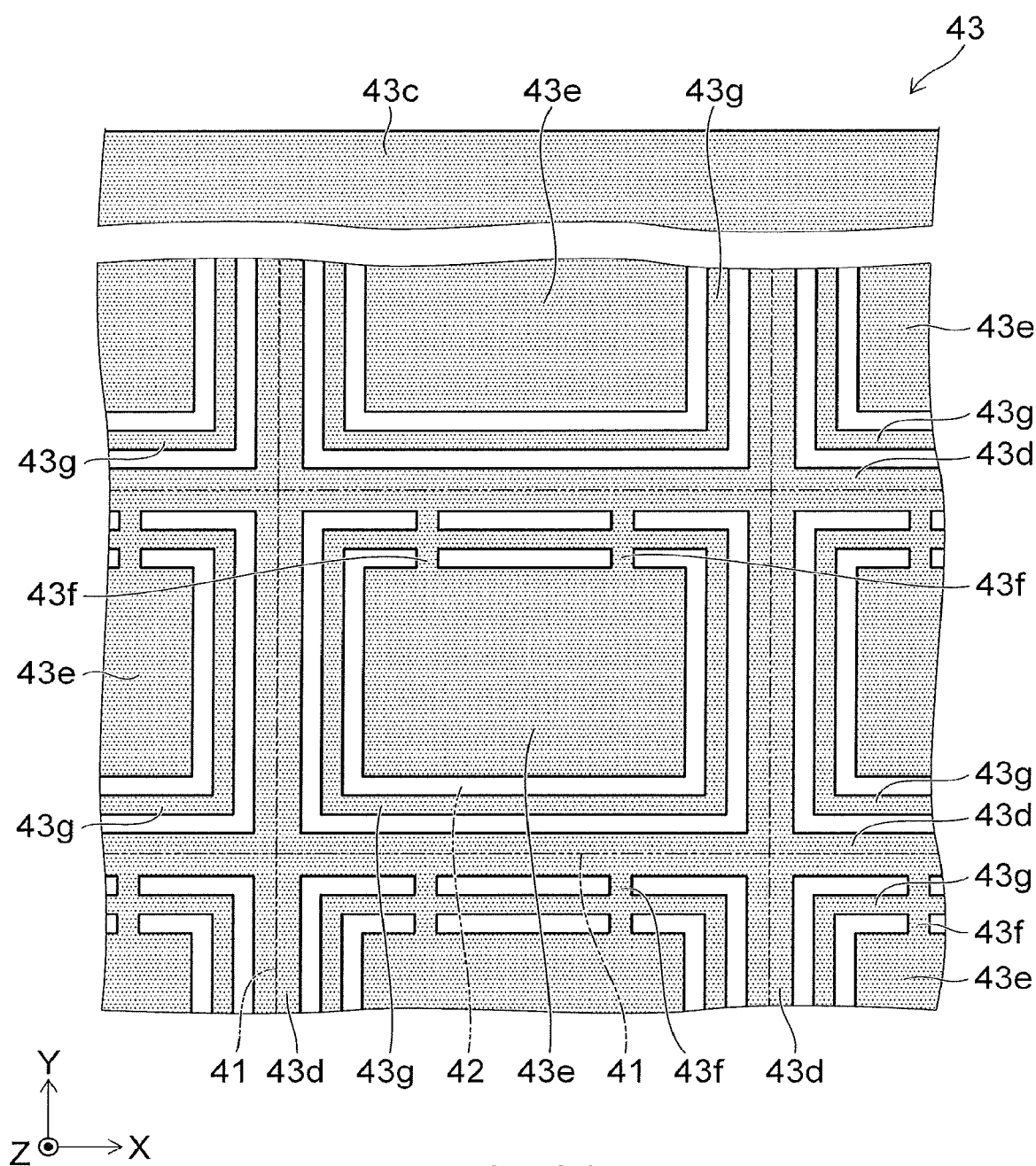
FIG. 39 is a plan view showing a method for manufacturing the semiconductor memory device according to the sixth embodiment.

FIG. 39 is a plan view showing the method for manufacturing the semiconductor memory device according to the embodiment.

FIG. 40A to FIG. 43C are cross-sectional view showing the method for manufacturing the semiconductor memory device according to the embodiment.

FIG. 40A, FIG. 41A, FIG. 42A, and FIG. 43A show cross sections corresponding to FIG. 38A; FIG. 40B, FIG. 41B, FIG. 42B, and FIG. 43B show cross sections corresponding to FIG. 38B; and FIG. 40C, FIG. 41C, FIG. 42C, and FIG. 43C show cross sections corresponding to FIG. 38C.

First, as shown in FIG. 40A to FIG. 40C, the inter-layer insulating film 11 that includes the interconnects 12a, the portions 72a, the vias 12b, and the portions 72b is formed on the silicon wafer 10w. The lower part 72 of the edge seal 71 is formed of the portions 72a and the portions 72b in the inter-layer insulating film 11.

Then, as shown in FIG. 39 and FIG. 40A to FIG. 40C, the conductive film 43 is formed on the inter-layer insulating film 11. At this time, a frame-shaped portion 43g is formed in the conductive film 43 in addition to the outer perimeter portion 43c, the lattice portion 43d, the rectangular portion 43e, and the bridge portion 43f. The configuration of the frame-shaped portion 43g is set to be a frame-like configuration surrounding the rectangular portion 43e and is disposed between the rectangular portion 43e and the lattice portion 43d. The frame-shaped portion 43g crosses the bridge portion 43f. The conductive film 43 is disposed to be separated from the lower part 72 above the lower part 72 of the edge seal 71.

Then, processes similar to the processes shown in FIG. 11 to FIG. 16 are implemented. Thereby, the stacked body 20 and the inter-layer insulating film 24 are formed on the conductive film 43; and the silicon pillars 30, the electrode films 22, the insulating members 27, etc., are formed in the stacked body 20. The positive charge that accumulates as the memory holes MH are formed is discharged via the conductive film 43.

Then, as shown in FIG. 41A to FIG. 41C, a trench 83 is formed in the region of the inter-layer insulating film 24 directly above the frame-shaped portion 43g of the conductive film 43. When viewed from the Z-direction, the trench 83 is formed in a frame-like configuration surrounding the stacked body 20 (referring to FIG. 36). The frame-shaped portion 43g of the conductive film 43 is exposed at the bottom surface of the trench 83.

Then, as shown in FIG. 42A to FIG. 42C, the bottom surface of the trench 83 is etched further. Thereby, the bridge portion 43f is divided by the trench 83. As a result, the bridge portion 43f of the conductive film 43 is divided into the fine line portion 15 of the buried source film 13 and the fine line portion 18 of the conductive film 16. At this time, the frame-shaped portion 43g of the conductive film 43 also is divided into two. Of the two portions formed by dividing the frame-shaped portion 43g, the portion that is disposed on the inner side becomes the frame-shaped portion 81 of the buried source film 13; and the portion that is disposed on the outer side becomes the frame-shaped portion 82 of the conductive film 16.

Figures 43A, 43B, 43C:
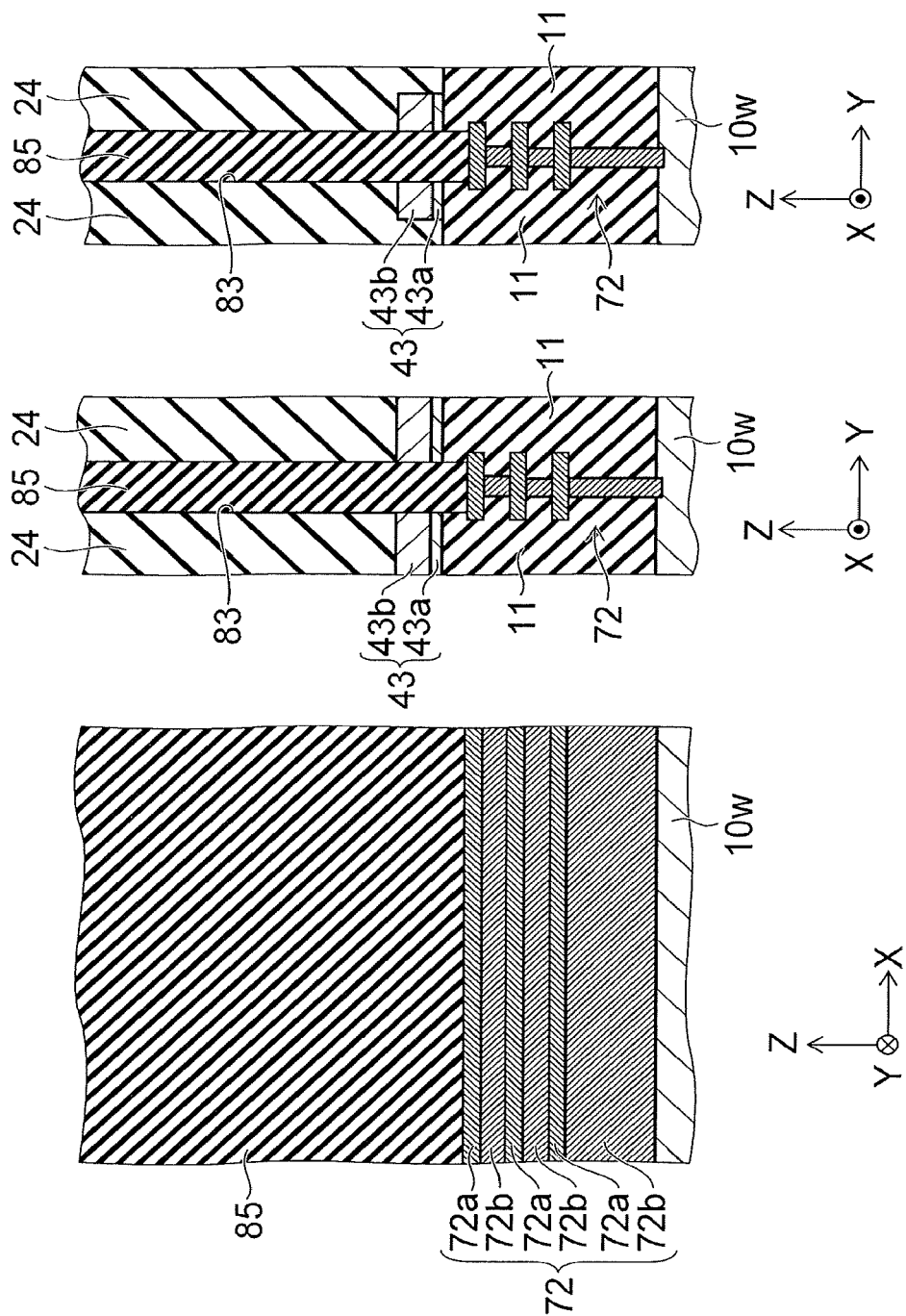

Then, as shown in FIG. 43A to FIG. 43C, an insulating member 85 is filled into the trench 83 by depositing, for example, silicon oxide.

Then, as shown in FIG. 36 and FIG. 38A to FIG. 38C, the trench 76 that has the frame-like configuration is formed in the insulating member 85. The insulating member 85 is divided into two by the trench 76. Of the two portions formed by dividing the insulating member 85, the portion that is disposed on the inner side becomes the insulating film 78; and the portion that is disposed on the outer side becomes the insulating film 79.

Then, a barrier metal layer that is made of, for example, titanium and titanium nitride is formed on the inner surface of the trench 76; and a metal material such as tungsten or the like is filled into the trench 76 with the barrier metal layer interposed. Thereby, the upper part 73 of the edge seal 71 is formed. Thus, the semiconductor memory device 6 according to the embodiment is manufactured.

Effects of the embodiment will now be described.

According to the embodiment, by covering the two surfaces of the edge seal 71 with the insulating film 78 and the insulating film 79, the edge seal 71 can be insulated reliably from the other conductive members.

Also, as shown in FIG. 42A to FIG. 42C, the productivity is high because the bridge portion 43f is divided into the fine line portion 15 and the fine line portion 18 in the process of forming the trench 83; and the insulating member 85 is divided into the insulating film 78 and the insulating film 79 in the process of forming the trench 76 as shown in FIG. 38A to FIG. 38C.

Otherwise, the configuration, the manufacturing method, and the effects of the embodiment are similar to those of the first embodiment described above.

Seventh Embodiment

A seventh embodiment will now be described.

Figure 44:
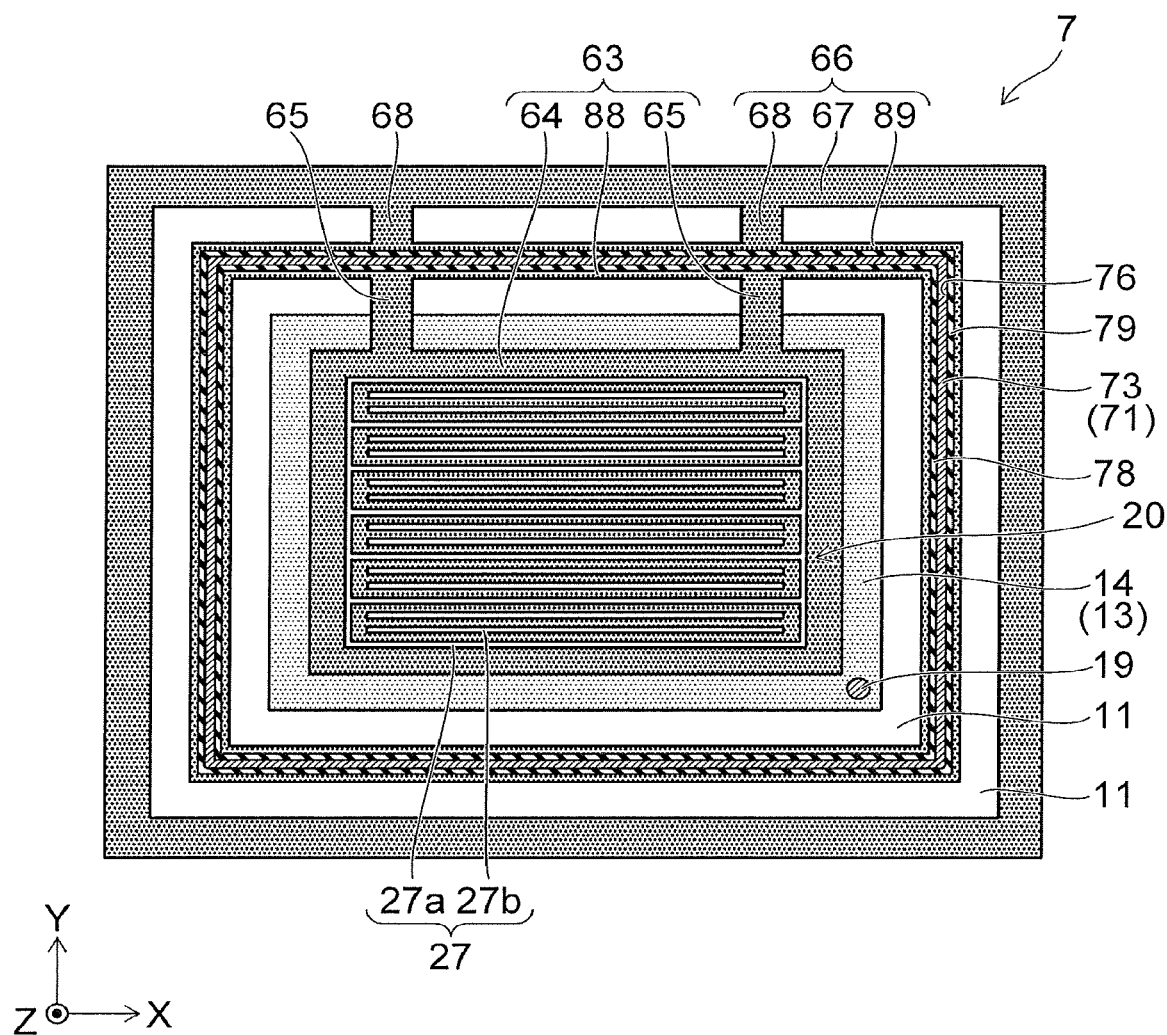
FIG. 44 is a plan view showing a semiconductor memory device according to a seventh embodiment.

FIG. 44 is a plan view showing a semiconductor memory device according to the embodiment.

Figure 45:
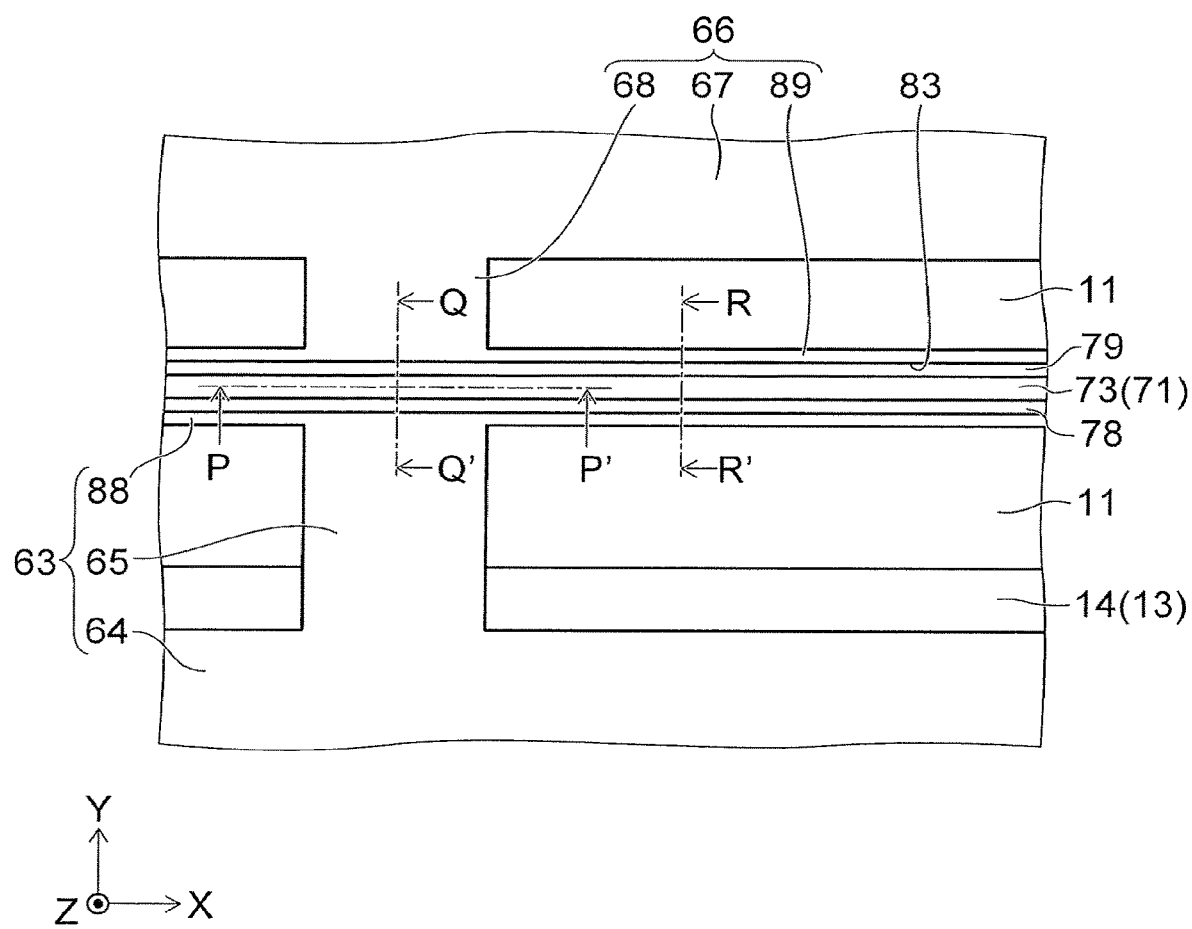
FIG. 45 is a partially enlarged view of FIG. 44.

FIG. 45 is a partially enlarged view of FIG. 44.

FIG. 46A is a cross-sectional view along line P-P' shown in FIG. 45; FIG. 46B is a cross-sectional view along line Q-Q' shown in FIG. 45; and FIG. 46C is a cross-sectional view along line R-R' shown in FIG. 45.

The embodiment is an example in which the second embodiment and the sixth embodiment described above are combined. In other words, the positive charge that accumulates as the memory holes MH are formed is discharged via the polysilicon film 69 in the semiconductor memory device in which the insulating film 78 and the insulating film 79 are provided on the two side surfaces of the edge seal 71.

As shown in FIG. 44, FIG. 45, and FIG. 46A to FIG. 46C, the semiconductor memory device 7 according to the embodiment differs from the semiconductor memory device 2 according to the second embodiment described above (referring to FIG. 18) in that the edge seal 71, the insulating film 78, and the insulating film 79 are provided; a frame-shaped portion 88 is provided in the polysilicon film 63; and a frame-shaped portion 89 is provided in the polysilicon film 66. The configurations of the edge seal 71, the insulating film 78, and the insulating film 79 are as described in the sixth embodiment. The frame-shaped portion 88 is provided on the inner surface side of the edge seal 71 and contacts the insulating film 78. The frame-shaped portion 89 is provided on the outer surface side of the edge seal 71 and contacts the insulating film 79.

A method for manufacturing the semiconductor memory device according to the embodiment will now be described.

Figure 47:
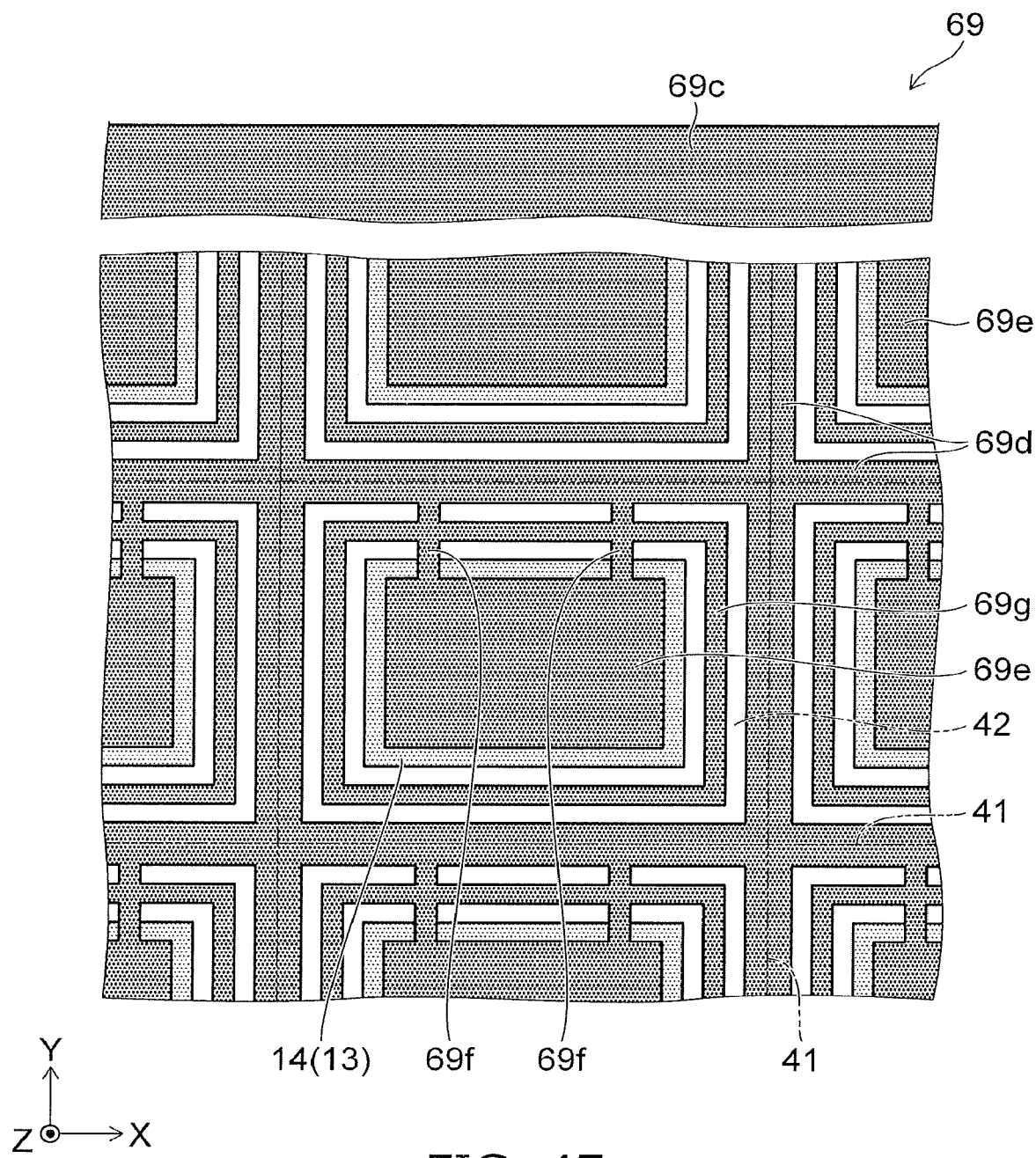
FIG. 47 is a plan view showing a method for manufacturing the semiconductor memory device according to the seventh embodiment.

FIG. 47 is a plan view showing the method for manufacturing the semiconductor memory device according to the embodiment.

First, as shown in FIG. 44, FIG. 45, and FIG. 46A to FIG. 46C, the inter-layer insulating film 11 that includes the interconnects 12a and the vias 12b is formed on the silicon wafer 10w. The lower part 72 of the edge seal 71 is formed in the inter-layer insulating film 11.

Then, as shown in FIG. 47, the buried source film 13 is formed in each of the chip regions 42 on the inter-layer insulating film 11. In the buried source film 13, only the main portion 14 is formed; and the fine line portion 15 (referring to FIG. 1) is not formed. Also, the conductive film 16 (referring to FIG. 1) is not formed. Then, the insulating film 62 is formed; and the polysilicon film 69 is formed on the insulating film 62. A frame-shaped portion 69g is formed in the polysilicon film 69 in addition to the outer perimeter portion 69c, the lattice portion 69d, the rectangular portion 69e, and the bridge portion 69f. The configuration of the frame-shaped portion 69g is set to be a frame-like configuration surrounding the rectangular portion 69e and is disposed between the rectangular portion 69e and the lattice portion 69d. The frame-shaped portion 69g crosses the bridge portion 69f.

Then, the stacked body 20 (referring to FIG. 44) and the inter-layer insulating film 24 are formed on the polysilicon film 69. The silicon pillars 30, etc. (referring to FIG. 20) are formed in the stacked body 20. The positive charge that accumulates when forming the memory holes MH is discharged via the polysilicon film 69.

Then, as shown in FIG. 44, FIG. 45, FIG. 46A to FIG. 46C, and FIG. 47, RIE is performed using conditions such that the etching rate of silicon oxide and the etching rate of silicon nitride are higher than the etching rate of silicon. Thereby, the slits ST (referring to FIG. 23) are formed in the stacked body 20; and the trench 83 that has the frame-like configuration is formed in the region of the inter-layer insulating film 24 directly above the frame-shaped portion 69g of the polysilicon film 69. The rectangular portion 69e of the polysilicon film 69 is exposed at the bottom surfaces of the slits ST; and the frame-shaped portion 69g is exposed at the bottom surface of the trench 83.

Then, the slits ST and the trench 83 are caused to pierce the polysilicon film 69 by performing RIE using conditions such that silicon can be etched. At this time, the lower part 72 of the edge seal 71 is exposed at the bottom surface of the trench 83. Thereby, the frame-shaped portion 69g of the polysilicon film 69 is divided by the trench 83. Of the two portions formed by dividing the frame-shaped portion 69g, the portion that is disposed on the inner side becomes the frame-shaped portion 88 of the polysilicon film 63; and the portion that is disposed on the outer side becomes the frame-shaped portion 89 of the polysilicon film 66.

Then, the insulating members 27 (referring to FIG. 19) are filled into the slits ST, and the insulating member 85 is filled into the trench 83 by depositing, for example, silicon oxide. Then, the trench 76 that has the frame-like configuration is formed in the insulating member 85. The insulating member 85 is divided into the insulating film 78 and the insulating film 79 by the trench 76. Then, a metal material such as, for example, titanium, titanium nitride, tungsten, or the like is filled into the trench 76. Thereby, the upper part 73 of the edge seal is formed. Thus, the semiconductor memory device 7 according to the embodiment is manufactured.

Effects of the embodiment will now be described.

According to the embodiment, the penetration of moisture when dicing can be suppressed by providing the edge seal 71, the insulating film 78, and the insulating film 79.

Also, the slits ST (referring to FIG. 23) and the trench 83 can be formed in the same process because the etching can be performed using the polysilicon film 69 as the stopper film. Also, the polysilicon film 69 can be divided by the trench 83. Therefore, the productivity is high.

Otherwise, the configuration, the manufacturing method, and the effects of the embodiment are similar to those of the second embodiment described above.

According to the embodiments described above, a semiconductor memory device in which a hole having a high aspect ratio is formed, and a method for manufacturing the semiconductor memory device can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A semiconductor memory device, comprising:
   a semiconductor substrate;
   a first insulating film provided above the semiconductor substrate;
   a first conductive film provided above the first insulating film;
   a plurality of first electrode films provided above the first conductive film and stacked to be separated from each other;
   a semiconductor member extending in a stacking direction of the plurality of first electrode films; and
   a charge storage member provided between the semiconductor member and one of the plurality of first electrode films, wherein
   the first conductive film includes
      a main portion disposed at least directly below the plurality of first electrode films, and
      a fine line portion extending from the main portion toward an end surface side of the semiconductor substrate, a width of the fine line portion being narrower than a width of the main portion.

2. The device according to claim 1, further comprising
a second conductive film provided above the first insulating film and separated from the first conductive film, and
a side surface of the second conductive film extending in a direction toward the fine line portion and being positioned on an extension plane of a side surface of the fine line portion, the side surface of the fine line portion extending in a direction toward the second conductive film.

3. The device according to claim 2, further comprising a third conductive film surrounding the first conductive film and being provided along the end surface of the semiconductor substrate above the first insulating film, the second conductive film being connected to the third conductive film at a central side of the semiconductor substrate.

4. The device according to claim 1, wherein
the first conductive film includes:
a metal layer; and
a silicon layer stacked with the metal layer, and
a lower end of the semiconductor member is connected to the first conductive film.

5. The device according to claim 1, further comprising
a second electrode film provided between the first insulating film and the first conductive film,
the first conductive film containing silicon, and
a lower end of the semiconductor member being connected to the second electrode film.

6. The device according to claim 5, wherein
the second electrode film includes:
a metal layer; and
a silicon layer stacked with the metal layer.

7. The device according to claim 1, further comprising:
a second insulating film provided above the first insulating film at a periphery of the plurality of first electrode films; and
an insulating member provided in the second insulating film, the insulating member contacting a tip surface of the fine line portion.

8. The device according to claim 1, further comprising a frame body surrounding the first conductive film and the plurality of first electrode films, being provided on the semiconductor substrate, being insulated from the first conductive film and the plurality of first electrode films, and being made of a metal material.

9. The device according to claim 8, further comprising:
a second conductive film provided above the first insulating film and separated from the frame body, the frame body being disposed between the first conductive film and the second conductive film;
a third insulating film provided between the frame body and the fine line portion; and
a fourth insulating film provided between the frame body and the second conductive film.

10. The device according to claim 9, further comprising:
a fourth conductive film surrounding the main portion, being provided above the first insulating film, being connected to the fine line portion, and contacting the third insulating film; and
a fifth conductive film surrounding the fourth conductive film, being provided above the first insulating film, being arranged to oppose the fourth conductive film with the frame body interposed, being connected to the second conductive film, and contacting the fourth insulating film.

11. The device according to claim 9, wherein
the frame body includes:
a lower part contacting the semiconductor substrate; and
an upper part provided on the lower part and connected to the lower part through a region between the first conductive film and the second conductive film, and
protruding portions of a lower surface of the upper part are formed to protrude downward in two regions, a region directly under a region between the fine line portion and the second conductive film being located between the two regions.

12. A semiconductor memory device, comprising:
a semiconductor substrate;
a first insulating film provided above the semiconductor substrate;
a first conductive film provided above the first insulating film;
a plurality of first electrode films provided above the first conductive film and stacked to be separated from each other;
a semiconductor member extending in a stacking direction of the plurality of first electrode films; and
a charge storage member provided between the semiconductor member and one of the plurality of first electrode films, wherein
the first conductive film includes
a main portion disposed at least directly below the plurality of first electrode films, and
a fine line portion extending from the main portion toward an end surface side of the semiconductor substrate and having no current supply point in an interior thereof.

13. The device according to claim 12, further comprising
a second conductive film provided above the first insulating film and separated from the first conductive film, and
a side surface of the second conductive film extending in a direction toward the fine line portion and being positioned on an extension plane of a side surface of the fine line portion, the side surface of the fine line portion extending in a direction toward the second conductive film.

14. The device according to claim 12, further comprising a frame body surrounding the first conductive film and the plurality of first electrode films, being provided on the semiconductor substrate, being insulated from the first conductive film and the plurality of first electrode films, and being made of a metal material.

15. A method for manufacturing a semiconductor memory device, comprising:
forming a first insulating film above a semiconductor wafer;
forming a conductive film above the first insulating film, the conductive film being exposed at an end surface of a first intermediate structure body, the first intermediate structure body including the semiconductor wafer, the first insulating film, and the conductive film;
forming a stacked body above a portion of the conductive film, a second insulating film and a third insulating film being stacked alternately in the stacked body;
forming a fourth insulating film above the conductive film at a periphery of the stacked body;
forming a first hole in the stacked body to reach the conductive film by performing plasma etching;
forming a charge storage member on an inner surface of the first hole;

forming a semiconductor member in the first hole where the charge storage member is formed; and forming in the stacked body where the first hole has been formed a slit followed by replacing the third insulating film with a first electrode film via the slit, and forming a second hole or a first trench in the fourth insulating film and the conductive film to divide the conductive film into a first portion and a second portion, the first portion being disposed between the first insulating film and the stacked body, the second portion being positioned at least on the semiconductor wafer end surface side of a second intermediate structure body, the second intermediate structure body including the first intermediate structure body, the stacked body, and the fourth insulating film.

16. The method according to claim 15, wherein the conductive film is formed in a region including a dicing line.

17. The method according to claim 15, wherein a lower end of the semiconductor member is connected to the conductive film in the forming of the semiconductor member, and in the replacing of the third insulating film with the first electrode film, the first electrode film is formed by removing the third insulating film via the slit, and by filling a conductive material via the slit into a space where the third insulating film is removed, the method further comprises:

forming a first insulating member in the slit after the forming of the first electrode film; and forming a second insulating member in the second hole or the first trench.

18. The method according to claim 17, further comprising:

forming a lower portion having a frame-like configuration, being made of a metal material, and surrounding a region in the first insulating film directly under a region where the stacked body is to be formed;

forming a second trench in a region of the fourth insulating film directly above the lower portion, the second trench having a frame-like configuration, dividing the second insulating member, and surrounding the stacked body; and forming an upper portion in the second trench, the upper portion being made of a metal material and contacting the lower portion.

19. The method according to claim 15, wherein the conductive film is formed above the first insulating film with a second electrode film interposed in the forming of the conductive film, the second electrode film being disposed in a region directly under a region where the stacked body is to be formed, the first hole pierces the conductive film and reaches the second electrode film in the forming of the first hole, a lower end of the semiconductor member is connected to the second electrode film in the forming of the semiconductor member, and in the replacing of the third insulating film with the first electrode film, the first electrode film is formed by removing the third insulating film via the slit, and by filling a conductive material via the slit into a space where the third insulating film is removed after the forming of the slit in the stacked body and the forming of the second hole or the first trench in the fourth insulating film and the conductive film, the method further comprises forming a first insulating member in the slit and forming a second insulating member in the second hole or the first trench after the forming of the first electrode film.

20. The method according to claim 19, further comprising:

forming a lower portion having a frame-like configuration, being made of a metal material, and surrounding a region in the first insulating film directly under the region where the stacked body is to be formed;

forming a second trench in a region of the fourth insulating film directly above the lower portion, the second trench having a frame-like configuration, dividing the second insulating member, and surrounding the stacked body; and forming an upper portion in the second trench, the upper portion being made of a metal material and contacting the lower portion.

* * * * *